(12) United States Patent
Masuoka et al.

(10) Patent No.: US 8,178,399 B1
(45) Date of Patent: May 15, 2012

(54) PRODUCTION METHOD FOR SEMICONDUCTOR DEVICE

(75) Inventors: Fujio Masuoka, Tokyo (JP); Tomohiko Kudo, Tokyo (JP); Shintaro Arai, Tokyo (JP); Hiroki Nakamura, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 0 days.

(21) Appl. No.: 13/354,579

(22) Filed: Jan. 20, 2012

Related U.S. Application Data

(63) Continuation of application No. 12/704,004, filed on Feb. 11, 2010, which is a continuation of application No. PCT/JP2009/052559, filed on Feb. 16, 2009.

(60) Provisional application No. 61/207,688, filed on Feb. 13, 2009.

(30) Foreign Application Priority Data

Feb. 15, 2008 (WO) .................. PCT/JP2008/052567

(51) Int. Cl.
*H01L 21/00* (2006.01)
*H01L 21/84* (2006.01)
*H01L 21/336* (2006.01)
*H01L 21/8234* (2006.01)
*H01L 21/8238* (2006.01)

(52) U.S. Cl. ........ 438/156; 438/197; 438/199; 438/212; 438/268; 257/E21.41; 257/E21.415

(58) Field of Classification Search .................. 438/156, 438/197, 199, 212, 268; 257/E21.41, E21.415
See application file for complete search history.

(56) References Cited

U.S. PATENT DOCUMENTS 6,461,900 B1    10/2002  Sundaresan et al.

FOREIGN PATENT DOCUMENTS

| JP | 61-013661 A | 1/1986 |
| JP | 02-071556 A | 3/1990 |

(Continued)

OTHER PUBLICATIONS

International Search Report for International Application No. PCT/JP2008/052567, dated Mar. 25, 2008, 1 page.
International Search Report for International Application No. PCT/JP2009/052559, dated Mar. 10, 2009, 1 page.

(Continued)

*Primary Examiner* — Charles Garber
*Assistant Examiner* — Calvin Choi
(74) *Attorney, Agent, or Firm* — Brinks Hofer Gilson & Lione

(57) ABSTRACT

An SGT production method includes forming a pillar-shaped first-conductive-type semiconductor layer and forming a second-conductive-type semiconductor layer underneath the first-conductive-type semiconductor layer. A dummy gate dielectric film and a dummy gate electrode are formed around the first-conductive-type semiconductor layer and a first dielectric film is formed on an upper region of a sidewall of the first-conductive-type semiconductor layer in contact with a top of the gate electrode. A first dielectric film is formed on a sidewall of the gate electrode and a second-conductive-type semiconductor layer is formed in an upper portion of the first-conductive-type semiconductor layer. A second-conductive-type semiconductor layer is formed in an upper portion of the first-conductive-type semiconductor layer and a metal-semiconductor compound is formed on each of the second-conductive-type semiconductor layers. The dummy gate dielectric film and the dummy gate electrode are removed and a high-k gate dielectric film and a metal gate electrode are formed.

22 Claims, 52 Drawing Sheets

FOREIGN PATENT DOCUMENTS

| | | |
|---|---|---|
| JP | 02-188966 A | 7/1990 |
| JP | 03-145761 A | 6/1991 |
| JP | 2000-068516 A | 3/2000 |
| JP | 2003-179160 A | 6/2003 |

OTHER PUBLICATIONS

Mistry, K. et al., "A 45nm Logic Technology with High-k+Metal Gate Transistors, Strained Silicon, 9 Cu Interconnect Layers, 193nm Dry Patterning, and 100% Pb-free Packaging," IEEE, 2007, pp. 247-250.

FIG.1A

| STEP | PROCESS NAME |
|---|---|
| 1 | FORMATION OF LOTS |
| 2 | FORMATION OF LASER MARK |
| 3 | PRE-PAD OXIDATION CLEANING |
| 4 | PAD OXIDATION |
| 5 | MEASUREMENT OF THICKNESS OF PAD OXIDE FILM |
| 6 | DEPOSITION OF NITRIDE FILM |
| 7 | MEASUREMENT OF THICKNESS OF NITRIDE FILM |
| 8 | DEPOSITION OF SILICON OXIDE FILM |
| 9 | MEASUREMENT OF THICKNESS OF SILICON OXIDE FILM |
| 10 | LITHOGRAPHIC EXPOSURE FOR |
| 11 | PILLAR SHAPE |
| 12 | DIMENSION MEASUREMENT |
| 13 | VERIFICATION |
| 14 | ETCHING OF HARD MASK FOR PILLAR |
| 15 | ETCHING OF HARD MASK FOR PILLAR |
| 16 | ETCHING OF HARD MASK FOR PILLAR |
| 17 | POST-ETCHING CLEANING |
| 18 | PRE-POLYSILICON DEPOSITION CLEANING |
| 19 | DEPOSITION OF POLYSILICON |
| 20 | MEASUREMENT OF THICKNESS OF POLYSILICON FILM |
| 21 | CHEMICAL MECHANICAL POLISHING OF POLYSILICON FILM |
| 22 | MEASUREMENT OF THICKNESS OF POLYSILICON FILM |
| 23 | STRIPPING OF OXIDE FILM |
| 24 | PRE-SACRIFICIAL OXIDATION CLEANING |
| 25 | SACRIFICIAL OXIDATION |
| 26 | MEASUREMENT OF THICKNESS OF SACRIFICIAL OXIDE FILM |
| 27 | STRIPPING OF OXIDE FILM |
| 28 | DRY ETCHING OF NITRIDE FILM |
| 29 | DRY ETCHING OF OXIDE FILM |
| 30 | DRY ETCHING OF SILICON |
| 31 | REMOVAL OF ORGANIC SUBSTANCES |
| 32 | SEM INSPECTION |
| 33 | VERIFICATION OF STEP HEIGHT |
| 34 | PRE-SACRIFICIAL OXIDATION CLEANING |
| 35 | SACRIFICIAL OXIDATION |

FIG.1B

| STEP | PROCESS NAME |
|---|---|
| 36 | MEASUREMENT OF THICKNESS OF SACRIFICIAL OXIDE FILM |
| 37 | LITHOGRAPHIC EXPOSURE FOR SOURCE REGION |
| 38 | |
| 39 | OVERLAY ERROR MEASUREMENT |
| 40 | DIMENSION MEASUREMENT |
| 41 | VERIFICATION |
| 42 | ETCHING OF SOURCE REGION |
| 43 | |
| 44 | REMOVAL OF ORGANIC SUBSTANCES |
| 45 | SEM INSPECTION |
| 46 | VERIFICATION OF STEP HEIGHT |
| 47 | IMPLANTATION OF N+ IMPURITY |
| 48 | ACTIVATION OF IMPURITY |
| 49 | STRIPPING OF OXIDE FILM |
| 50 | PRE-GATE FORMATION CLEANING |
| 51 | FORMATION OF GATE OXIDE FILM |
| 52 | MEASUREMENT OF THICKNESS OF GATE OXIDE FILM |
| 53 | DEPOSITION OF POLYSILICON |
| 54 | MEASUREMENT OF THICKNESS OF POLYSILICON FILM |
| 55 | CHEMICAL MECHANICAL POLISHING OF POLYSILICON FILM |
| 56 | PRE-OXIDATION CLEANING |
| 57 | OXIDATION |
| 58 | LITHOGRAPHIC EXPOSURE FOR GATE MASK |
| 59 | |
| 60 | OVERLAY ERROR MEASUREMENT |
| 61 | DIMENSION MEASUREMENT |
| 62 | VERIFICATION |
| 63 | ETCHING FOR GATE |
| 64 | ETCHING FOR GATE |
| 65 | ETCHING FOR GATE |
| 66 | REMOVAL OF ORGANIC SUBSTANCES |
| 67 | POST-ETCHING DIMENSION MEASUREMENT |
| 68 | REMOVAL OF NITRIDE FILM |
| 69 | DEPOSITION OF NITRIDE FILM |
| 70 | MEASUREMENT OF THICKNESS OF NITRIDE FILM |

FIG.1C

| STEP | PROCESS NAME |
|---|---|
| 71 | ETCHING FOR SPACER |
| 72 | REMOVAL OF ORGANIC SUBSTANCES |
| 73 | MEASUREMENT OF SPACER CONFIGURATION |
| 74 | IMPLANTATION OF N+ IMPURITY |
| 75 | ACTIVATION OF IMPURITY |
| 76 | STRIPPING OF OXIDE FILMS |
| 77 | DEPOSITION OF NICKEL |
| 78 | FORMATION OF METAL-SEMICONDUCTOR COMPOUND |
| 79 | SELECTIVE PEELING OF NICKEL |
| 80 | DEPOSITION OF NITRIDE FILM |
| 81 | MEASUREMENT OF THICKNESS OF NITRIDE FILM |
| 82 | DEPOSITION OF DIELECTRIC FILM |
| 83 | MEASUREMENT OF THICKNESS OF DIELECTRIC FILM |
| 84 | PRE-POLYSILICON FILM DEPOSITION CLEANING |
| 85 | DEPOSITION OF POLYSILICON FILM |
| 86 | MEASUREMENT OF THICKNESS OF POLYSILICON FILM |
| 87 | CHEMICAL MECHANICAL POLISHING OF POLYSILICON FILM |
| 88 | DRY ETCHING OF OXIDE FILM |
| 89 | DRY ETCHING OF NITRIDE FILM |
| 90 | REMOVAL OF ORGANIC SUBSTANCES |
| 91 | ETCHING OF POLYSILICON FILM |
| 92 | STRIPPING OF OXIDE FILM |
| 93 | PRE-GATE DIELECTRIC FILM FORMATION CLEANING |
| 94 | DEPOSITION OF HAFNIUM OXIDE |
| 95 | HEAT TREATMENT |
| 96 | DEPOSITION OF METAL |
| 97 | CHEMICAL MECHANICAL POLISHING OF METAL |
| 98 | DRY ETCHING OF METAL |
| 99 | DEPOSITION OF NITRIDE FILM |
| 100 | DEPOSITION OF DIELECTRIC FILM BEFORE METALLIZATION |
| 101 | MEASUREMENT OF THICKNESS OF DIELECTRIC FILM BEFORE METALLIZATION |
| 102 | CHEMICAL MECHANICAL POLISHING OF DIELECTRIC FILM BEFORE METALLIZATION |
| 103 | MEASUREMENT OF THICKNESS OF DIELECTRIC FILM |
| 104 | MEASUREMENT OF THICKNESS OF NITRIDE FILM |
| 105 / 106 | LITHOGRAPHIC EXPOSURE FOR CONTACT MASK |

FIG.1D

| STEP | PROCESS NAME |
|---|---|
| 107 | DIMENSION MEASUREMENT |
| 108 | OVERLAY ERROR MEASUREMENT |
| 109 | VERIFICATION |
| 110 | ETCHING FOR CONTACT |
| 111 | ETCHING FOR CONTACT |
| 112 | REMOVAL OF RESIST BY PLASMA PEELING |
| 113 | POST-CONTACT ETCHING CLEANING |
| 114 | MEASUREMENT OF DIMENSIONS OF CONTACT |
| 115 | MEASUREMENT OF THICKNESS OF OXIDE FILM |
| 116 | VERIFICATION |
| 117 | LITHOGRAPHIC EXPOSURE FOR CONTACT MASK |
| 118 | |
| 119 | DIMENSION MEASUREMENT |
| 120 | OVERLAY ERROR MEASUREMENT |
| 121 | VERIFICATION |
| 122 | ETCHING 2-1 FOR CONTACT |
| 123 | ETCHING 2-2 FOR CONTACT |
| 124 | REMOVAL OF RESIST BY PLASMA PEELING |
| 125 | POST-CONTACT ETCHING CLEANING |
| 126 | MEASUREMENT OF DIMENSIONS OF CONTACT |
| 127 | MEASUREMENT OF THICKNESS OF OXIDE FILM |
| 128 | VERIFICATION |
| 129 | REPLACEMENT OF WAFER CONTAINER |
| 130 | SPUTTERING OF COPPER/TANTALUM/TANTALUM NITRIDE |
| 131 | FILLING OF COPPER |
| 132 | UNDER-SURFACE TREATMENT |
| 133 | VERIFICATION |
| 134 | HEAT TREATMENT |
| 135 | CHEMICAL MECHANICAL POLISHING OF COPPER |
| 136 | VERIFICATION |
| 137 | DEPOSITION OF SILICON CARBIDE |
| 138 | DEPOSITION OF LOW-K FILM |
| 139 | MEASUREMENT OF THICKNESS OF LOW-K FILM |
| 140 | VERIFICATION |
| 141 | LITHOGRAPHIC EXPOSURE FOR FIRST METAL MASK |

FIG.1E

| STEP | PROCESS NAME |
|---|---|
| 142 | DIMENSION MEASUREMENT |
| 143 | OVERLAY ERROR MEASUREMENT |
| 144 | VERIFICATION |
| 145 | DRY ETCHING |
| 146 | REMOVAL OF RESIST BY PLASMA STRIPPING |
| 147 | VERIFICATION |
| 148 | SPUTTERING OF COPPER/TANTALUM/TANTALUM NITRIDE |
| 149 | FILLING OF COPPER |
| 150 | UNDER-SURFACE TREATMENT |
| 151 | VERIFICATION |
| 152 | HEAT TREATMENT |
| 153 | CHEMICAL MECHANICAL POLISHING OF COPPER |
| 154 | VERIFICATION |
| 155 | DEPOSITION OF NITRIDE FILM |
| 156 | DEPOSITION OF INTERLAYER DIELECTRIC FILM |
| 157 | MEASUREMENT OF THICKNESS OF INTERLAYER DIELECTRIC FILM |
| 158 | LITHOGRAPHIC EXPOSURE FOR PAD-VIA MASK |
| 159 | |
| 160 | DIMENSION MEASUREMENT |
| 161 | OVERLAY-ERROR MEASUREMENT |
| 162 | VERIFICATION |
| 163 | ETCHING FOR PAD-VIA |
| 164 | |
| 165 | REMOVAL OF RESIST BY PLASMA STRIPPING |
| 166 | POST-ETCHING CLEANING |
| 167 | DIMENSION MEASUREMENT |
| 168 | MEASUREMENT OF THICKNESS OF OXIDE FILM |
| 169 | VERIFICATION |
| 170 | PRE-METALIZATION CLEANING |
| 171 | REPLACEMENT OF WAFER CONTAINER |
| 172 | DEPOSITION OF ALUMINUM |
| 173 | UNDER-SURFACE TREATMENT |
| 174 | LITHOGRAPHIC EXPOSURE FOR PAD ALUMINUM |
| 175 | |
| 176 | OVERLAY-ERROR MEASUREMENT |

FIG.1F

| STEP | PROCESS NAME |
|---|---|
| 177 | DIMENSION MEASUREMENT |
| 178 | VERIFICATION |
| 179 | ETCHING OF PAD ALUMINUM |
| 180 | |
| 181 | |
| 182 | REMOVAL OF RESIST BY PLASMA STRIPPING |
| 183 | POST-METAL-ETCHING CLEANING |
| 184 | OPTICAL INSPECTION |
| 185 | SEM INSPECTION |
| 186 | MEASUREMENT OF THICKNESS OF OXIDE FILM |
| 187 | DEPOSITION OF DIELECTRIC FILM |
| 188 | MEASUREMENT OF THICKNESS OF DIELECTRIC FILM |
| 189 | LITHOGRAPHICAL EXPOSURE FOR THE DIELECTRIC FILM |
| 190 | |
| 191 | OPTICAL INSPECTION |
| 192 | ETCHING OF DIELECTRIC FILM |
| 193 | |
| 194 | REMOVAL OF RESIST BY PLASMA STRIPPING |
| 195 | CLEANING OF DIELECTRIC FILM |
| 196 | VERIFICATION |
| 197 | HEAT TREATMENT |

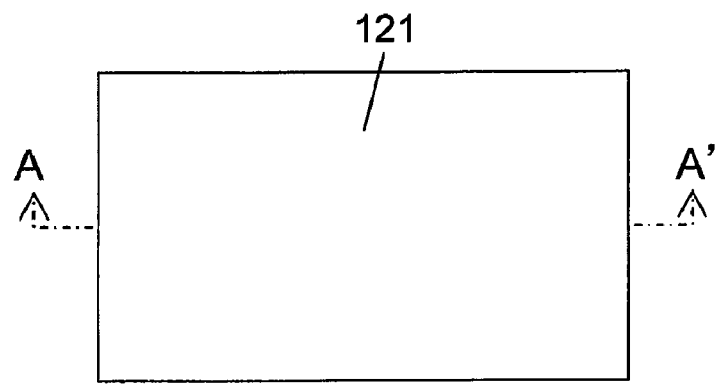
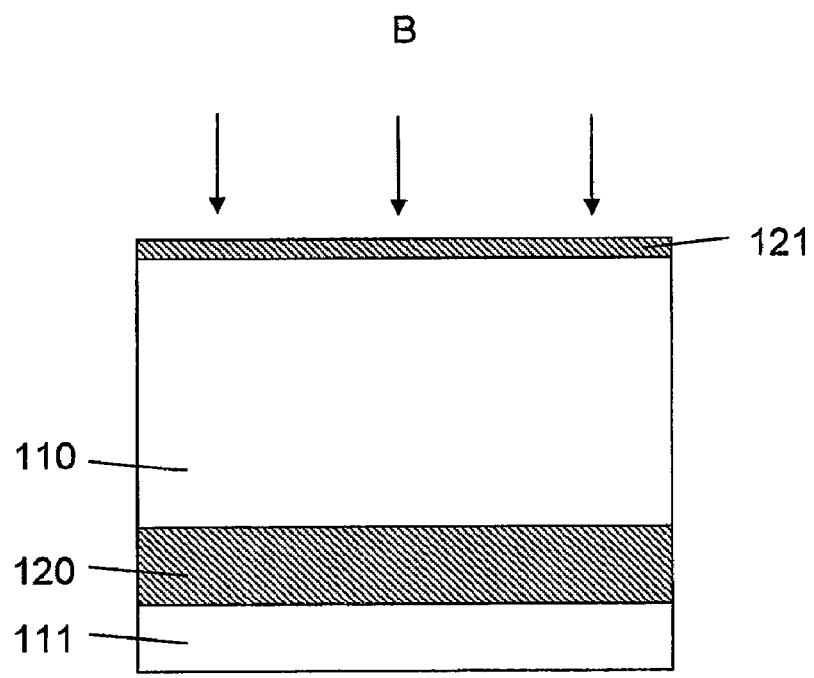

PRODUCTION METHOD FOR SEMICONDUCTOR DEVICE

RELATED APPLICATIONS

Pursuant to 35 U.S.C. §119(e), this application claims the benefit of the filing date of Provisional U.S. Patent Application Ser. No. 61/207,688 filed on Feb. 13, 2009. This application is a continuation application of U.S. application Ser. No. 12/704,004, filed Feb. 11, 2010, which is a continuation of PCT/JP2009/052559 filed on Feb. 16, 2009 which claims priority under 35 U.S.C. §365(a) to PCT/JP2008/052567 filed on Feb. 15, 2008. The entire contents of these applications are hereby incorporated by reference.

BACKGROUND OF THE INVENTION

1. Field of the Invention

The present invention relates to a semiconductor device and a production method therefor.

2. Description of the Related Art

A degree of integration in a semiconductor integrated circuit, particularly in an integrated circuit using a MOS transistor, has been increasing year by year. Along with the increase in the degree of integration, miniaturization of the MOS transistor used therein has progressed to a nano region. The progress in miniaturization of the MOS transistor gives rise to a problem, such as difficulty in suppressing a leak current, which poses an impediment to sufficiently reducing a circuit occupancy area while meeting a requirement of ensuring a necessary amount of current. With a view to solving this problem, there has been proposed a surrounding gate transistor (SGT) having a structure in which a source, a gate and a drain are arranged in a direction perpendicular to a substrate, wherein the gate is formed to surround a pillar-shaped semiconductor layer (see, for example, the following Patent Documents 1 to 3).

In the SGT, a channel region is provided around a side surface of the pillar-shaped semiconductor, so that a large gate width is achieved within a small occupancy area. This means that it is necessary to allow a large ON-current to flow through the small occupancy area. However, if the source, drain and gate have a high resistance, it becomes difficult to apply a desired voltage for allowing the flow of a large ON-current, to the source, drain and gate. Therefore, it is required to provide an SGT production method including a design technique for reducing the resistance of the source, drain and gate. As another condition for allowing the flow of a large ON-current, it is also required to reduce a resistance of a contact.

In a conventional MOS transistor, a gate is formed by depositing a gate material, transferring a gate pattern to a resist on a substrate by lithography, and etching the gate material. In other words, in the conventional MOS transistor, a gate length is designed based on a gate pattern.

In the SGT, a current flows in a direction perpendicular to the substrate, because the side surface of the pillar-shaped semiconductor serves as a channel region. Thus, in the SGT, a gate length is not designed based on a gate pattern but based on a production method, so that the gate length and a variation therein are determined by a production method.

In the SGT, as measures for suppressing an increase in leak current occurring along with miniaturization, it is required to reduce a diameter of the pillar-shaped semiconductor. It is also required to provide a production method capable of optimizing the source and drain to suppress short-channel effects so as to reduce a leak current.

As with the conventional MOS transistor, the SGT also has a need for reducing a production cost. For this purpose, it is required to reduce the number of production steps.

Instead of polysilicon, a metal can be used as a material for a gate electrode to suppress depletion and reduce a resistance of the gate electrode. In this case, any production step subsequent to the step of forming a metal gate has to be designed while taking into account metal contamination due to the metal gate.

In the conventional MOS transistor, with a view to achieve a balance between a metal gate process and a high-temperature process, a metal gate-last process designed to fabricate a metal gate after the high-temperature process has been employed in producing actual products (see the following Non-Patent Document 1). In the SGT, it is also required to employ the metal gate-last process to achieve a balance between a metal gate process and a high-temperature process.

Patent Document 1: JP 2-71556A
Patent Document 2: JP 2-188966A
Patent Document 3: JP 3-145761A
Non-Patent Document 1: IEDM 2007, K. Mistry, et al

SUMMARY OF THE INVENTION

It is therefore an object of the present invention to provide an SGT production method capable of obtaining a structure for reducing a resistance of a source, drain and gate, a desired gate length, desired source and drain configurations and a desired diameter of a pillar-shaped semiconductor.

In order to achieve the above object, the present invention provides a method of producing a semiconductor device, which comprises the steps of (a) forming a planar semiconductor layer on an oxide film formed on a substrate and then forming a pillar-shaped first-conductive-type semiconductor layer on the planar semiconductor layer, (b) forming a second-conductive-type semiconductor layer in a portion of the planar semiconductor layer underneath the pillar-shaped first-conductive-type semiconductor layer, (c) forming a dummy gate dielectric film and a dummy gate electrode around the pillar-shaped first-conductive-type semiconductor layer, (d) forming a second-conductive-type semiconductor layer in an upper portion of the pillar-shaped first-conductive-type semiconductor layer, (e) forming a metal-semiconductor compound on the second-conductive-type semiconductor layer formed in the portion of the planar semiconductor layer underneath the pillar-shaped first-conductive-type semiconductor layer, (f) forming a metal-semiconductor compound on the second-conductive-type semiconductor layer formed in the upper portion of the pillar-shaped first-conductive-type semiconductor layer, (g) removing the dummy gate dielectric film and the dummy gate electrode, (h) forming a high-k gate dielectric film and a metal gate electrode around the pillar-shaped first-conductive-type semiconductor layer, (i) forming a contact on the second-conductive-type semiconductor layer formed in the portion of the planar semiconductor layer underneath the pillar-shaped first-conductive-type semiconductor layer, (j) forming a contact on the second-conductive-type semiconductor layer formed in the upper portion of the pillar-shaped first-conductive-type semiconductor layer, and (k) forming a contact on a metal gate line extending from the metal gate electrode.

Preferably, in the method of the present invention, a distance between a central axis of the pillar-shaped first-conductive-type semiconductor layer and a lateral end of the planar semiconductor layer is greater than a sum of: a distance between the central axis and a sidewall of the pillar-shaped first-conductive-type semiconductor layer; a thickness of the high-k gate dielectric film; a thickness of the metal gate electrode; and a thickness of a sidewall-shaped dielectric film formed on a sidewall of the metal gate electrode.

Preferably, in the method of the present invention, the planar semiconductor layer, the first-conductive-type semiconductor layer, and each of the second-conductive-type semiconductor layers, are a planar silicon layer, a first-conductive-type silicon layer, and a second-conductive-type silicon layer, respectively.

Alternatively, in the method of the present invention, the planar semiconductor layer, the first-conductive-type semiconductor layer, and each of the second-conductive-type semiconductor layers, may be a planar silicon layer, a p-type silicon layer or a non-doped silicon layer, and an n-type silicon layer, respectively.

Alternatively, in the method of the present invention, the planar semiconductor layer, the first-conductive-type semiconductor layer, and each of the second-conductive-type semiconductor layers, may be a planar silicon layer, an n-type silicon layer or a non-doped silicon layer, and a p-type silicon layer, respectively.

Preferably, in the method of the present invention, the step (a) includes the sub-steps of: forming, on the substrate, an initial silicon layer for forming therefrom the pillar-shaped first-conductive-type silicon layer and the planar silicon layer, and then forming a pad oxide film on the initial silicon layer; implanting an impurity into the initial silicon layer through the pad oxide film to adjust a threshold, and then subjecting the initial silicon layer to annealing to activate and diffuse the impurity so as to promote uniform distribution of the impurity in the initial silicon layer; and forming a silicon nitride film for use as a mask during formation of the pillar-shaped first-conductive-type silicon layer.

Preferably, in the method of the present invention, the step (a) includes the sub-steps of: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist onto the silicon oxide film, and then forming a pattern having an inverted shape of a top view of the pillar-shaped first-conductive-type silicon layer, using the resist by lithography, to form a hole in the silicon oxide film to penetrate through the silicon oxide film at a position for forming the pillar-shaped first-conductive-type silicon layer; forming an amorphous silicon or polysilicon film to fill the hole formed in the silicon oxide film; polishing and removing a portion of the amorphous silicon or polysilicon film on the silicon oxide film by chemical mechanical polishing; removing the silicon oxide film by etching, to form an amorphous silicon or polysilicon film-based mask serving as a second hard mask; sacrificially oxidizing the amorphous silicon or polysilicon film-based mask to reduce a size of the amorphous silicon or polysilicon film-based mask; and etching the amorphous silicon or polysilicon film-based mask to remove the sacrificial silicon oxide film on a surface thereof.

Alternatively, in the method of the present invention, the step (a) may include the sub-steps of: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist onto the silicon oxide film, and then forming a pattern having an inverted shape of a top view of the pillar-shaped first-conductive-type silicon layer, using the resist by lithography, to form a hole in the silicon oxide film to penetrate through the silicon oxide film at a position for forming the pillar-shaped first-conductive-type silicon layer; depositing an oxide film and etching back the oxide film to reduce a diameter of the hole penetrating through the silicon oxide film; forming an amorphous silicon or polysilicon film to fill the hole formed in the silicon oxide film; polishing and removing a portion of the amorphous silicon or polysilicon film on the silicon oxide film by chemical mechanical polishing; and removing the silicon oxide film by etching, to form an amorphous silicon or polysilicon film-based mask serving as a second hard mask.

Preferably, in the method of the present invention, the step (a) includes the sub-steps of: dry-etching the silicon nitride film and the pad oxide film, using the amorphous silicon or polysilicon film-based mask serving as the second hard mask, to form a silicon nitride film-based mask serving as the first hard mask; and forming the pillar-shaped first-conductive-type silicon layer by dry etching using the first hard mask and the second hard mask, wherein, when the amorphous silicon or polysilicon film-based mask serving as the second hard mask is fully etched away to cause a change in plasma emission intensity detectable by a dry etching apparatus, the change in the plasma emission intensity is detected to perform a dry-etching end-point detection process to control a height dimension of the pillar-shaped first-conductive-type silicon layer.

Preferably, in the method of the present invention, a thickness of the amorphous silicon or polysilicon film-based mask serving as the second hard mask is less than a height dimension of the pillar-shaped first-conductive-type silicon layer.

Preferably, in the method of the present invention, the step (b) includes the sub-steps of: after the step (a), sacrificially oxidizing the pillar-shaped first-conductive-type silicon layer to form a sacrificial oxide film as a means for reducing irregularities in a region of a sidewall of the pillar-shaped first-conductive-type silicon layer serving as a channel region, removing a silicon surface implanted with a foreign substance typically consisting of carbon during the dry etching, and protecting the pillar-shaped first-conductive-type silicon layer from contaminations typically caused by by-products to be produced during dry etching in a subsequent step; applying a resist onto the planar silicon layer, and forming a pattern for the second-conductive-type silicon layer to be formed in the portion of the planar silicon layer underneath the pillar-shaped first-conductive-type silicon layer, using the resist by lithography; and dry-etching the planar silicon layer to form the portion of the planar silicon layer underneath the pillar-shaped first-conductive-type silicon layer, and then removing the resist.

Preferably, in the method of the present invention, the step (b) includes introducing a second-conductive-type impurity into a surface of the portion of the planar silicon layer underneath the pillar-shaped first-conductive-type silicon layer by an impurity doping process typified by impurity implantation, using the sacrificial oxide film formed during the sacrificial oxidation of the pillar-shaped first-conductive-type silicon layer, as a screen oxide film, to form the second-conductive-type silicon layer in the portion of the planar silicon layer underneath the pillar-shaped first-conductive-type silicon layer.

Preferably, in the method of the present invention, a diameter of the pillar-shaped first-conductive-type silicon layer is less than that of the silicon nitride film-based mask serving as the first hard mask.

Preferably, in the method of the present invention, an implantation angle during the impurity implantation for use in forming the second-conductive-type silicon layer in the portion of the planar silicon layer underneath the pillar-shaped first-conductive-type silicon layer is in the range of 0 to 6 degrees.

Preferably, in the method of the present invention, the second-conductive-type silicon layer is formed in the portion of the planar silicon layer underneath the pillar-shaped first-conductive-type silicon layer, without implanting the impurity into the upper portion of the pillar-shaped first-conductive-type silicon layer.

Preferably, in the method of the present invention, the step (c) includes the sub-steps of: removing the sacrificial oxide film by etching, forming the dummy gate dielectric film typically consisting of a silicon oxide film or a silicon nitride film, and forming an amorphous silicon or polysilicon film serving as a dummy gate material to allow the pillar-shaped first-conductive-type silicon layer to be buried therein; and polishing the amorphous silicon or polysilicon film by chemical mechanical polishing to flatten an upper surface of the dummy gate material, wherein the silicon nitride film-based mask serving as the first hard mask is used as a stopper for the chemical mechanical polishing to control an amount of chemical mechanical polishing with high repeatability.

Preferably, in the method of the present invention, the step (c) includes the sub-step of: oxidizing the flattened surface of the amorphous silicon or polysilicon film serving as the dummy gate material to form a silicon oxide film on an upper surface of the amorphous silicon or polysilicon film, wherein the silicon oxide film serves as a means to prevent the dummy gate electrode from being silicided during silicidation to be performed in a subsequent step so as to facilitate removal of the dummy gate electrode in a subsequent step.

Preferably, in the method of the present invention, the step (c) includes the sub-steps of: applying a bottom antireflective coating (BARC) layer and a resist on the silicon oxide film, and forming a pattern for a dummy gate line, using the resist by lithography; and etching the silicon oxide film, the BARC layer and the amorphous silicon or polysilicon film serving as the dummy gate material, using the resist as a mask to form the dummy gate electrode and the dummy gate line. Further, the step (d) includes the sub-steps of: removing the silicon nitride film-based mask on a top of the pillar-shaped first-conductive-type silicon layer by dry etching or wet etching; forming a silicon nitride film, and then etching back the silicon nitride film to expose an upper surface of the second-conductive-type silicon layer formed in the portion of the planar silicon layer underneath the pillar-shaped first-conductive-type silicon layer, and a top surface of the pillar-shaped first-conductive-type silicon layer, while forming a silicon nitride film-based sidewall on a sidewall of the dummy gate electrode; and introducing a second-conductive-type impurity into an upper portion of the pillar-shaped first-conductive-type silicon layer through an impurity doping process typified by impurity implantation, to form the second-conductive-type silicon layer in the upper portion of the pillar-shaped first-conductive-type silicon layer. The steps (e) and (f) include subjecting each of the upper surface of the second-conductive-type silicon layer formed in the portion of the planar silicon layer underneath the pillar-shaped first-conductive-type silicon layer, and an upper surface of the second-conductive-type silicon layer formed in the upper portion of the pillar-shaped first-conductive-type silicon layer, to sputtering of a metal typically consisting of nickel (Ni) or cobalt (Co), and a heat treatment, and removing an unreacted metal film, to form the metal-semiconductor compound on each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer. In this case, the silicon nitride film-based sidewall, and the silicon oxide film on the dummy gate electrode, serve as a means to prevent a metal-semiconductor compound from being formed on the dummy gate electrode, and the dummy gate electrode and the silicon nitride film-based sidewall serve as a means to allow a metal-semiconductor compound to be formed only on each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, whereby it becomes possible to prevent short-circuiting between the metal gate electrode and each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, due to the metal-semiconductor compounds. Further, respective portions of the dummy gate dielectric film and the dummy gate electrode covering an upper region of the sidewall of the pillar-shaped first-conductive-type silicon layer serve as a means to control formation of a metal-semiconductor compound from the side of the sidewall of the pillar-shaped first-conductive-type silicon layer.

Preferably, in the method of the present invention, the steps (g) and (h) include the sub-steps of: forming a film typically consisting of a silicon nitride film; forming a silicon oxide film and an amorphous silicon or polysilicon layer; flattening an upper surface of the amorphous silicon or polysilicon layer by chemical mechanical polishing, while controlling respective upper surfaces of the amorphous silicon or polysilicon layer and the silicon oxide film to be located at a same height position; dry-etching the silicon oxide film, wherein an end-point of the dry etching is detected based on the silicon nitride film to be exposed when a portion of the silicon oxide film on an upper surface of the silicon nitride film is fully etched away, so that respective upper surfaces of the silicon oxide film and the silicon nitride film are controlled to be located at a same height position; dry-etching the silicon nitride film, wherein an end-point of the dry etching is detected based on the dummy gate electrode to be exposed when a portion of the silicon nitride film on an upper surface of the dummy gate electrode is fully etched away, so that respective upper surfaces of the dummy gate electrode, the silicon nitride film and the silicon oxide film are controlled to be located at a same height position; dry-etching the dummy gate electrode and the amorphous silicon or polysilicon layer; removing the silicon oxide film and dummy gate dielectric film by wet etching; forming the high-k gate dielectric film; forming a metal gate layer; and dry-etching the metal gate layer to form the metal gate electrode and the metal gate line, wherein an end-point of the dry etching is detected based on the silicon oxide film to be exposed when a portion of the metal gate layer on a reference surface of the silicon oxide film is fully etched away, so that an upper surface of the gate metal layer is controlled to be located at a same height position as that of the reference surface of the silicon oxide film, whereby a sum of respective thicknesses of the silicon oxide film and the silicon nitride film can be controlled to become equal to a desired gate length of the metal gate electrode with less variation in the gate length.

Preferably, in the method of the present invention, the steps (i) to (k) include the sub-steps of: forming a film typically consisting of a silicon nitride film to serve as a contact stopper; forming a silicon oxide film to serve as an interlayer film and then flattening the silicon oxide film by chemical mechanical polishing; applying a resist, and then forming a pattern using the resist by lithography, to form two contact holes on respective ones of the metal gate line, and the second-conductive-type silicon layer formed in the upper portion of the pillar-shaped first-conductive-type silicon layer, by etching; applying a resist, and then forming a pattern using the resist by lithography, to form a contact hole on the second-conductive-type silicon layer formed in the portion of the planar silicon layer underneath the pillar-shaped first-conductive-type silicon layer, by etching; forming a film made of a barrier metal typified by tantalum (Ta) or tantalum nitride (TaN) on each of the contact holes, whereafter a copper (Cu) film is formed on the barrier metal film by sputtering or plating, and subjected to chemical mechanical polishing to form a contact plug; forming a silicon carbide (SiC) film to serve an etching stopper for first-layer interconnection lines, and then forming a low-k film to serve as an interlayer film of a first interconnection layer; and forming a pattern for the first-layer interconnection lines to form corresponding trenches in the first interconnection layer, and forming a film made of a barrier metal typified by tantalum (Ta) or tantalum nitride (TaN) on each of the trenches, whereafter a copper (Cu) film is formed on the barrier metal film by sputtering or plating, and subjected to chemical mechanical polishing to form the first-layer interconnection lines.

Preferably, in the method of the present invention, the steps (i) to (k) include the sub-steps of: forming a film typically consisting of a silicon nitride film to serve as a contact stopper; forming a silicon oxide film to serve as an interlayer film and then flattening the silicon oxide film by chemical mechanical polishing; etching respective portions of the interlayer film for a contact hole on the top of the second-conductive-type silicon layer formed in the upper portion of the pillar-shaped first-conductive-type silicon layer, a contact hole on the metal gate line, and a contact hole on the second-conductive-type silicon layer formed in the portion of the planar silicon layer underneath the pillar-shaped first-conductive-type silicon layer; and etching respective portions of the contact stopper corresponding to the three contact holes.

Alternatively, the method of the present invention may comprise the steps of (the steps (i) to (k) may include the sub-steps of): forming a film typically consisting of a silicon nitride film to serve as a contact stopper; forming a silicon oxide film to serve as an interlayer film and then flattening the silicon oxide film by chemical mechanical polishing; etching respective portions of the interlayer film for a contact hole on the metal gate line and a contact hole on the portion of the planar silicon layer underneath the pillar-shaped first-conductive-type silicon layer; etching a portion of the interlayer film for a contact hole on a top of the second-conductive-type silicon layer formed in the upper portion of the pillar-shaped first-conductive-type silicon layer, using a resist as a mask; and, after the etching of the interlayer film, etching respective portions of the contact stopper corresponding to the three contact holes.

The semiconductor device production method of the present invention comprises the steps of (a) forming a planar semiconductor layer on an oxide film formed on a substrate and then forming a pillar-shaped first-conductive-type semiconductor layer on the planar semiconductor layer, (b) forming a second-conductive-type semiconductor layer in a portion of the planar semiconductor layer underneath the pillar-shaped first-conductive-type semiconductor layer, (c) forming a dummy gate dielectric film and a dummy gate electrode around the pillar-shaped first-conductive-type semiconductor layer, (d) forming a second-conductive-type semiconductor layer in an upper portion of the pillar-shaped first-conductive-type semiconductor layer, (e) forming a metal-semiconductor compound on the second-conductive-type semiconductor layer formed in the portion of the planar semiconductor layer underneath the pillar-shaped first-conductive-type semiconductor layer, (f) forming a metal-semiconductor compound on the second-conductive-type semiconductor layer formed in the upper portion of the pillar-shaped first-conductive-type semiconductor layer, (g) removing the dummy gate dielectric film and the dummy gate electrode, (h) forming a high-k gate dielectric film and a metal gate electrode around the pillar-shaped first-conductive-type semiconductor layer, (i) forming a contact on the second-conductive-type semiconductor layer formed in the portion of the planar semiconductor layer underneath the pillar-shaped first-conductive-type semiconductor layer, (j) forming a contact on the second-conductive-type semiconductor layer formed in the upper portion of the pillar-shaped first-conductive-type semiconductor layer, and (k) forming a contact on a metal gate line extending from the metal gate electrode. This makes it possible to provide an SGT production method capable of obtaining a structure for reducing a resistance of a source, drain and gate, a desired gate length, desired source and drain configurations and a desired diameter of a pillar-shaped semiconductor.

In a preferred embodiment of the present invention, a distance between a central axis of the pillar-shaped first-conductive-type semiconductor layer and a lateral end of the planar semiconductor layer is greater than a sum of: a distance between the central axis and a sidewall of the pillar-shaped first-conductive-type semiconductor layer; a thickness of the high-k gate dielectric film; a thickness of the metal gate electrode; and a thickness of a sidewall-shaped dielectric film formed on a sidewall of the metal gate electrode. This makes it possible to form a metal-semiconductor compound on the second-conductive-type semiconductor layer formed in the portion of the planar semiconductor layer underneath the pillar-shaped first-conductive-type semiconductor layer, so that a resistance of the second-conductive-type semiconductor layer formed in the portion of the planar semiconductor layer underneath the pillar-shaped first-conductive-type semiconductor layer can be reduced.

In a preferred embodiment of the present invention, the step (a) includes the sub-steps of: forming, on the substrate, an initial silicon layer for forming therefrom the pillar-shaped first-conductive-type silicon layer and the planar silicon layer, and then forming a pad oxide film on the initial silicon layer; implanting an impurity into the initial silicon layer through the pad oxide film to adjust a threshold, and then subjecting the initial silicon layer to annealing to activate and diffuse the impurity so as to promote uniform distribution of the impurity in the initial silicon layer; and forming a silicon nitride film for use as a mask during formation of the pillar-shaped first-conductive-type silicon layer. In this case, the pad oxide film for reducing a stress between a silicon layer and a silicon nitride film to be formed in the next step can be used as a screen oxide film during impurity injection. This makes it possible to reduce the number of production steps so as to reduce a production cost.

In a preferred embodiment of the present invention, the step (a) includes the sub-steps of: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist onto the silicon oxide film, and then forming a pattern having an inverted shape of a top view of the pillar-shaped first-conductive-type silicon layer, using the resist by lithography, to form a hole in the silicon oxide film to penetrate through the silicon oxide film at a position for forming the pillar-shaped first-conductive-type silicon layer; forming an amorphous silicon or polysilicon film to fill the hole formed in the silicon oxide film; polishing and removing a portion of the amorphous silicon or polysilicon film on the silicon oxide film by chemical mechanical polishing; removing the silicon oxide film by etching, to form an amorphous silicon or polysilicon film-based mask serving as a second hard mask; sacrificially oxidizing the amorphous silicon or polysilicon film-based mask to reduce a size of the amorphous silicon or polysilicon film-based mask; and etching the amorphous silicon or polysilicon film-based mask to remove the sacrificial silicon oxide film on a surface thereof. This makes it possible to reduce a width of the pillar-shaped first-conductive-type silicon layer to be subsequently formed, to suppress short-channel effects in a transistor so as to reduce a leak current.

Alternatively, the step (a) may include the sub-steps of: forming, on the substrate, an initial silicon layer for forming therefrom the pillar-shaped first-conductive-type silicon layer and the planar silicon layer, and then forming a pad oxide film on the initial silicon layer; forming a silicon nitride film for use as a first hard mask during formation of the pillar-shaped first-conductive-type silicon layer; forming a silicon oxide film on the silicon nitride film; applying a resist onto the silicon oxide film, and then forming a pattern having an inverted shape of a top view of the pillar-shaped first-conductive-type silicon layer, using the resist by lithography, to form a hole in the silicon oxide film to penetrate through the silicon oxide film at a position for forming the pillar-shaped first-conductive-type silicon layer; depositing an oxide film and etching back the oxide film to reduce a diameter of the hole penetrating through the silicon oxide film; forming an amorphous silicon or polysilicon film to fill the hole formed in the silicon oxide film; polishing and removing a portion of the amorphous silicon or polysilicon film on the silicon oxide film by chemical mechanical polishing; and removing the silicon oxide film by etching, to form an amorphous silicon or polysilicon film-based mask serving as a second hard mask. This also makes it possible to reduce a width of the pillar-shaped first-conductive-type silicon layer to be subsequently formed, to suppress short-channel effects in a transistor so as to reduce a leak current.

In a preferred embodiment of the present invention, the step (a) includes the sub-steps of: dry-etching the silicon nitride film and the pad oxide film, using the amorphous silicon or polysilicon film-based mask serving as the second hard mask, to form a silicon nitride film-based mask serving as the first hard mask; and forming the pillar-shaped first-conductive-type silicon layer by dry etching using the first hard mask and the second hard mask. In this case, when the amorphous silicon or polysilicon film-based mask serving as the second hard mask is fully etched away to cause a change in plasma emission intensity detectable by a dry etching apparatus, the change in the plasma emission intensity is detected to perform a dry-etching end-point detection process. This makes it possible to control a height dimension of the pillar-shaped first-conductive-type silicon layer.

In a preferred embodiment of the present invention, a thickness of the amorphous silicon or polysilicon film-based mask serving as the second hard mask is less than a height dimension of the pillar-shaped first-conductive-type silicon layer. This makes it possible to effectively perform the dry-etching end-point detection process.

In a preferred embodiment of the present invention, the step (b) includes the sub-steps of: after the step (a), sacrificially oxidizing the pillar-shaped first-conductive-type silicon layer to form a sacrificial oxide film as a means for reducing irregularities in a region of a sidewall of the pillar-shaped first-conductive-type silicon layer serving as a channel region, removing a silicon surface implanted with a foreign substance typically consisting of carbon during the dry etching, and protecting the pillar-shaped first-conductive-type silicon layer from contaminations typically caused by by-products to be produced during dry etching in a subsequent step; applying a resist onto the planar silicon layer, and forming a pattern for the second-conductive-type silicon layer to be formed in the portion of the planar silicon layer underneath the pillar-shaped first-conductive-type silicon layer, using the resist by lithography; and dry-etching the planar silicon layer to form the portion of the planar silicon layer underneath the pillar-shaped first-conductive-type silicon layer, and then removing the resist. In this case, the oxide film formed by the sacrificial oxidation is used as a protective film for the pillar-shaped first-conductive-type silicon layer. This makes it possible to reduce the number of production steps so as to reduce a production cost.

In a preferred embodiment of the present invention, the step (b) includes introducing a second-conductive-type impurity into a surface of the portion of the planar silicon layer underneath the pillar-shaped first-conductive-type silicon layer by an impurity doping process typified by impurity implantation, using the sacrificial oxide film formed during the sacrificial oxidation of the pillar-shaped first-conductive-type silicon layer, as a screen oxide film, to form the second-conductive-type silicon layer in the portion of the planar silicon layer underneath the pillar-shaped first-conductive-type silicon layer. In this case, the oxide film formed by the sacrificial oxidation is used as not only a protective film for the pillar-shaped first-conductive-type silicon layer but also a screen oxide film during impurity implantation. This makes it possible to reduce the number of production steps so as to reduce a production cost.

In a preferred embodiment of the present invention, a diameter of the pillar-shaped first-conductive-type silicon layer is less than that of the silicon nitride film-based mask serving as the first hard mask. This makes it possible to prevent implantation of an imparity from the side of the sidewall of the pillar-shaped first-conductive-type silicon layer during the impurity implantation.

In a preferred embodiment of the present invention, an implantation angle during the impurity implantation for use in forming the second-conductive-type silicon layer in the portion of the planar silicon layer underneath the pillar-shaped first-conductive-type silicon layer is in the range of 0 to 6 degrees. This makes it possible to prevent implantation of an imparity from the side of the sidewall of the pillar-shaped first-conductive-type silicon layer during the impurity implantation.

In a preferred embodiment of the present invention, the second-conductive-type silicon layer is formed in the portion of the planar silicon layer underneath the pillar-shaped first-conductive-type silicon layer, without implanting the impurity into the upper portion of the pillar-shaped first-conductive-type silicon layer. This makes it possible to readily optimize impurity implantation conditions for the upper portion of the pillar-shaped first-conductive-type silicon layer and the portion of the planar silicon layer underneath the pillar-shaped first-conductive-type silicon layer, to suppress short-channel effects in a transistor so as to reduce a leak current.

In a preferred embodiment of the present invention, the step (c) includes the sub-steps of: removing the sacrificial oxide film by etching, forming the dummy gate dielectric film typically consisting of a silicon oxide film or a silicon nitride film, and forming an amorphous silicon or polysilicon film serving as a dummy gate material to allow the pillar-shaped first-conductive-type silicon layer to be buried therein; and polishing the amorphous silicon or polysilicon film by chemical mechanical polishing to flatten an upper surface of the dummy gate material. In this case, the silicon nitride film-based mask serving as the first hard mask can be used as a stopper for the chemical mechanical polishing to control an amount of chemical mechanical polishing with high repeatability.

In a preferred embodiment of the present invention, the step (c) includes the sub-step of: oxidizing the flattened surface of the amorphous silicon or polysilicon film serving as the dummy gate material to form a silicon oxide film on an upper surface of the amorphous silicon or polysilicon film. In this case, the silicon oxide film can serve as a means to prevent the dummy gate electrode from being silicided during silicidation to be performed in a subsequent step. This makes it possible to facilitate removal of the dummy gate electrode in a subsequent step.

In a preferred embodiment of the present invention, the step (c) includes the sub-steps of: applying a bottom antireflective coating (BARC) layer and a resist on the silicon oxide film, and forming a pattern for a dummy gate line, using the resist by lithography; and etching the silicon oxide film, the BARC layer and the amorphous silicon or polysilicon film serving as the dummy gate material, using the resist as a mask to form the dummy gate electrode and the dummy gate line. Further, the step (d) includes the sub-steps of: removing the silicon nitride film-based mask on a top of the pillar-shaped first-conductive-type silicon layer by dry etching or wet etching; forming a silicon nitride film, and then etching back the silicon nitride film to expose an upper surface of the second-conductive-type silicon layer formed in the portion of the planar silicon layer underneath the pillar-shaped first-conductive-type silicon layer, and a top surface of the pillar-shaped first-conductive-type silicon layer, while forming a silicon nitride film-based sidewall on a sidewall of the dummy gate electrode; and introducing a second-conductive-type impurity into an upper portion of the pillar-shaped first-conductive-type silicon layer through an impurity doping process typified by impurity implantation, to form the second-conductive-type silicon layer in the upper portion of the pillar-shaped first-conductive-type silicon layer. The steps (e) and (f) include subjecting each of the upper surface of the second-conductive-type silicon layer formed in the portion of the planar silicon layer underneath the pillar-shaped first-conductive-type silicon layer, and an upper surface of the second-conductive-type silicon layer formed in the upper portion of the pillar-shaped first-conductive-type silicon layer, to sputtering of a metal typically consisting of nickel (Ni) or cobalt (Co), and a heat treatment, and removing an unreacted metal film, to form the metal-semiconductor compound on each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer. In this case, the silicon nitride film-based sidewall, and the silicon oxide film on the dummy gate electrode, can serve as a means to prevent a metal-semiconductor compound from being formed on the dummy gate electrode, and the dummy gate electrode and the silicon nitride film-based sidewall can serve as a means to allow a metal-semiconductor compound to be formed only on each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, whereby it becomes possible to prevent short-circuiting between the metal gate electrode and each of the second-conductive-type silicon layer formed in the portion of the planar silicon layer underneath the pillar-shaped first-conductive-type silicon layer and the second-conductive-type silicon layer formed in the upper portion of the pillar-shaped first-conductive-type silicon layer, due to the metal-semiconductor compounds. In addition, respective portions of the dummy gate dielectric film and the dummy gate electrode covering an upper region of the sidewall of the pillar-shaped first-conductive-type silicon layer can serve as a means to control formation of a metal-semiconductor compound from the side of the sidewall of the pillar-shaped first-conductive-type silicon layer.

In a preferred embodiment of the present invention, the steps (g) and (h) include the sub-steps of: forming a film typically consisting of a silicon nitride film; forming a silicon oxide film and an amorphous silicon or polysilicon layer; flattening an upper surface of the amorphous silicon or polysilicon layer by chemical mechanical polishing, while controlling respective upper surfaces of the amorphous silicon or polysilicon layer and the silicon oxide film to be located at a same height position; dry-etching the silicon oxide film, wherein an end-point of the dry etching is detected based on the silicon nitride film to be exposed when a portion of the silicon oxide film on an upper surface of the silicon nitride film is fully etched away, so that respective upper surfaces of the silicon oxide film and the silicon nitride film are controlled to be located at a same height position; dry-etching the silicon nitride film, wherein an end-point of the dry etching is detected based on the dummy gate electrode to be exposed when a portion of the silicon nitride film on an upper surface of the dummy gate electrode is fully etched away, so that respective upper surfaces of the dummy gate electrode, the silicon nitride film and the silicon oxide film are controlled to be located at a same height position; dry-etching the dummy gate electrode and the amorphous silicon or polysilicon layer; removing the silicon oxide film and dummy gate dielectric film by wet etching; forming the high-k gate dielectric film; forming a metal gate layer; and dry-etching the metal gate layer to form the metal gate electrode and the metal gate line. In the sub-step of dry-etching the metal gate layer, an end-point of the dry etching is detected based on the silicon oxide film to be exposed when a portion of the metal gate layer on a reference surface of the silicon oxide film is fully etched away, so that an upper surface of the gate metal layer can be controlled to be located at a same height position as that of the reference surface of the silicon oxide film. This makes it possible to control a sum of respective thicknesses of the silicon oxide film and the silicon nitride film to become equal to a desired gate length of the metal gate electrode with less variation in the gate length.

In a preferred embodiment of the present invention, the steps (i) to (k) include the sub-steps of): forming a film typically consisting of a silicon nitride film to serve as a contact stopper; forming a silicon oxide film to serve as an interlayer film and then flattening the silicon oxide film by chemical mechanical polishing; applying a resist, and then forming a pattern using the resist by lithography, to form two contact holes on respective ones of the metal gate line, and the second-conductive-type silicon layer formed in the upper portion of the pillar-shaped first-conductive-type silicon layer, by etching; applying a resist, and then forming a pattern using the resist by lithography, to form a contact hole on the second-conductive-type silicon layer formed in the portion of the planar silicon layer underneath the pillar-shaped first-conductive-type silicon layer, by etching; forming a film made of a barrier metal typified by tantalum (Ta) or tantalum nitride (TaN) on each of the contact holes, whereafter a copper (Cu) film is formed on the barrier metal film by sputtering or plating, and subjected to chemical mechanical polishing to form a contact plug; forming a silicon carbide (SiC) film to serve an etching stopper for first-layer interconnection lines, and then forming a low-k film to serve as an interlayer film of a first interconnection layer; and forming a pattern for the first-layer interconnection lines to form corresponding trenches in the first interconnection layer, and forming a film made of a barrier metal typified by tantalum (Ta) or tantalum nitride (TaN) on each of the trenches, whereafter a copper (Cu) film is formed on the barrier metal film by sputtering or plating, and subjected to chemical mechanical polishing to form the first-layer interconnection lines. This makes it possible to reduce a resistance of each of the contacts.

Alternatively, the portions of the interlayer film for the contact hole on the top of the second-conductive-type semiconductor layer in an upper portion of the pillar-shaped first-conductive-type silicon layer, the contact hole on the metal gate line and the contact hole on the second-conductive-type silicon layer formed in the portion of the planar silicon layer underneath the pillar-shaped first-conductive-type silicon layer may be simultaneously etched, and the portions of the contact stopper corresponding to the three contact holes may also be simultaneously etched.

Alternatively, the steps (i) to (k) may include the sub-steps of: forming a film typically consisting of a silicon nitride film to serve as a contact stopper; forming a silicon oxide film to serve as an interlayer film and then flattening the silicon oxide film by chemical mechanical polishing; etching respective portions of the interlayer film for a contact hole on the metal gate line and a contact hole on the portion of the planar silicon layer underneath the pillar-shaped first-conductive-type silicon layer; etching a portion of the interlayer film for a contact hole on a top of the second-conductive-type silicon layer formed in the upper portion of the pillar-shaped first-conductive-type silicon layer, using a resist as a mask; and, after the etching of the interlayer film, etching respective portions of the contact stopper corresponding to the three contact holes. In this case, the etching of the portion of the interlayer film for the contact hole on the top of the second-conductive-type silicon layer formed in the upper portion of the pillar-shaped first-conductive-type silicon layer is performed separately from the etching of the portions of the interlayer film for the contact hole on the metal gate line and the contact hole on the portion of the planar silicon layer underneath the pillar-shaped first-conductive-type silicon layer. This makes it possible to optimize etching conditions for the contact hole on the top of the second-conductive-type silicon layer formed in the upper portion of the pillar-shaped first-conductive-type silicon layer, while optimizing etching conditions for the contact hole on the metal gate line and the contact hole on the portion of the planar silicon layer underneath the pillar-shaped first-conductive-type silicon layer.

BRIEF DESCRIPTION OF THE DRAWINGS

FIGS. 1A-1F are tables showing steps of a semiconductor production method according to one embodiment of the present invention.

FIG. 2($a$) is a top plan view showing one of the steps of the semiconductor production method according to the embodiment.

FIG. 2($b$) is a sectional view showing the step of the semiconductor production method according to the embodiment, taken along the line A-A' in FIG. 2($a$).

FIG. 3($b$) is a sectional view showing the step of the semiconductor production method according to the embodiment, taken along the line A-A' in FIG. 3($a$).

FIG. 4($b$) is a sectional view showing the step of the semiconductor production method according to the embodiment, taken along the line A-A' in FIG. 4($a$).

FIG. 5($b$) is a sectional view showing the step of the semiconductor production method according to the embodiment, taken along the line A-A' in FIG. 5($a$).

FIG. 6($b$) is a sectional view showing the step of the semiconductor production method according to the embodiment, taken along the line A-A' in FIG. 6($a$).

FIG. 7($b$) is a sectional view showing the step of the semiconductor production method according to the embodiment, taken along the line A-A' in FIG. 7($a$).

FIG. 8($b$) is a sectional view showing the step of the semiconductor production method according to the embodiment, taken along the line A-A' in FIG. 8($a$).

FIG. 9($b$) is a sectional view showing the step of the semiconductor production method according to the embodiment, taken along the line A-A' in FIG. 9($a$).

FIG. 10($b$) is a sectional view showing the step of the semiconductor production method according to the embodiment, taken along the line A-A' in FIG. 10($a$).

FIG. 11($b$) is a sectional view showing the step of the semiconductor production method according to the embodiment, taken along the line A-A' in FIG. 11($a$).

DETAILED DESCRIPTION OF THE PREFERRED EMBODIMENTS

Figure 41A:
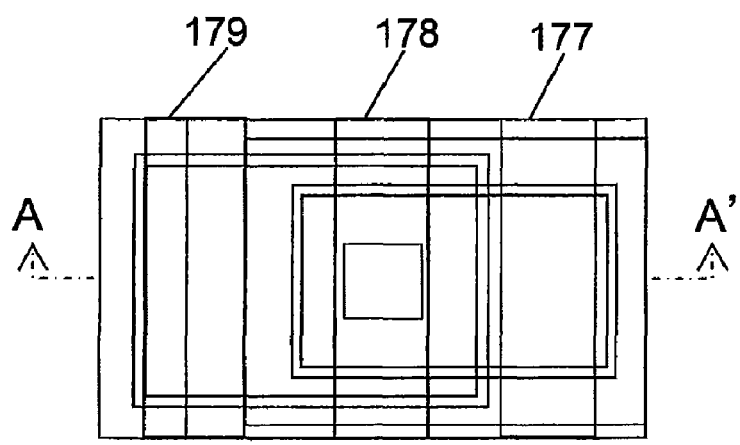
FIG. 41(a) is a top plan view showing one of the steps of the semiconductor production method according to the embodiment.
Figure 41B:
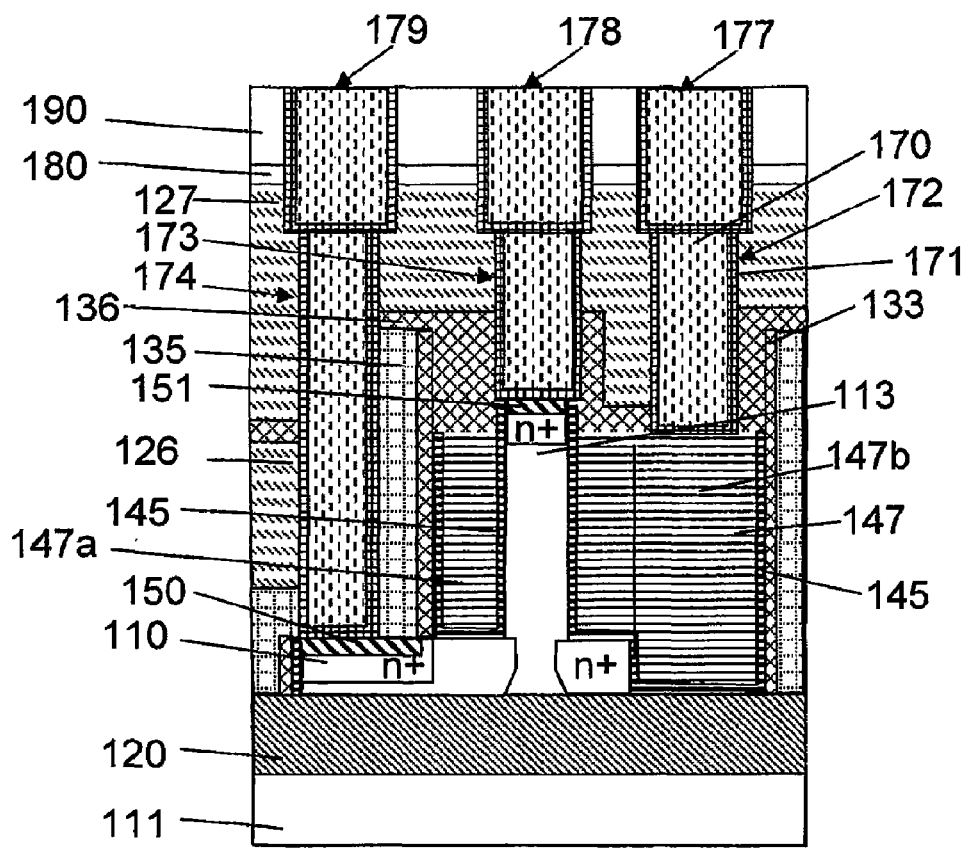
FIG. 41(b) is a sectional view showing the step of the semiconductor production method according to the embodiment, taken along the line A-A' in FIG. 41(a).

FIG. 41(a) is a top plan view of an NMOS SGT formed using the present invention, and FIG. 41(b) is a sectional view taken along the line A-A' in FIG. 41(a). With reference to FIGS. 41(a) and 41(b), the NMOS SGT formed using the present invention will now be described.

A planar silicon layer 112 is formed on a substrate which comprises a buried oxide (BOX) layer 120 formed on a Si layer 111, and a pillar-shaped silicon layer 113 is formed on the planar silicon layer 112. A high-k gate dielectric film 145 and a metal gate electrode 147 are formed around the pillar-shaped silicon layer 113. An $N^+$ drain diffusion layer 200 is formed in a portion of the planar silicon layer 112 underneath the pillar-shaped silicon layer, and an $N^+$ source diffusion layer 201 is formed in an upper portion of the pillar-shaped silicon layer. A contact 179 is formed on the $N^+$ drain diffusion layer 200, and a contact 178 is formed on the $N^+$ source diffusion layer 201. A contact 177 is formed on a metal gate line 147b extending from the metal gate electrode 147a.

Figure 42:
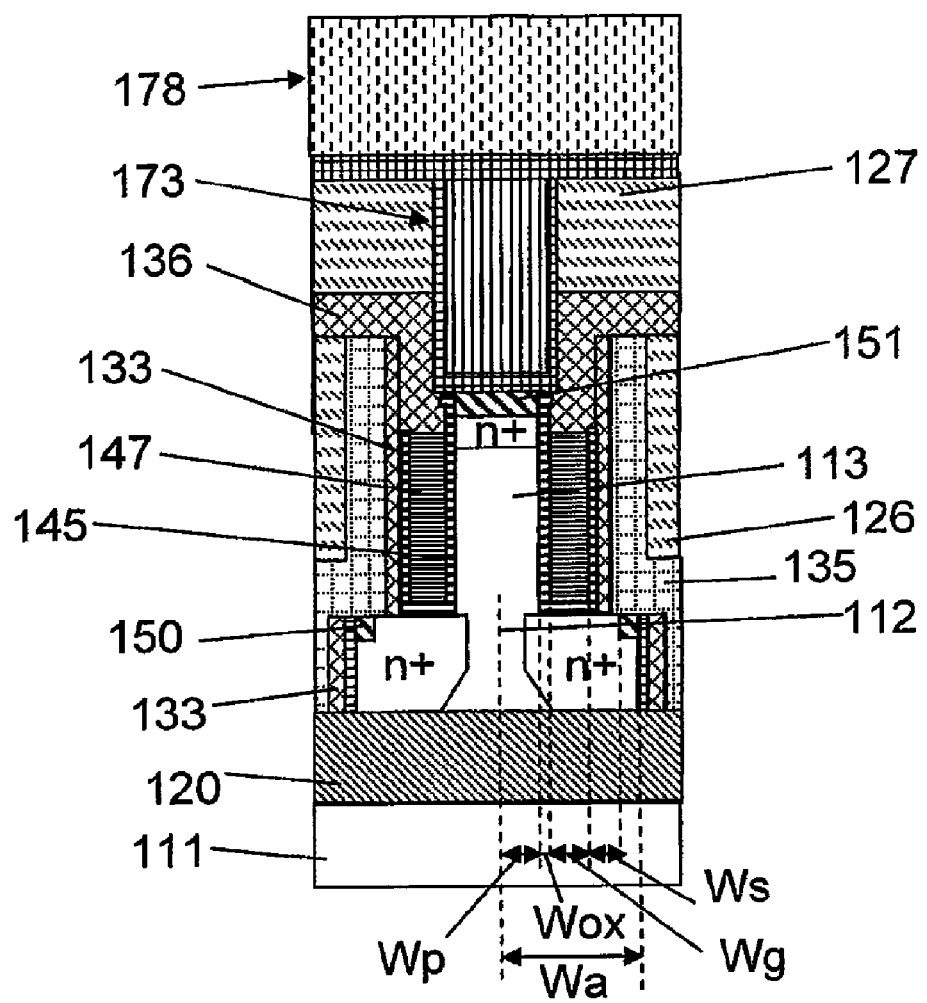
FIG. 42 is a sectional view showing the step of the semiconductor production method according to the embodiment, taken along the line B-B' in FIG. 41(a).

FIG. 42 is a sectional view taken along the line B-B' in FIG. 41(a). In order to reduce a resistance of a source region, it is necessary to form a silicide layer on the source region. In this regard, as a prerequisite to allowing the silicide to be formed on the planar silicon layer 112, the following condition must be satisfied:

$$Wa > Wp + Wox + Wg + Ws,$$

wherein Wa is a distance between a central axis of the silicon pillar 113 and a lateral end of the planar silicon layer 112, and Wp, Wox, Wg and Ws are a distance between the central axis and a sidewall of the silicon pillar 113, a thickness of the high-k gate dielectric film 145, a width of the metal gate electrode 147, and a width of a nitride film-based sidewall 133, respectively.

Under a condition that the $N^+$ source diffusion layer is connected to a GND potential, and the $N^+$ drain diffusion layer is connected to a power supply potential Vcc, a potential ranging from zero to Vcc is applied to the gate electrode to allow the SGT to operate as a transistor. In the above structure, the $N^+$ diffusion layer formed in the upper portion of the pillar-shaped silicon layer may serve as an $N^+$ source diffusion layer, and the $N^+$ diffusion layer formed in the portion of the planar silicon layer underneath the pillar-shaped silicon layer may serve as an N+ drain diffusion layer.

With reference to FIGS. 1 to (41(b)), an SGT production method according to one embodiment of the present invention will be described below. In FIGS. 2(a) to 41(b), the same elements or components are defined by a common reference numeral or code. FIG. 1 shows steps of the SGT production method according to this embodiment. FIGS. 2(a) to (41(b)) show the SGT production method according to this embodiment, on a step-by-step basis, wherein the figure suffixed with (a) is a top plan view, and the figure suffixed with (b) is a sectional view taken along the line A-A' in the figure suffixed with (a).

Referring to FIGS. 2(a) and 2(b), an SOI substrate is prepared which comprises a BOX layer 120 formed on a Si layer 111, and a silicon layer 110 formed on the BOX layer 120. A pad oxide film 121 is formed on the SOI layer 110. Before forming the pad oxide film (pad oxidation), an operation of forming a lot, an operation of forming a laser mark, and a pre-pad-oxidation cleaning operation, may be performed. Further, after the pad oxidation, a thickness measurement operation for the pad oxide film may be performed (Steps 1, 2, 3, 4, 5 in FIG. 1).

Figure 3A:
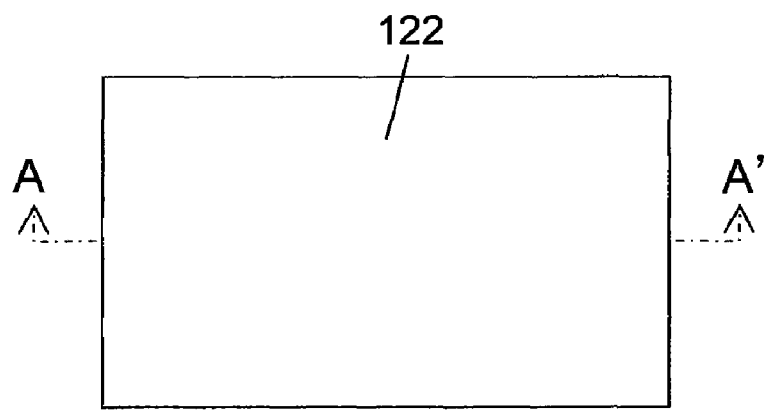
FIG. 3($a$) is a top plan view showing one of the steps of the semiconductor production method according to the embodiment.
Figure 3B:
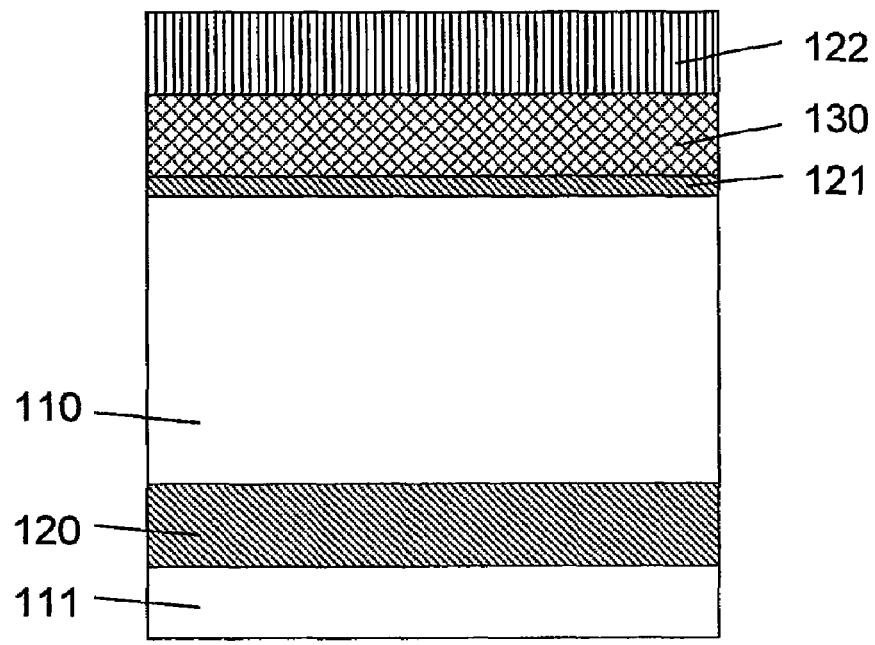

Referring to FIGS. 3(a) and 3(b), a silicon nitride film 130 serving as a first hard mask is formed, and then a silicon oxide film 122 is formed. After forming the silicon nitride film, a thickness measurement operation for the nitride film may be performed. Further, after depositing the silicon oxide film, a thickness measurement operation for the silicon oxide film may be performed (Steps 6, 7, 8, 9 in FIG. 1).

Figure 4A:
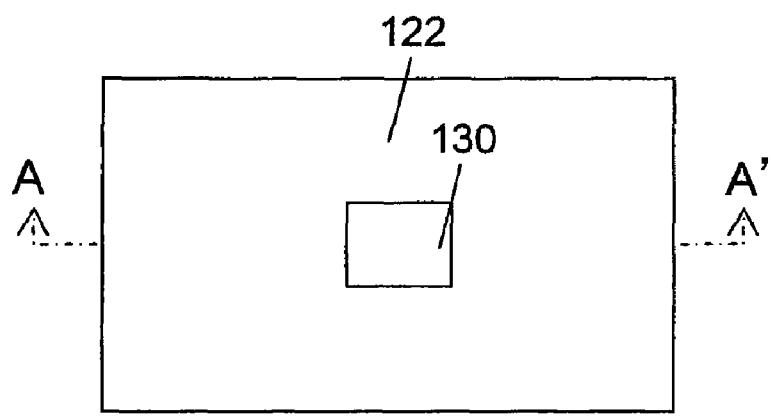
FIG. 4($a$) is a top plan view showing one of the steps of the semiconductor production method according to the embodiment.
Figure 4B:
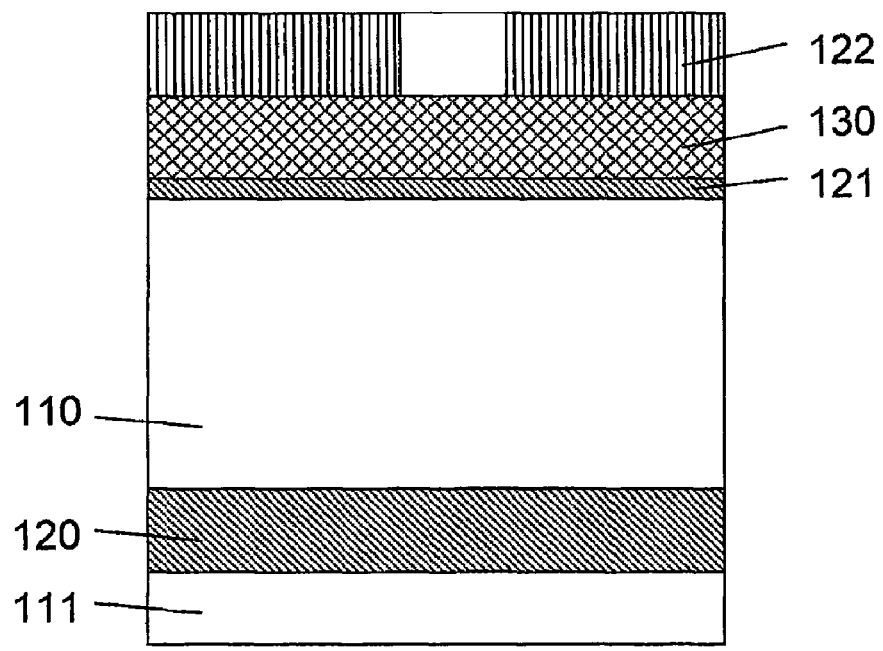
Figure 43A:
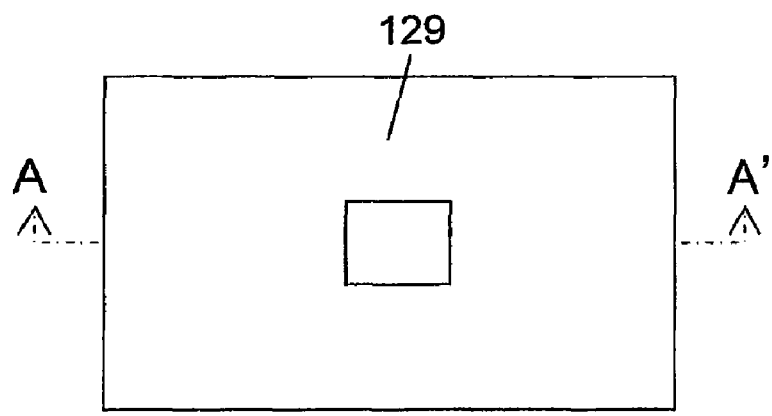
FIG. 43(a) is a top plan view showing a step of one modification of the semiconductor production method according to the embodiment.
Figure 43B:
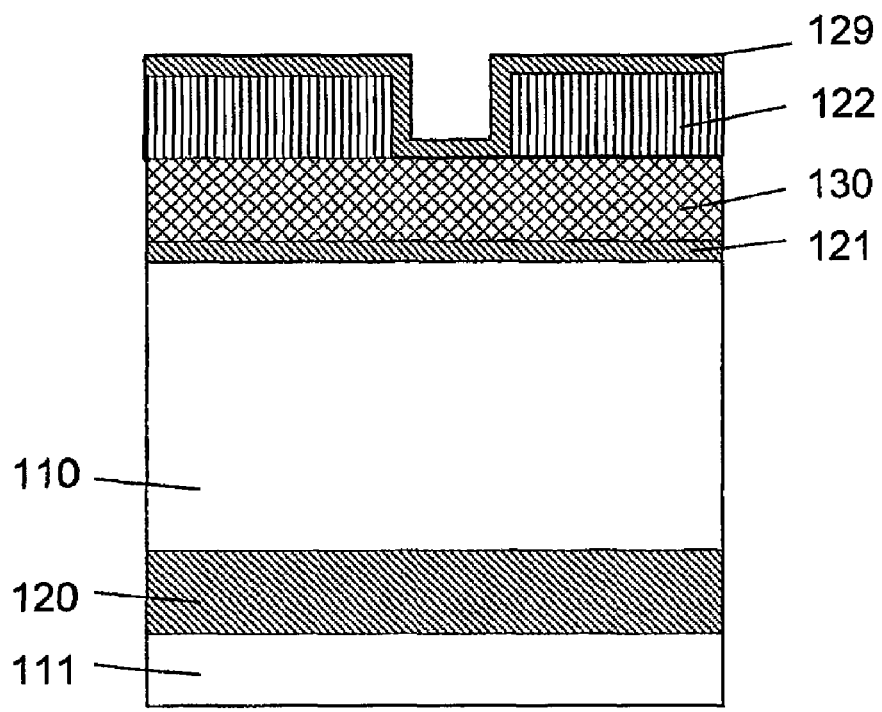
FIG. 43(b) is a sectional view showing the step of the modification of the semiconductor production method according to the embodiment, taken along the line A-A' in FIG. 43(a).
Figure 44A:
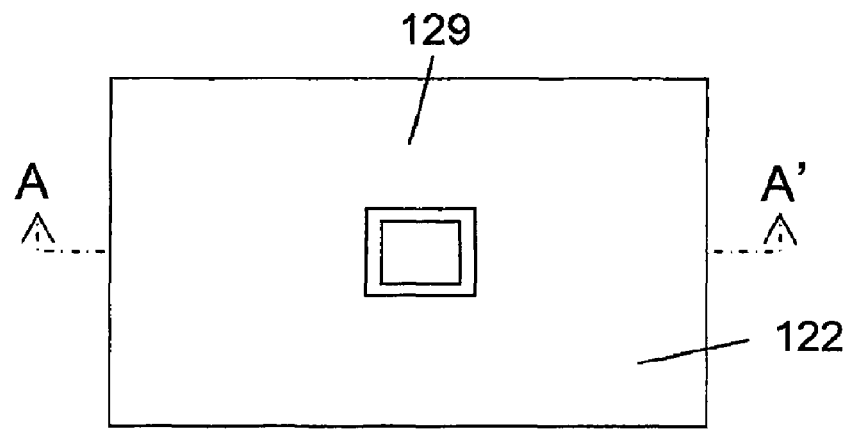
FIG. 44(a) is a top plan view showing a step of the modification of the semiconductor production method according to the embodiment.
Figure 44B:
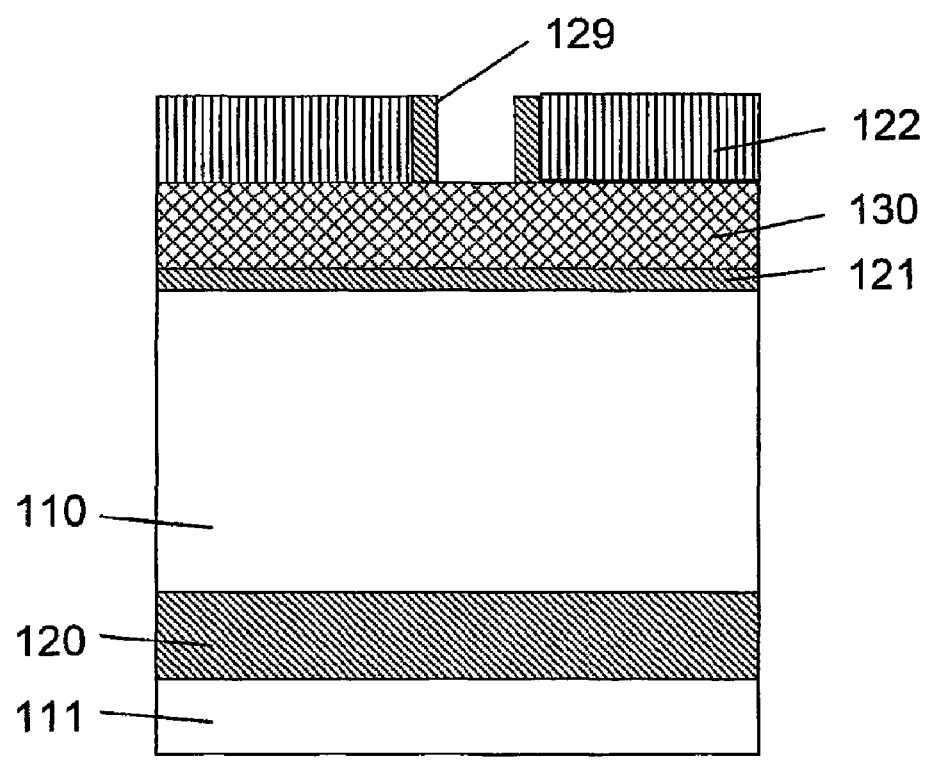
FIG. 44(b) is a sectional view showing the step of the modification of the semiconductor production method according to the embodiment, taken along the line A-A' in FIG. 44(a).

Referring to FIGS. 4(a) and 4(b), a resist is applied, and a pattern having an inverted shape of a top view of a pillar-shaped silicon layer is formed using the resist by lithography. Then, a hole is formed in the silicon oxide film 122 by dry etching, in such a manner that it penetrates through the silicon oxide film 122 at a position for forming the pillar-shaped silicon layer. After the lithography, a dimension measurement operation and a verification operation may be performed. Further, after the etching, a post-etching cleaning operation may be performed (Steps 10, 11, 12, 13, 14, 15, 16, 17 in FIG. 1). Subsequently, a diameter of the hole penetrating through the silicon oxide film 122 may be reduced by depositing an oxide film 129 as shown in FIGS. 43(a) and 43 (b), and etching back the oxide film 129 as shown in FIGS. 44(a) and 44(b).

Figure 5A:
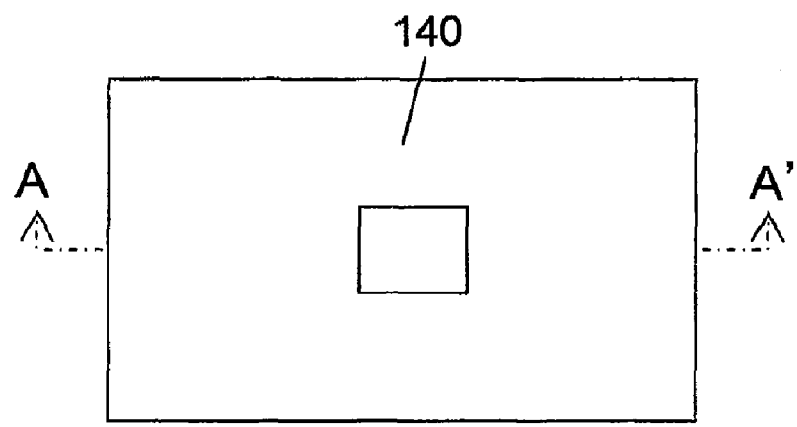
FIG. 5($a$) is a top plan view showing one of the steps of the semiconductor production method according to the embodiment.
Figure 5B:
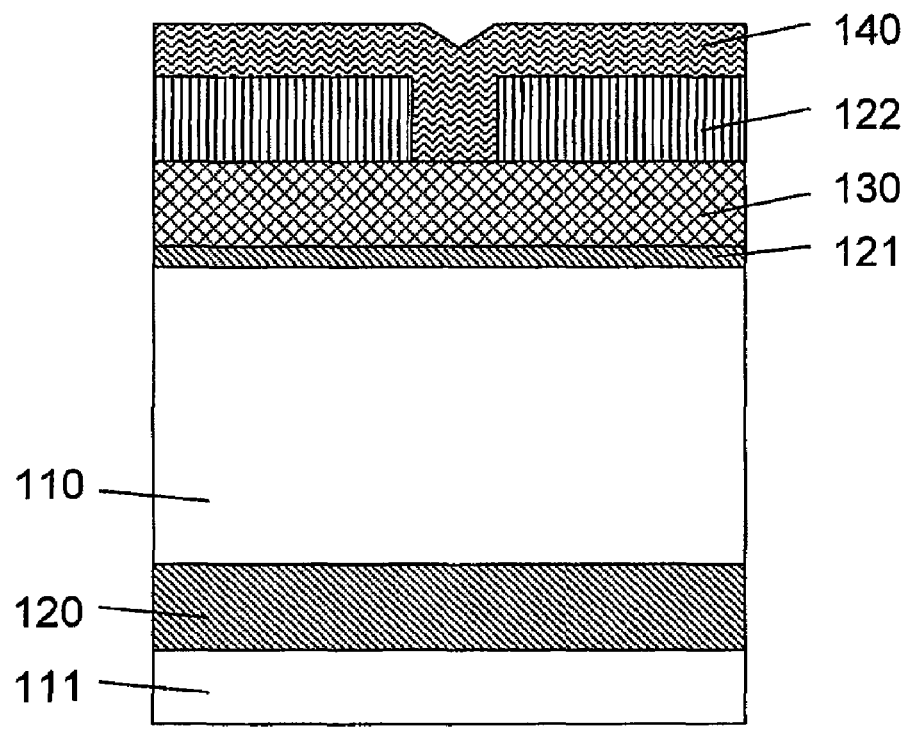

Referring to FIGS. 5(a) and 5(b), an amorphous silicon or polysilicon film 140 is formed to fill the hole formed in the silicon oxide film 122. Before depositing the amorphous silicon or polysilicon, a pre-deposition cleaning operation may be performed. Further, after the deposition, a thickness measurement operation for the amorphous silicon or polysilicon film may be performed (Steps 18, 19, 20 in FIG. 1).

Figure 6A:
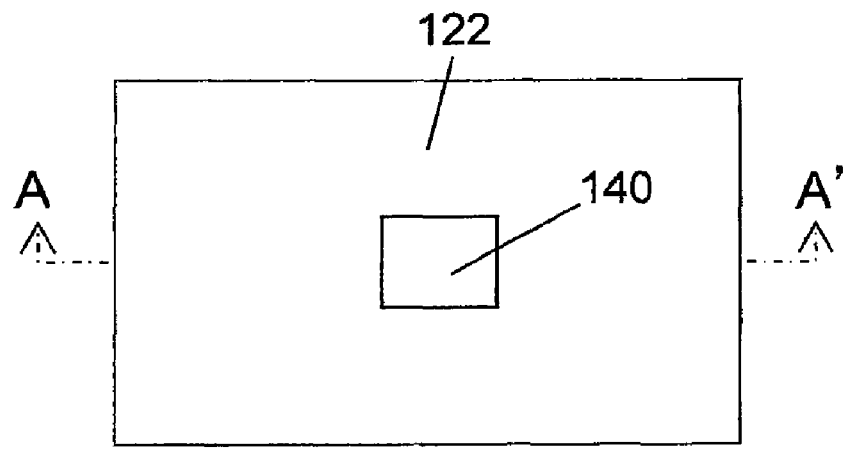
FIG. 6($a$) is a top plan view showing one of the steps of the semiconductor production method according to the embodiment.
Figure 6B:
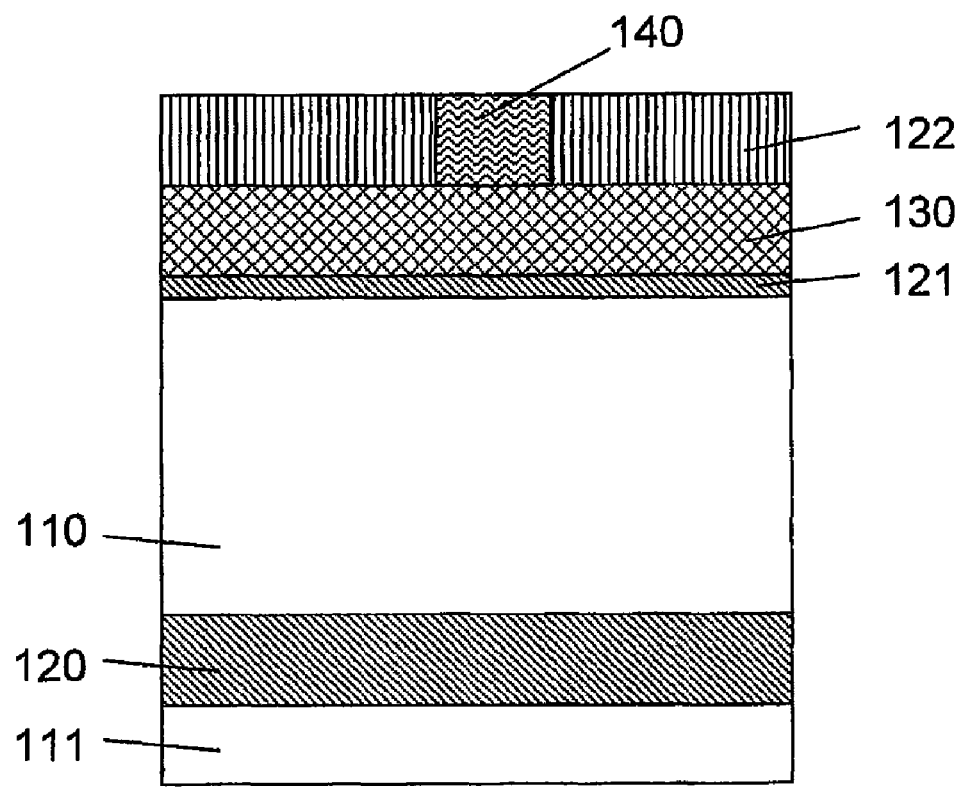

Referring to FIGS. 6(a) and 6(b), a portion of the amorphous silicon or polysilicon film 140 formed on the silicon oxide film 122 is polished and removed by chemical mechanical polishing (CMP). After the polishing, a thickness measurement operation for the amorphous silicon or polysilicon film may be performed (Steps 21, 22 in FIG. 1).

Figure 7A:
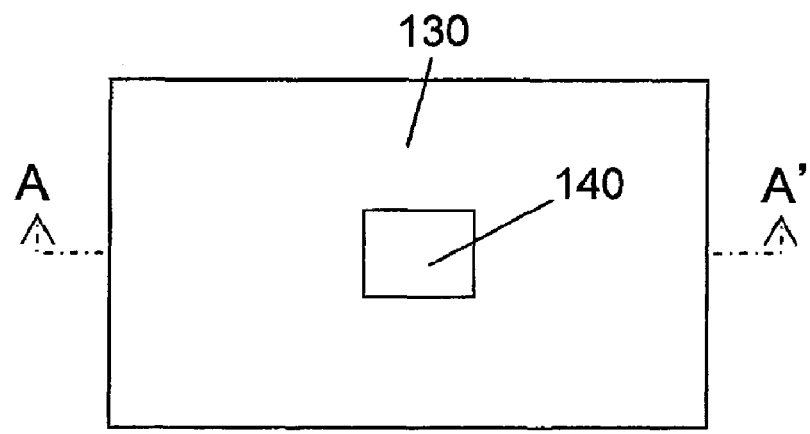
FIG. 7($a$) is a top plan view showing one of the steps of the semiconductor production method according to the embodiment.
Figure 7B:
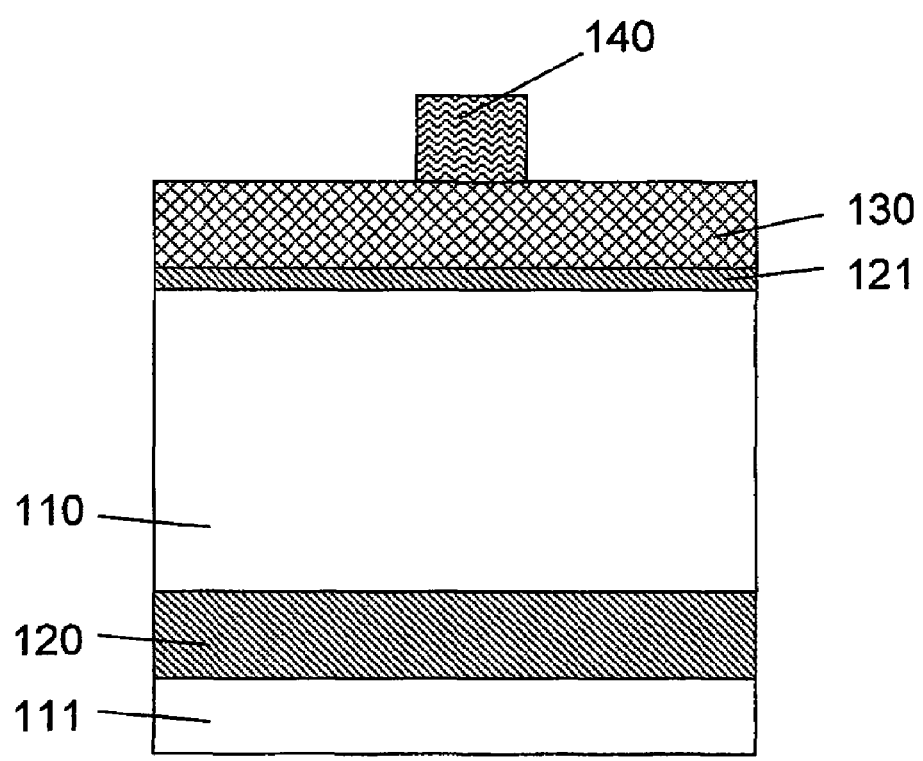

Referring to FIGS. 7(a) and 7(b), the silicon oxide film 122 is removed by wet etching using hydrofluoric acid or the like, or dry etching, to form an amorphous silicon or polysilicon film-based mask 140 serving as a second hard mask to be used during dry etching for the pillar-shaped silicon layer in a subsequent step (Step 23 in FIG. 1).

Figure 8A:
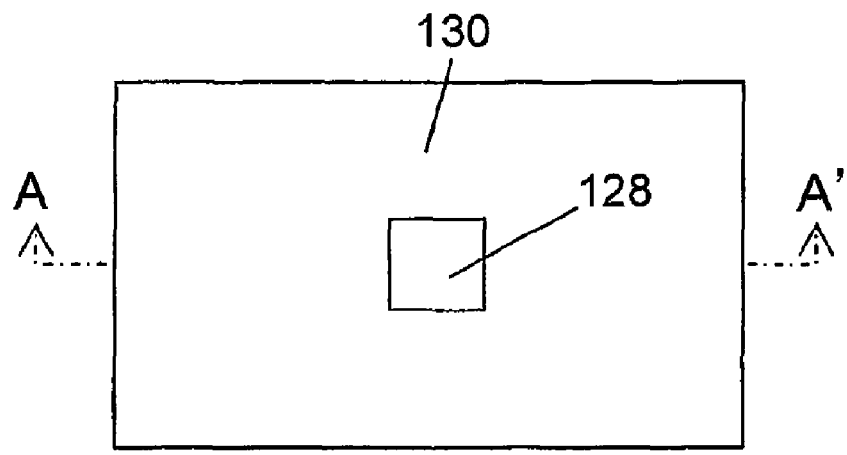
FIG. 8($a$) is a top plan view showing one of the steps of the semiconductor production method according to the embodiment.
Figure 8B:
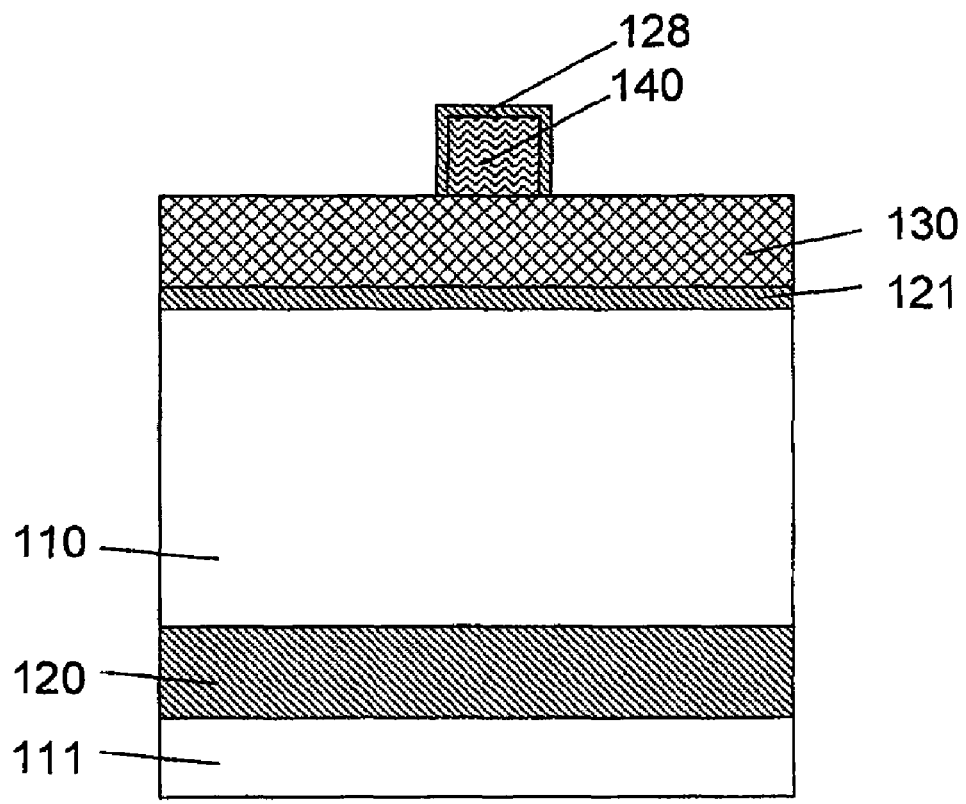

Referring to FIGS. 8(a) and 8(b), the amorphous silicon or polysilicon film-based mask 140 is sacrificially oxidized to form a silicon oxide film 128 thereon to reduce a size of the amorphous silicon or polysilicon film-based mask 140. Before the sacrificial oxidation, a pre-sacrificial-oxidation cleaning operation may be performed. Further, after the oxidation, a thickness measurement operation for the sacrificial oxide film may be performed (Steps 24, 25, 26 in FIG. 1). Based on the sacrificial oxidation, a size of the pillar-shaped silicon layer illustrated in FIGS. 11(a) and 11(b) can be reduced. The reduced diameter of the pillar-shaped silicon layer can contribute to suppression of short-channel effects and therefore a reduction in leak current.

Figure 9A:
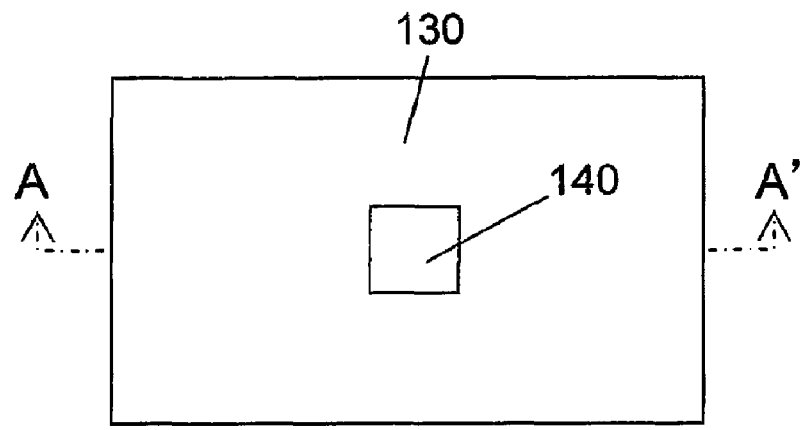
FIG. 9($a$) is a top plan view showing one of the steps of the semiconductor production method according to the embodiment.
Figure 9B:
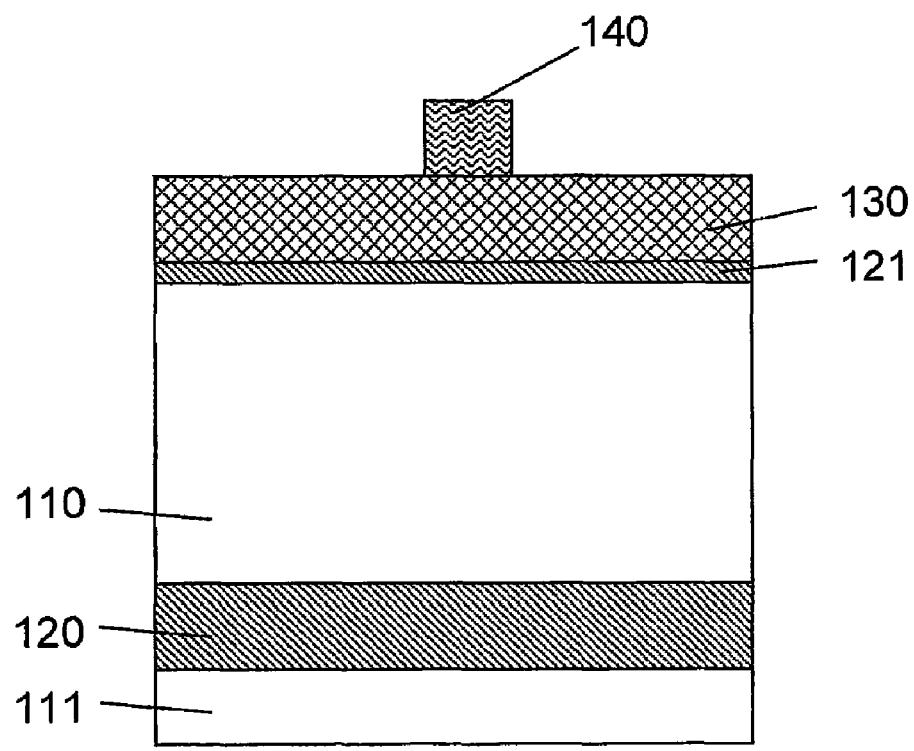

Referring to FIGS. 9(a) and 9(b), the silicon oxide film 128 on a surface of the amorphous silicon or polysilicon film-based mask 140 is removed by wet etching using hydrofluoric acid or the like, or dry etching (Step 27 in FIG. 1).

Figure 10A:
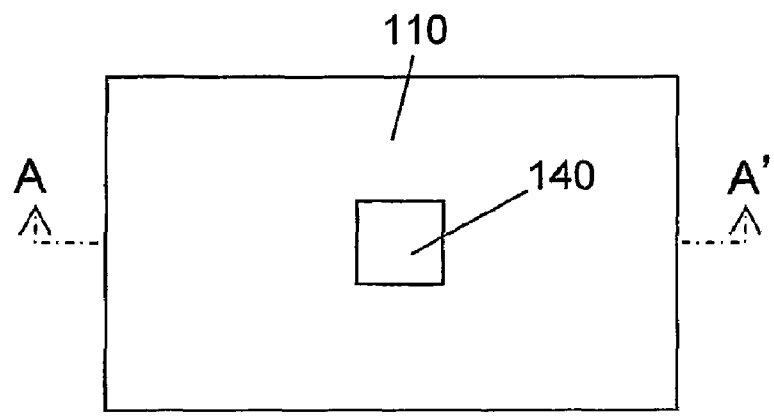
FIG. 10($a$) is a top plan view showing one of the steps of the semiconductor production method according to the embodiment.
Figure 10B:
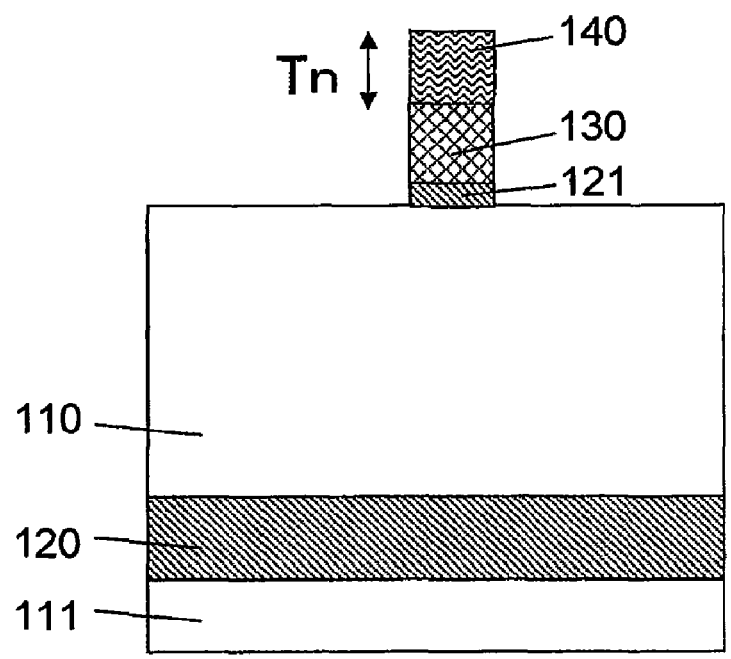

Referring to FIGS. 10(a) and 10(b), the silicon nitride film (first hard mask) 130 and the pad oxide film 121 are dry-etched using the amorphous silicon or polysilicon film-based mask (second hard mask) 140 (Steps 28, 29 in FIG. 1).

Figure 11A:
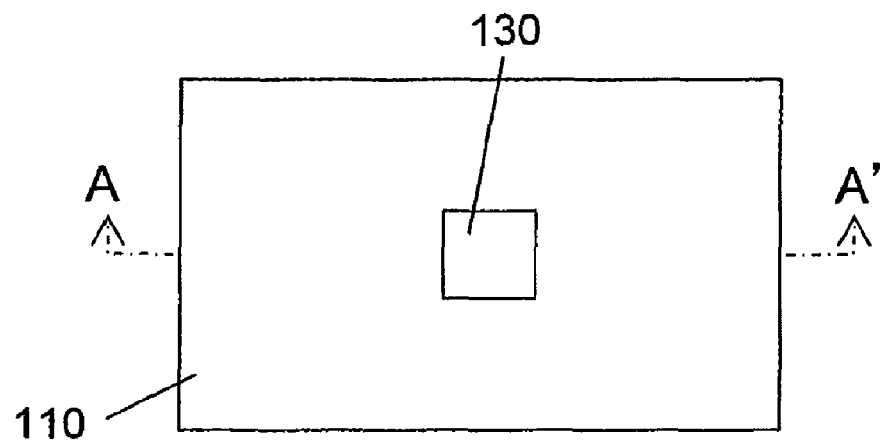
FIG. 11($a$) is a top plan view showing one of the steps of the semiconductor production method according to the embodiment.
Figure 11B:
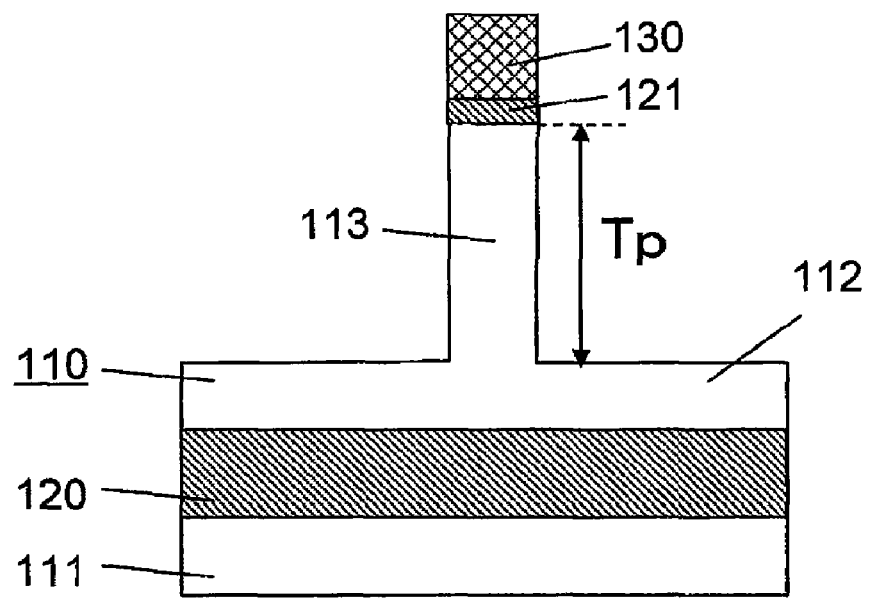

Referring to FIGS. 11(a) and 11(b), the pillar-shaped silicon layer 113 is formed by dry etching using the silicon nitride film-based mask (first hard mask) 130 and the amorphous silicon or polysilicon film-based mask (second hard mask) 140. After the etching, an organic-substance removal operation, a scanning electron microscopic (SEM) inspection operation, and a step-height verification operation, may be performed (Steps 30, 31, 32, 33 in FIG. 1). During the etching, the amorphous silicon or polysilicon film-based mask (second hard mask) 140 is also etched. When the amorphous silicon or polysilicon film-based mask 140 is fully etched away, a plasma emission intensity detectable by a dry etching apparatus is changed. Thus, an etching end-point detection process can be performed by detecting the change in the plasma emission intensity. This makes it possible to stably control a height dimension of the pillar-shaped silicon layer 113 without relying on an etching rate.

As a prerequisite to the use of the end-point detection process, it is necessary that the amorphous silicon or polysilicon film-based mask 140 before the dry etching for the pillar-shaped silicon layer is formed to have a film thickness Tn (FIG. 10(b)) less than the height dimension Tp of the pillar-shaped silicon layer.

In this step, a continuous planar silicon layer 112 is formed on the buried oxide layer 120.

Figure 12A:
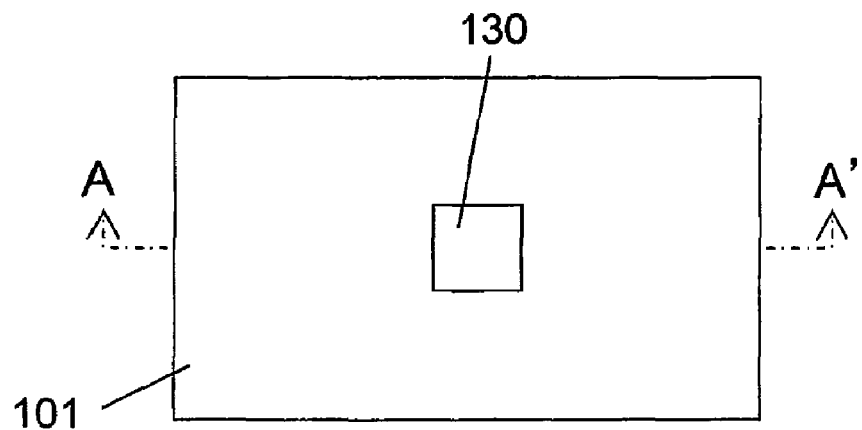
FIG. 12(a) is a top plan view showing one of the steps of the semiconductor production method according to the embodiment.
Figure 12B:
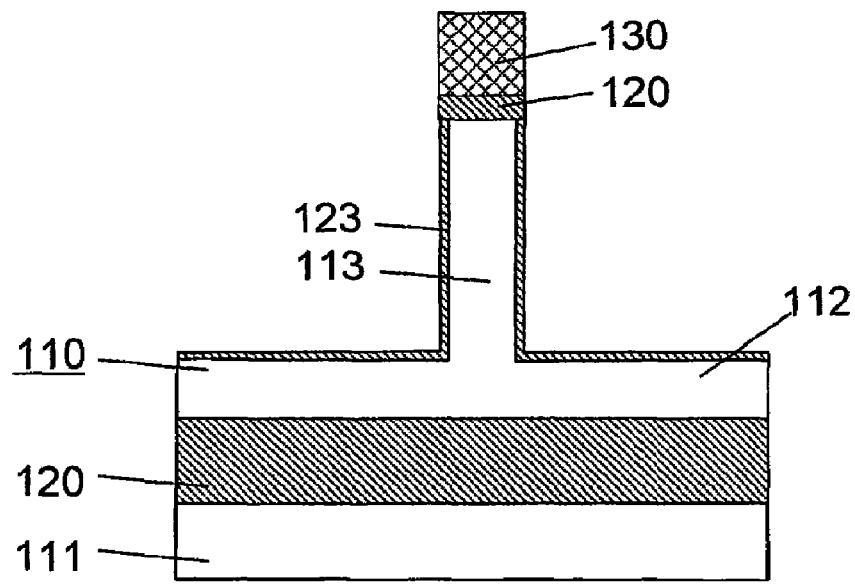
FIG. 12(b) is a sectional view showing the step of the semiconductor production method according to the embodiment, taken along the line A-A' in FIG. 12(a).

Referring to FIGS. 12(a) and 12(b), in order to reduce irregularities in a region of the sidewall of the pillar-shaped silicon layer 113 serving as a channel region, and remove a silicon surface implanted with carbon and others during the dry etching, respective surfaces of the pillar-shaped silicon layer 113 and the continuous planar silicon layer 112 are sacrificially oxidized and formed as a sacrificial oxide film 123. Before the sacrificial oxidation, a pre-sacrificial-oxidation cleaning operation may be performed. Further, after the sacrificial oxidation, a thickness measurement operation for the sacrificial oxide film may be performed (Steps 34, 35, 36 in FIG. 1).

Figure 13A:
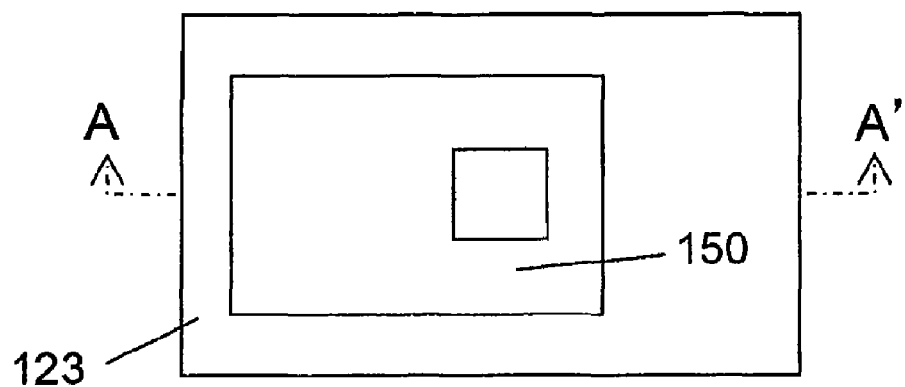
FIG. 13(a) is a top plan view showing one of the steps of the semiconductor production method according to the embodiment.
Figure 13B:
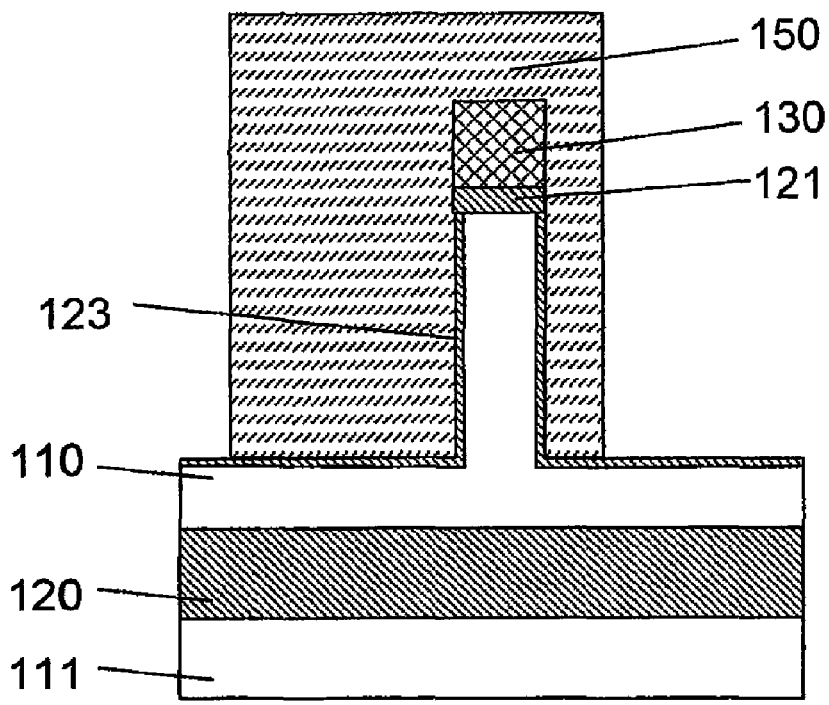
FIG. 13(b) is a sectional view showing the step of the semiconductor production method according to the embodiment, taken along the line A-A' in FIG. 13(a).

Referring to FIGS. 13(a) and 13(b), a resist 150 is applied, and a pattern for a source diffusion layer is formed using the resist by lithography. The sacrificial oxide film 123 formed on the pillar-shaped silicon layer 113 and the continuous planar silicon layer 112 by the sacrificial oxidation will protect surfaces of the silicon layers from contamination due to by-products to be produced during dry etching in the next step, etc. After the lithography, an overlay-error measurement operation, a dimension measurement operation and a verification operation may be performed (Steps 37, 38, 39, 40, 41 in FIG. 1).

Figure 14A:
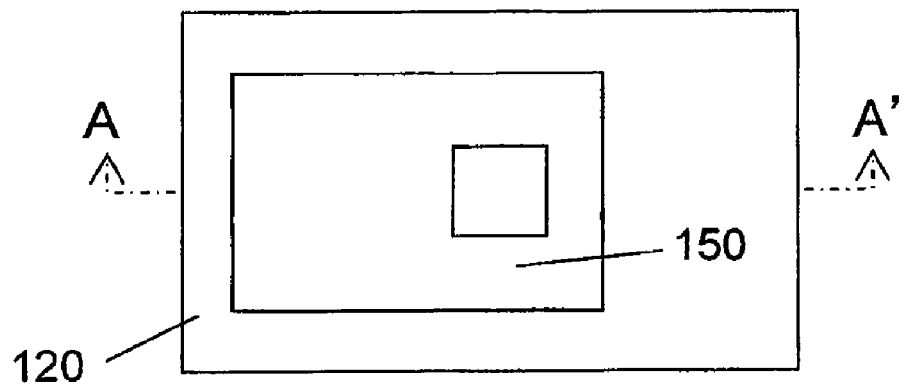
FIG. 14(a) is a top plan view showing one of the steps of the semiconductor production method according to the embodiment.
Figure 14B:
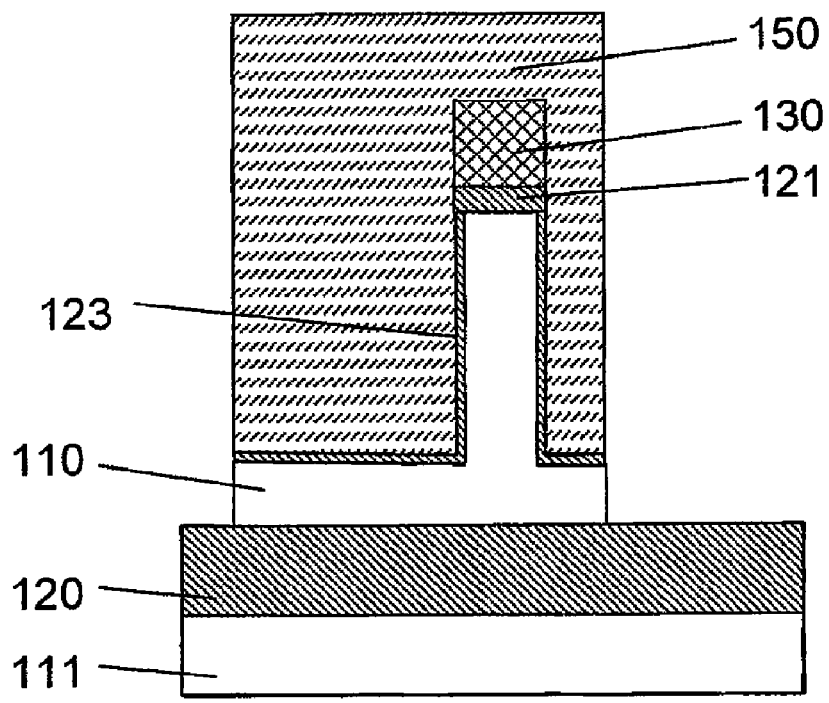
FIG. 14(b) is a sectional view showing the step of the semiconductor production method according to the embodiment, taken along the line A-A' in FIG. 14(a).

Referring to FIGS. 14(a) and 14(b), the continuous planar silicon layer 112 is dry-etched to isolate a planar silicon layer 112 from other elements (Steps 42, 43 in FIG. 1).

Figure 15A:
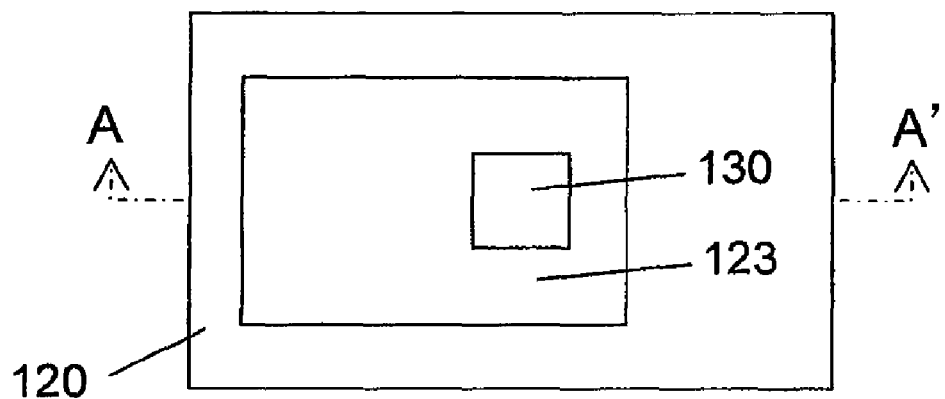
FIG. 15(a) is a top plan view showing one of the steps of the semiconductor production method according to the embodiment.
Figure 15B:
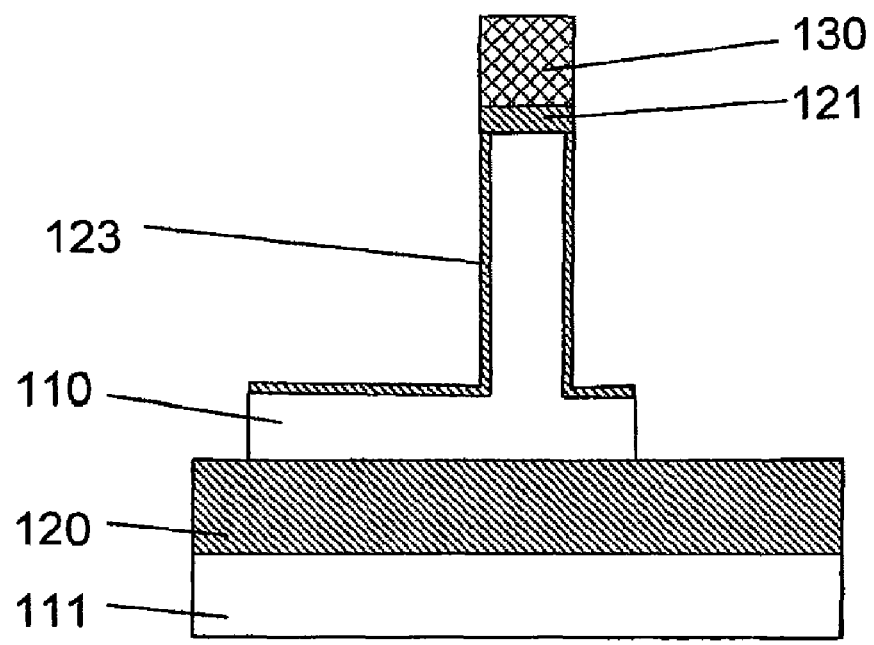
FIG. 15(b) is a sectional view showing the step of the semiconductor production method according to the embodiment, taken along the line A-A' in FIG. 15(a).

Referring to FIGS. 15(a) and 15(b), the resist is removed. After the removal, an organic-substance removal operation, an SEM inspection operation, and a step-height verification operation, may be performed (Steps 44, 45, 46 in FIG. 1).

Figure 16A:
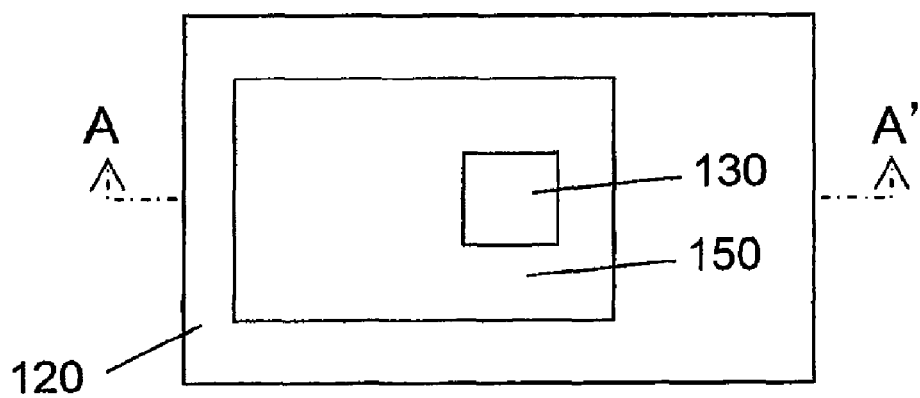
FIG. 16(a) is a top plan view showing one of the steps of the semiconductor production method according to the embodiment.
Figure 16B:
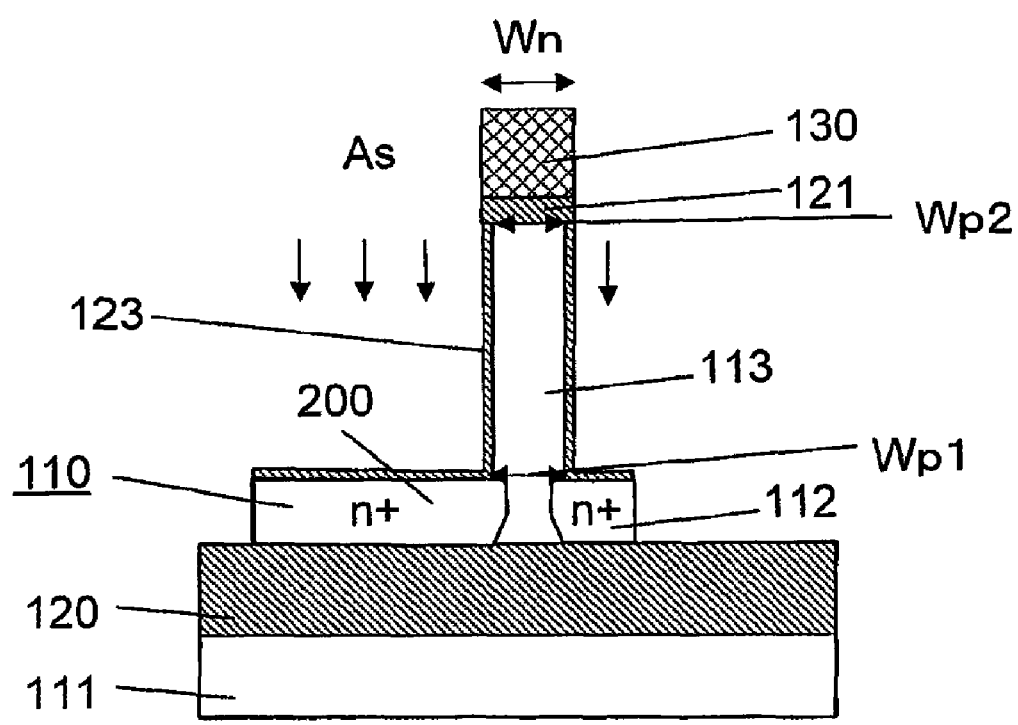
FIG. 16(b) is a sectional view showing the step of the semiconductor production method according to the embodiment, taken along the line A-A' in FIG. 16(a).

Referring to FIGS. 16(a) and 16(b), an impurity, such as phosphorus (P) or arsenic (As), is introduced into the surface of the planar silicon layer 112 by impurity implantation or the like, to form an $N^+$ source diffusion layer 200 in the planar silicon layer 112 (Steps 47, 48 in FIG. 1). In this step, the sacrificial oxide film 123 formed during the sacrificial oxidation of the pillar-shaped silicon layer 113 and the continuous planar silicon layer 112 is used as a screen oxide film, which makes it possible to reduce the number of production steps.

If an impurity is implanted from the sidewall of the pillar-shaped silicon layer 113 during the implantation, it becomes a factor causing a variation in transistor characteristics. Therefore, it is essential that a width ($Wp_1$, $Wp_2$) of the pillar-shaped silicon layer 113 is less than a width $Wn$ of the nitride film 130, wherein $Wp_1$ is a width of a bottom of the pillar-shaped silicon layer, and $Wp_2$ is a width of a top of the pillar-shaped silicon layer.

Preferably, the impurity is implanted at a small angle, specifically, at an angle ranging from zero to 6 degrees, to prevent the impurity from being implanted from the sidewall of the pillar-shaped silicon layer 113 during the implantation.

In this step, no impurity is implanted into an upper portion of the pillar-shaped silicon layer 113 due to the presence of the silicon nitride film 130 formed on the pillar-shaped silicon layer 113. Preferably, the implantation for the $N^+$ source diffusion layer 200 is performed at an angle of zero degree. Differently, an impurity implantation for a drain diffusion layer to be formed in an upper portion of the pillar-shaped silicon layer 113 in a subsequent step is preferably performed at a certain angle, because the drain diffusion layer is formed in a self-alignment manner using an after-mentioned dummy gate electrode. As above, the respective implantation for the source diffusion layer to be formed in the planar silicon layer and the drain diffusion layer to be formed in the upper portion of the pillar-shaped silicon layer are performed separately, so that conditions for the respective implantations can be easily optimized. This makes it possible to suppress short-channel effects so as to reduce a leak current.

Figure 17A:
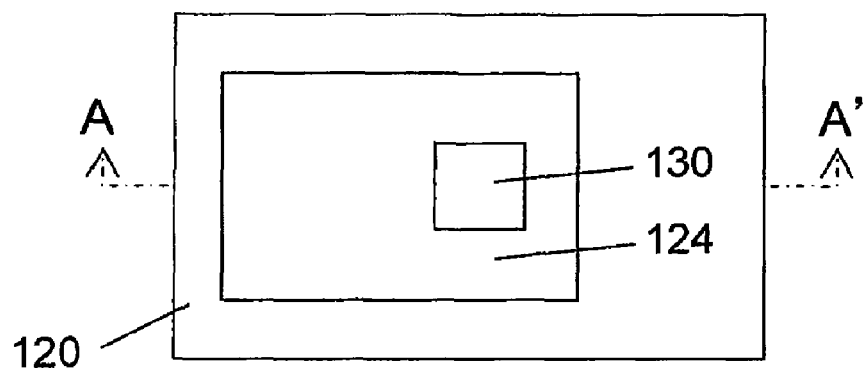
FIG. 17(a) is a top plan view showing one of the steps of the semiconductor production method according to the embodiment.
Figure 17B:
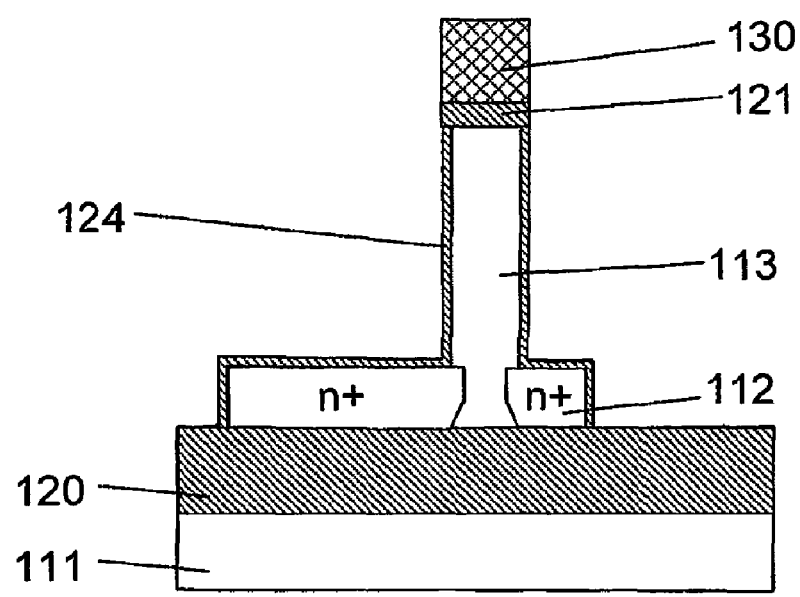
FIG. 17(b) is a sectional view showing the step of the semiconductor production method according to the embodiment, taken along the line A-A' in FIG. 17(a).

Referring to FIGS. 17(a) and 17(b), the sacrificial oxide film 123 is removed by wet etching using hydrofluoric acid or the like (Step 49 in FIG. 1), and a silicon oxide film or a silicon nitride film is formed as a dummy gate dielectric film 124. Before forming the dummy gate dielectric film, a pre-dummy gate formation cleaning operation may be performed. Further, after the formation, a thickness measurement operation for the dummy gate dielectric film may be performed (Steps 50, 51, 52 in FIG. 1).

Figure 18A:
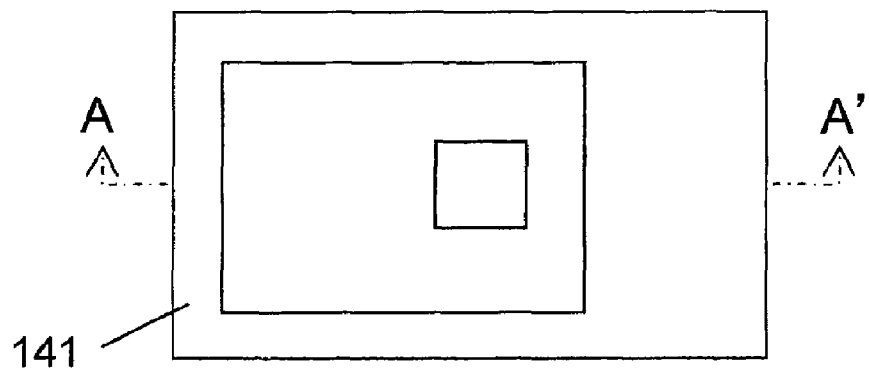
FIG. 18(a) is a top plan view showing one of the steps of the semiconductor production method according to the embodiment.
Figure 18B:
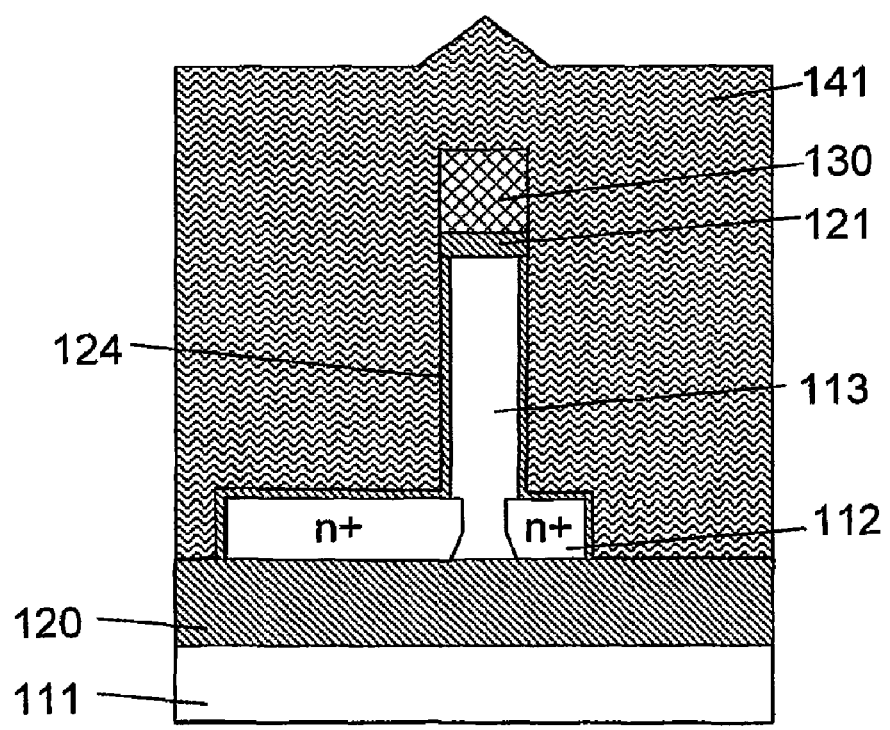
FIG. 18(b) is a sectional view showing the step of the semiconductor production method according to the embodiment, taken along the line A-A' in FIG. 18(a).

Referring to FIGS. 18(a) and 18(b), an amorphous silicon or polysilicon film 141 is formed as a dummy gate conductive film to allow the pillar-shaped silicon layer 113 to be buried therein. After the film formation, a thickness measurement operation for the amorphous silicon or polysilicon film may be performed (Steps 53, 54 in FIG. 1).

Figure 19A:
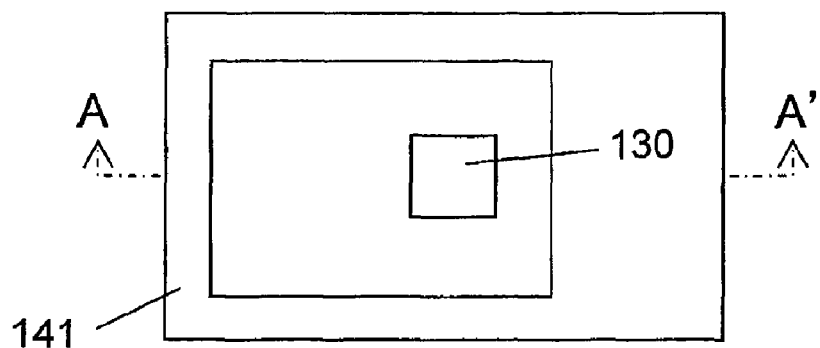
FIG. 19(a) is a top plan view showing one of the steps of the semiconductor production method according to the embodiment.
Figure 19B:
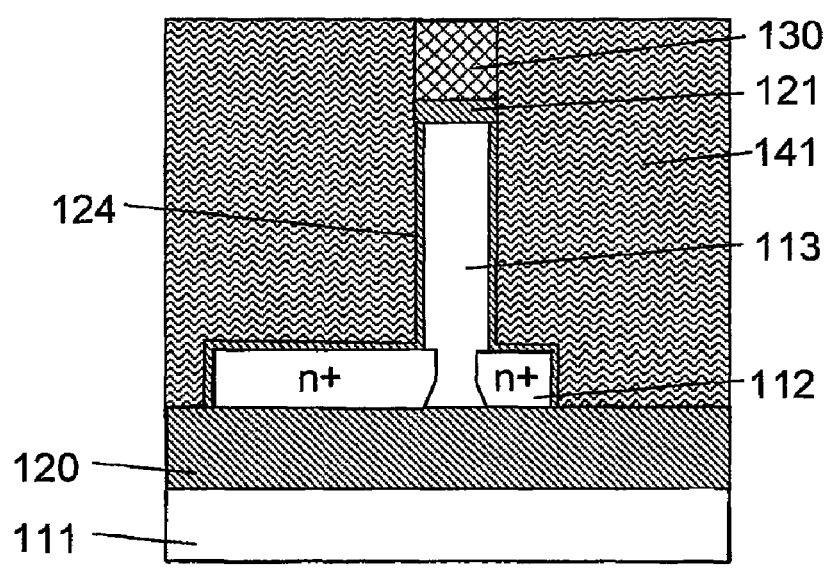
FIG. 19(b) is a sectional view showing the step of the semiconductor production method according to the embodiment, taken along the line A-A' in FIG. 19(a).

Referring to FIGS. 19(a) and 19(b), the amorphous silicon or polysilicon film 141 is polished by chemical mechanical polishing (CMP) to flatten an upper surface of the dummy gate conductive film. The silicon nitride film (first hard mask) 130 is used as a CMP stopper during the CMP, which makes it possible to control an amount of CMP with high repeatability (Step 55 in FIG. 1).

Figure 20A:
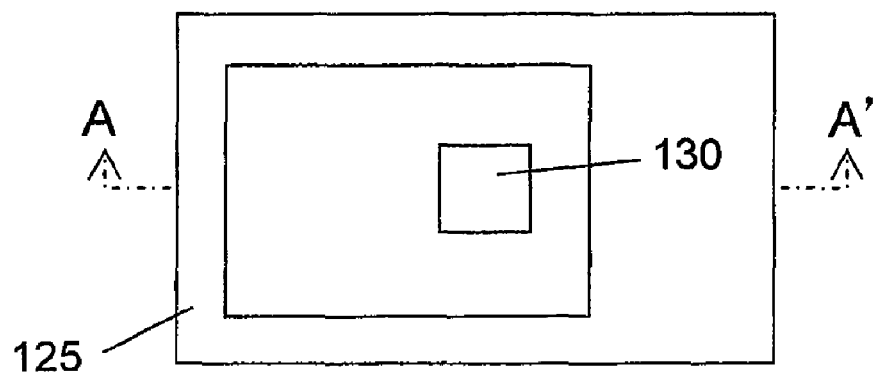
FIG. 20(a) is a top plan view showing one of the steps of the semiconductor production method according to the embodiment.
Figure 20B:
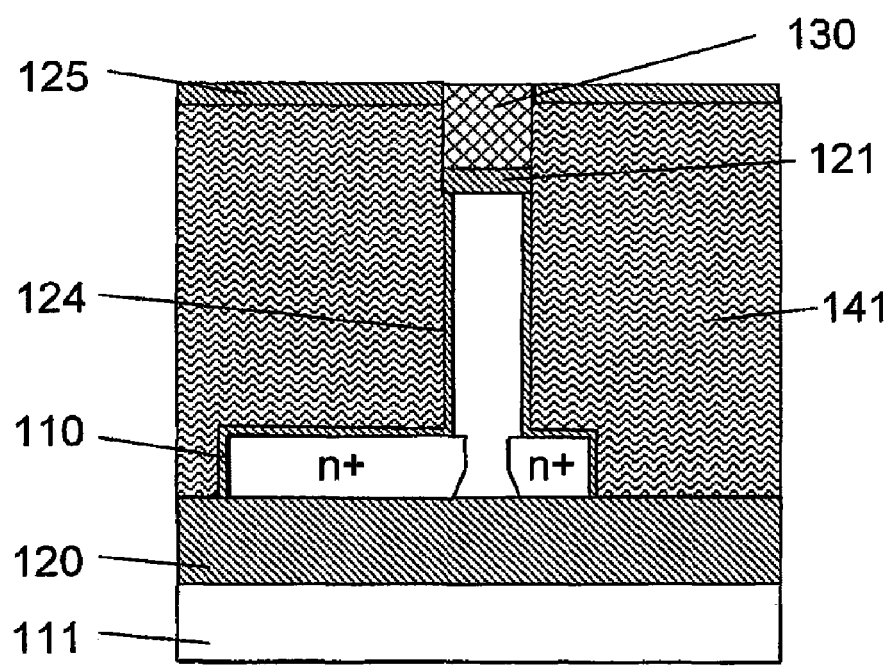
FIG. 20(b) is a sectional view showing the step of the semiconductor production method according to the embodiment, taken along the line A-A' in FIG. 20(a).

Referring to FIGS. 20(a) and 20(b), an upper surface of the flattened amorphous silicon or polysilicon film 141 serving as the dummy gate conductive film is oxidized to form a silicon oxide film 125 on an upper surface of the flattened amorphous silicon or polysilicon film 141. The silicon oxide film 125 can prevent the dummy gate conductive film from being silicided during silicidation to be performed in a subsequent step. This makes it possible to facilitate removal of the dummy gate conductive film in a subsequent step. Before the forming the silicon oxide film, a pre-oxidation cleaning operation may be performed (Steps 56, 57 in FIG. 1).

Figure 21A:
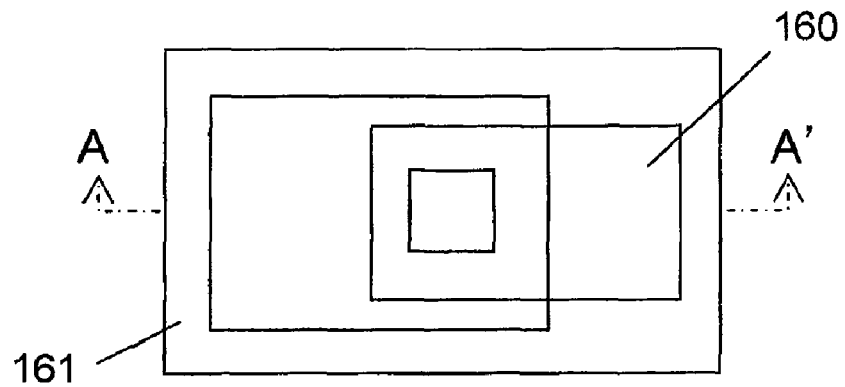
FIG. 21(a) is a top plan view showing one of the steps of the semiconductor production method according to the embodiment.
Figure 21B:
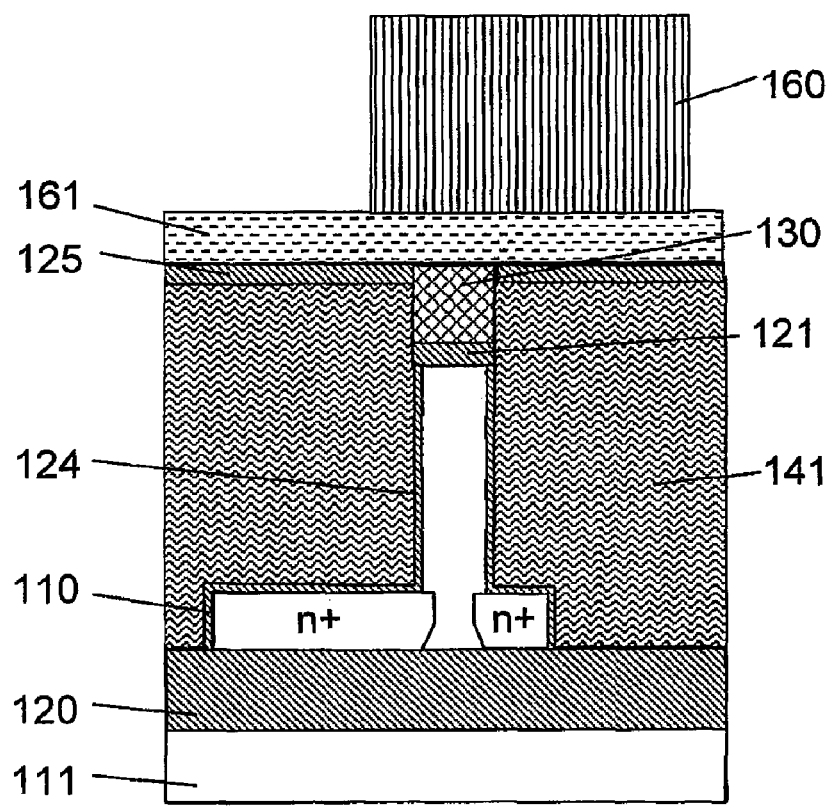
FIG. 21(b) is a sectional view showing the step of the semiconductor production method according to the embodiment, taken along the line A-A' in FIG. 21(a).

Referring to FIGS. 21(a) and 21(b), a bottom antireflective coating (BARC) layer 161 and a resist 160 are applied, and a pattern for a dummy gate line is formed using the resist 160 by lithography. After forming the pattern, an overlay-error measurement operation, a dimension measurement operation and a verification operation may be performed (Steps 58, 59, 60, 61, 62 in FIG. 1).

Figure 22A:
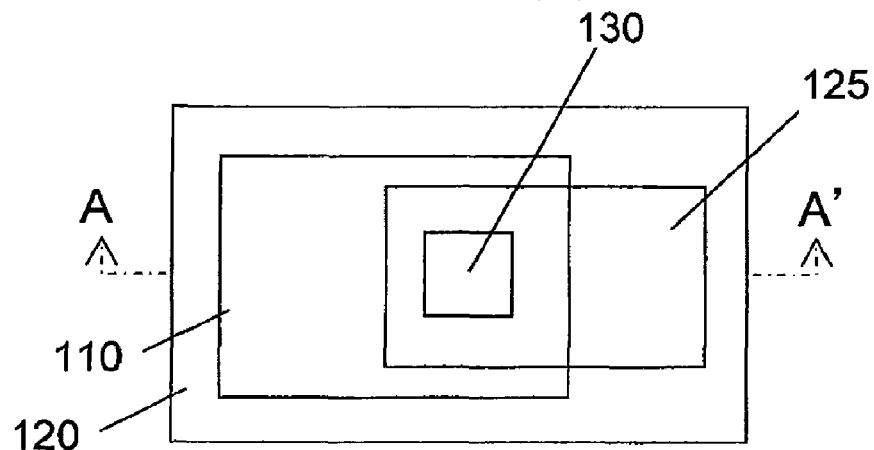
FIG. 22(a) is a top plan view showing one of the steps of the semiconductor production method according to the embodiment.
Figure 22B:
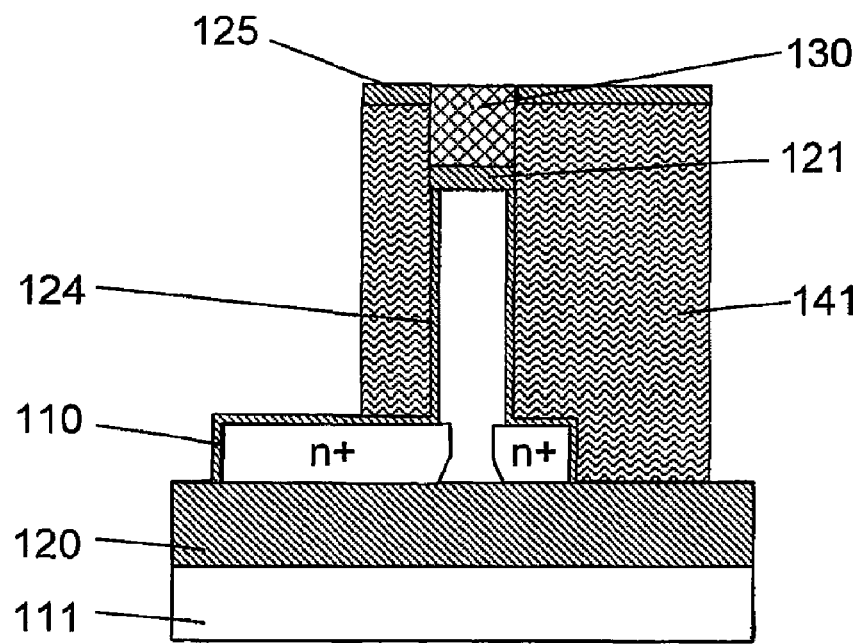
FIG. 22(b) is a sectional view showing the step of the semiconductor production method according to the embodiment, taken along the line A-A' in FIG. 22(a).

Referring to FIGS. 22(a) and 22(b), the BARC layer 161, the silicon oxide film 125 and the amorphous silicon or polysilicon film 141 serving as the dummy gate conductive film are etched using the resist 160 as a mask to form a dummy gate electrode 141 and a dummy gate line, and then the resist and the remaining BARC layer are removed. After the etching, a configuration measurement operation may be performed (Steps 63, 64, 65, 66, 67 in FIG. 1).

Figure 23A:
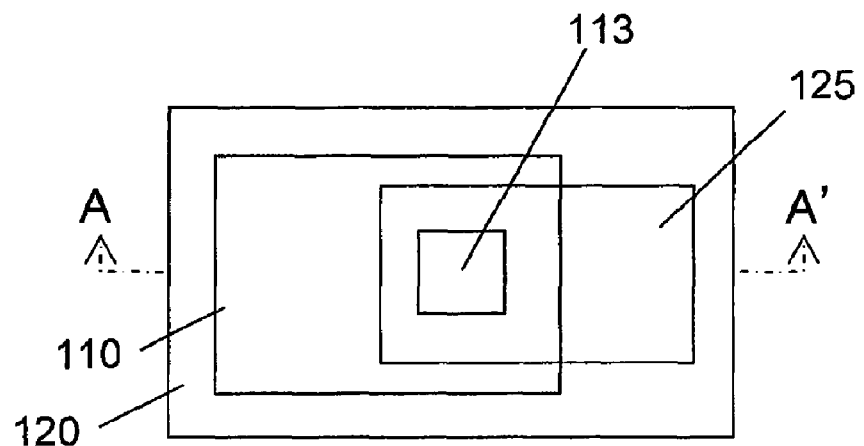
FIG. 23(a) is a top plan view showing one of the steps of the semiconductor production method according to the embodiment.
Figure 23B:
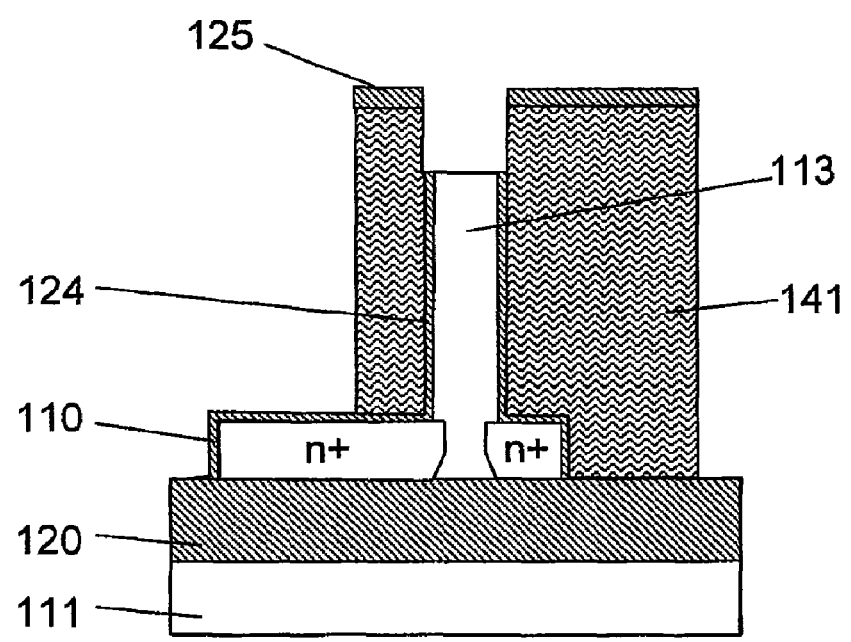
FIG. 23(b) is a sectional view showing the step of the semiconductor production method according to the embodiment, taken along the line A-A' in FIG. 23(a).

Referring to FIGS. 23(a) and 23(b), the silicon nitride film 130 and the pad oxide film 121 on a top of the pillar-shaped silicon layer 113 are removed by dry etching or wet etching (Step 68 in FIG. 1).

Figure 24A:
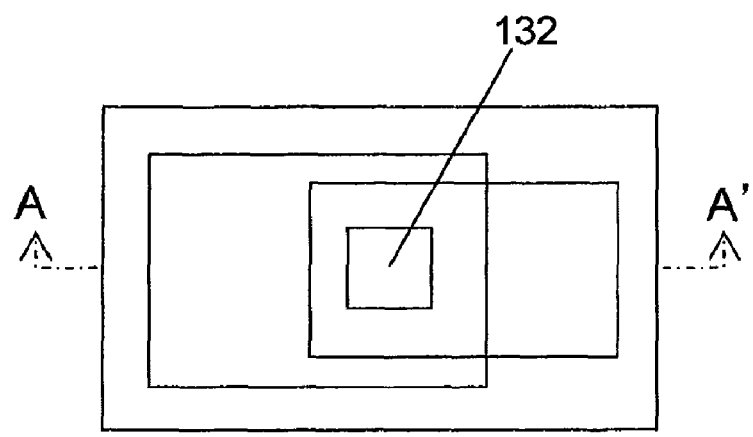
FIG. 24(a) is a top plan view showing one of the steps of the semiconductor production method according to the embodiment.
Figure 24B:
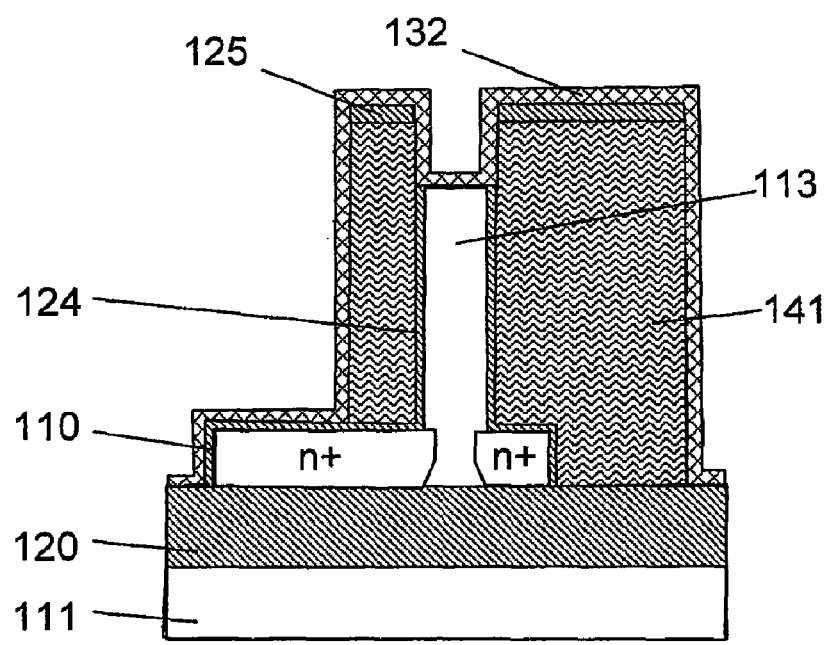
FIG. 24(b) is a sectional view showing the step of the semiconductor production method according to the embodiment, taken along the line A-A' in FIG. 24(a).

Referring to FIGS. 24(a) and 24(b), a silicon nitride film 132 is formed. After the film formation, a thickness measurement operation for the silicon nitride film may be performed (Steps 69, 70 in FIG. 1).

Figure 25A:
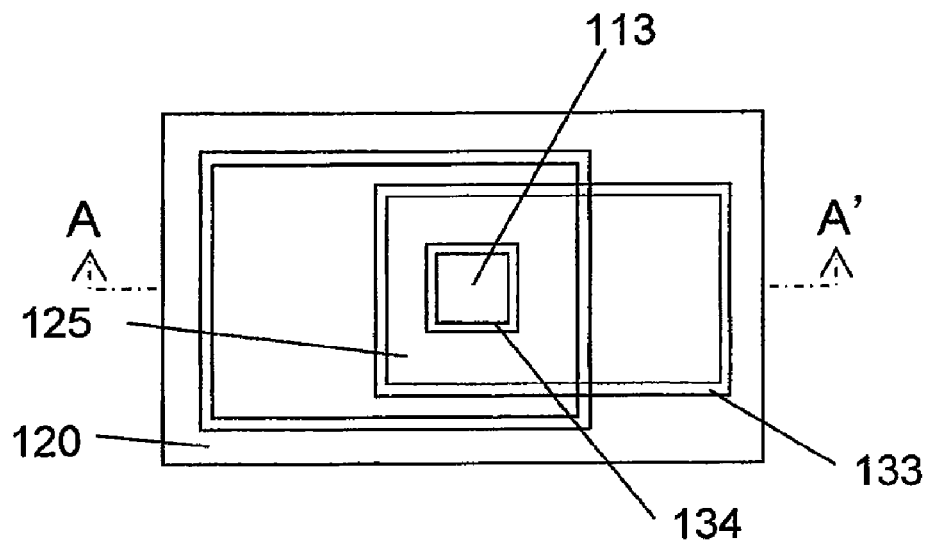
FIG. 25(a) is a top plan view showing one of the steps of the semiconductor production method according to the embodiment.
Figure 25B:
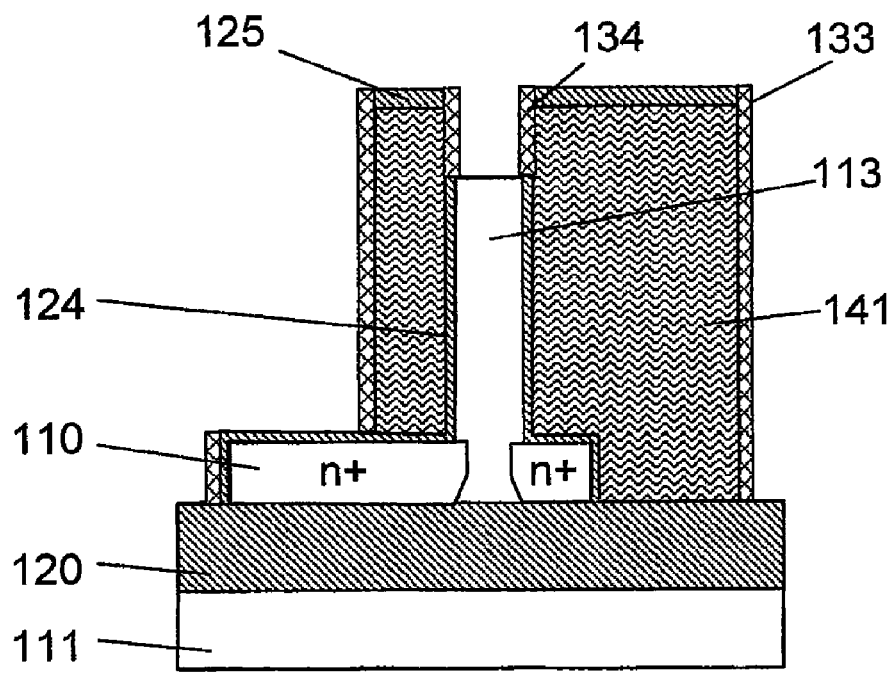
FIG. 25(b) is a sectional view showing the step of the semiconductor production method according to the embodiment, taken along the line A-A' in FIG. 25(a).

Referring to FIGS. 25(a) and 25(b), the silicon nitride film 132 is etched back to expose an upper surface of the $N^+$ source diffusion layer 200 and a top surface of the pillar-shaped silicon layer 113, and form two nitride film-based sidewalls covering respective sidewalls of the dummy gate electrode and dummy gate line 141. After the etching, an organic-substance removal operation and a configuration measurement operation may be performed (Steps 71, 72, 73 in FIG. 1). The nitride film-based sidewalls 133, 134 can isolate between the dummy gate electrode 141 and each of the source diffusion layer 200 and an $N^+$ drain diffusion layer to be subsequently formed in an upper portion of the pillar-shaped silicon layer. This makes it possible to prevent short-circuiting between the gate electrode 141 and each of the source diffusion layer 200 and the drain diffusion layer, due to a silicide layer. In addition, the nitride film-based sidewall 134 covering the sidewall of the dummy gate electrode 141 located on an upper side of the pillar-shaped silicon layer 113 makes it possible to control silicidation from the side of the sidewall of the pillar-shaped silicon layer 113. Further, the nitride film-based sidewalls 133, 134 and the silicon oxide film 125 can prevent silicidation of the dummy gate electrode.

If a silicon oxide film is used as substitute for the silicon nitride film-based sidewalls 133, 134, it will be etched by hydrofluoric acid to be used in a cleaning/stripping operation and a pretreatment for silicidation. Thus, it is preferable to use a film insoluble in hydrofluoric acid, such as a silicon nitride film.

Figure 26A:
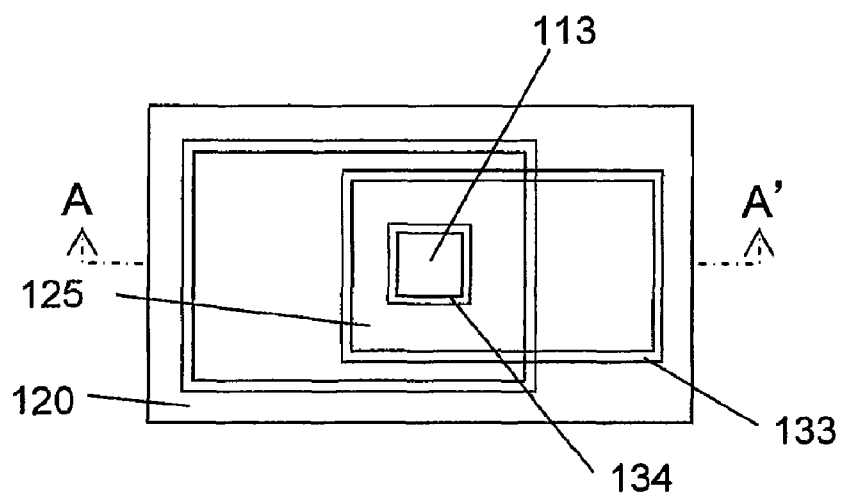
FIG. 26(a) is a top plan view showing one of the steps of the semiconductor production method according to the embodiment.
Figure 26B:
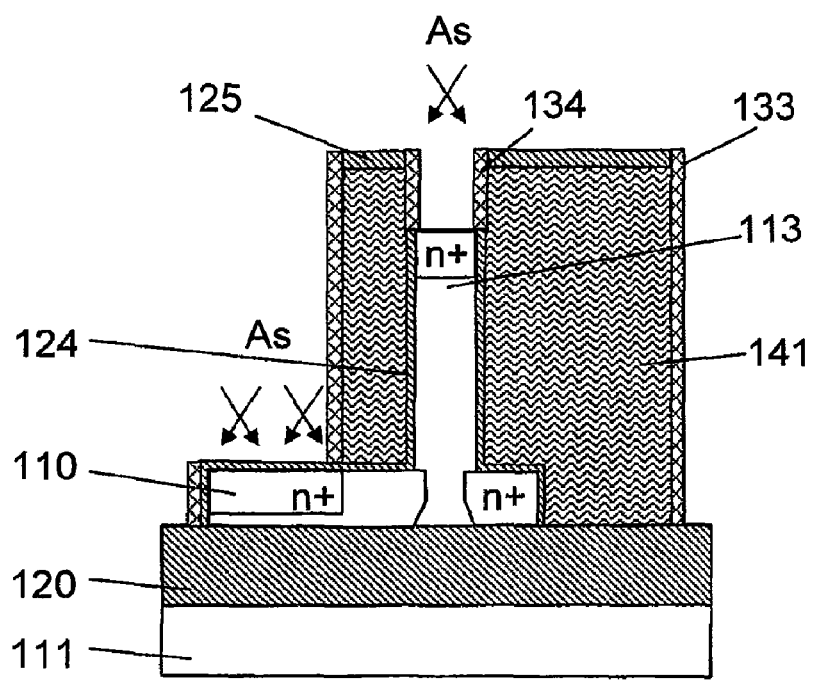
FIG. 26(b) is a sectional view showing the step of the semiconductor production method according to the embodiment, taken along the line A-A' in FIG. 26(a).

Referring to FIGS. 26(a) and 26(b), an impurity, such as P or As, is introduced into an upper portion of the pillar-shaped silicon layer 113 by impurity implantation or the like, to form an $N^+$ drain diffusion layer 201 therein. After the impurity introduction, an operation of activating the impurity may be performed (Steps 74, 75 in FIG. 1).

Figure 27A:
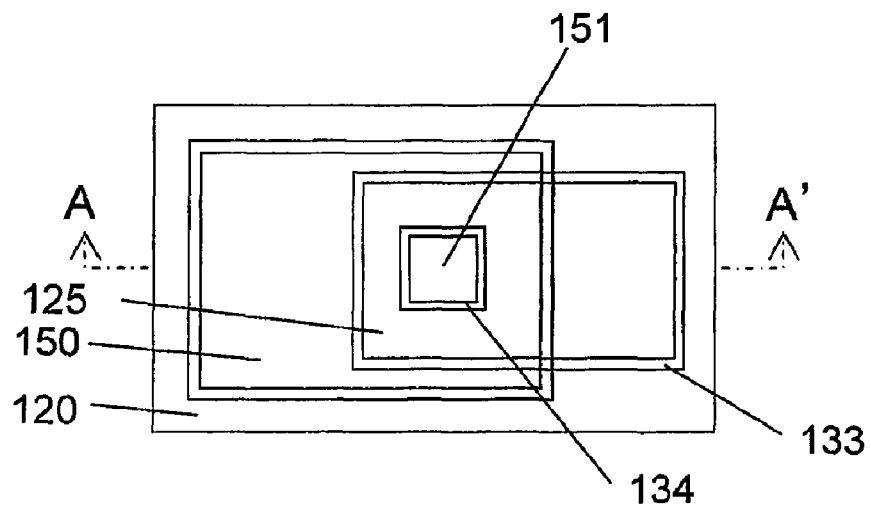
FIG. 27(a) is a top plan view showing one of the steps of the semiconductor production method according to the embodiment.
Figure 27B:
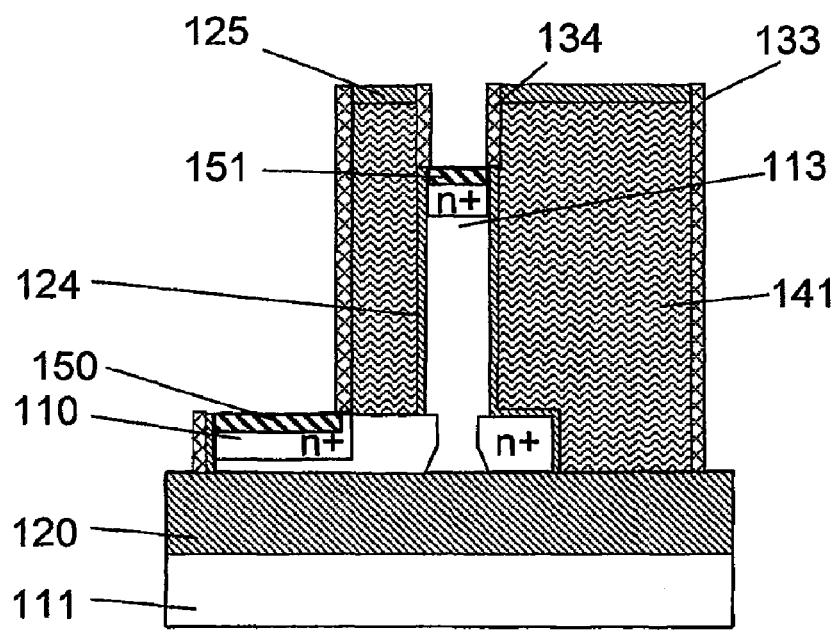
FIG. 27(b) is a sectional view showing the step of the semiconductor production method according to the embodiment, taken along the line A-A' in FIG. 27(a).

Referring to FIGS. 27(a) and 27(b), each of the upper surfaces of the source diffusion layer 200 and the drain diffusion layer 201 is silicided by undergoing sputtering of a metal, such as nickel (Ni) or cobalt (Co), and a heat treatment, and then an unreacted metal film is removed. In this manner, a silicide layer 151 and a silicide layer 150 are formed on the drain diffusion layer 201 and the source diffusion layer 200, respectively. Before forming the silicide layers, an oxide-film stripping operation may be performed (Steps 76, 77, 78, 79 in FIG. 1).

In order to prevent a silicide layer from being formed on the dummy gate electrode 141 surrounding the pillar-shaped silicon layer, it is necessary to cover the dummy gate electrode by the oxide film 125 and the nitride film-based sidewalls 133, 134. The reason is that the dummy gate electrode formed with no silicide layer can facilitate the removal thereof in a subsequent step.

Figure 28A:
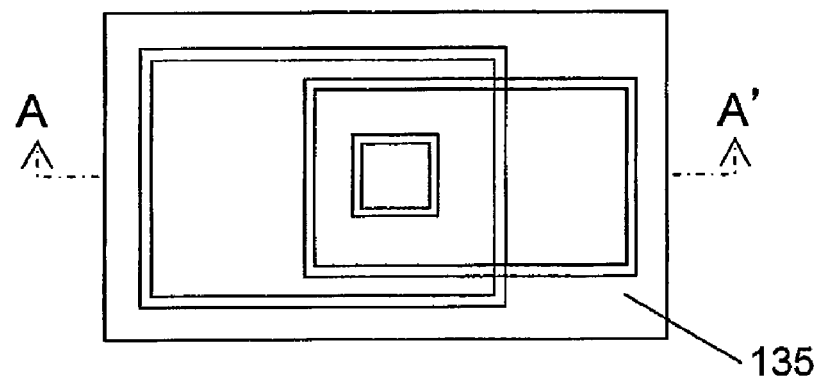
FIG. 28(a) is a top plan view showing one of the steps of the semiconductor production method according to the embodiment.
Figure 28B:
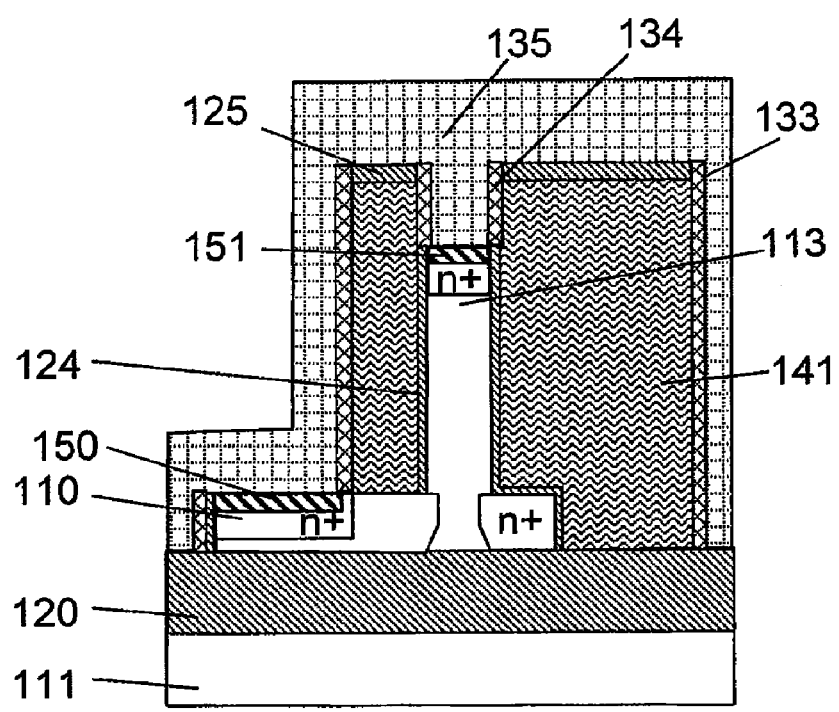
FIG. 28(b) is a sectional view showing the step of the semiconductor production method according to the embodiment, taken along the line A-A' in FIG. 28(a).

Referring to FIGS. 28(a) and 28(b), a film, such as a silicon nitride film 135, is formed. After the film formation, a thickness measurement operation for the silicon nitride film may be performed (Steps 80, 81 in FIG. 1).

Figure 29A:
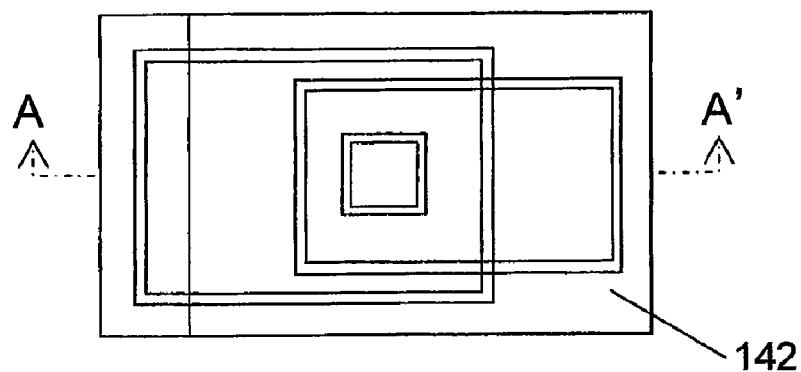
FIG. 29(a) is a top plan view showing one of the steps of the semiconductor production method according to the embodiment.
Figure 29B:
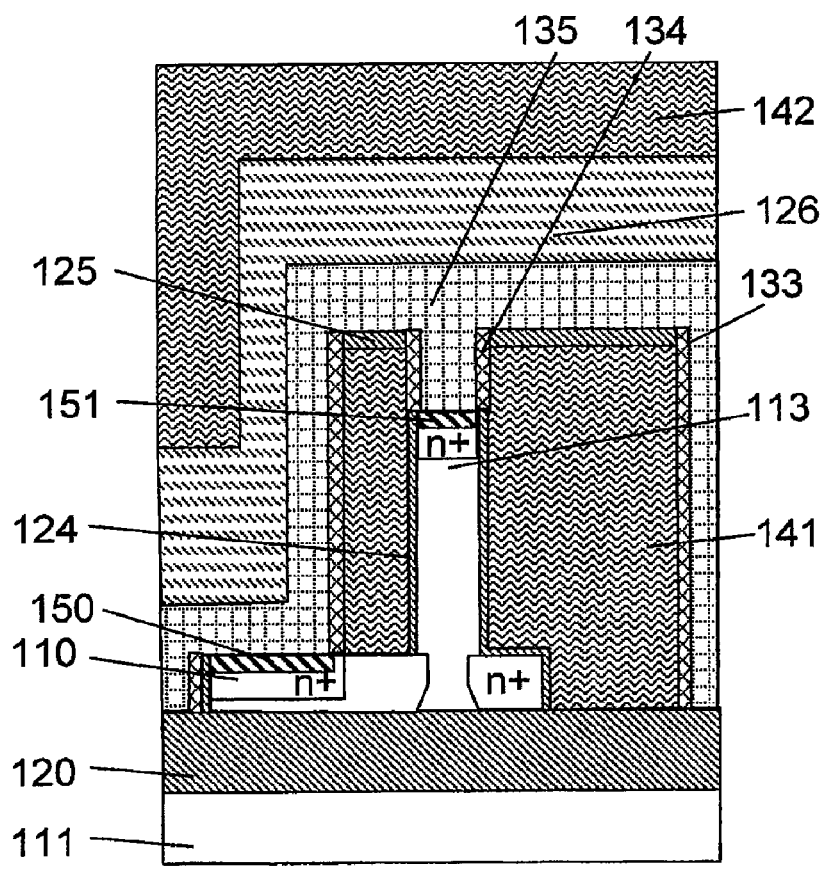
FIG. 29(b) is a sectional view showing the step of the semiconductor production method according to the embodiment, taken along the line A-A' in FIG. 29(a).

Referring to FIGS. 29(a) and 29(b), a silicon oxide film 126 and an amorphous silicon or polysilicon layer 142 are formed in this order. After the film formation, a thickness measurement operation for the silicon oxide film and the amorphous silicon or polysilicon layer may be performed (Steps 82, 83, 84, 85, 86 in FIG. 1).

Figure 30A:
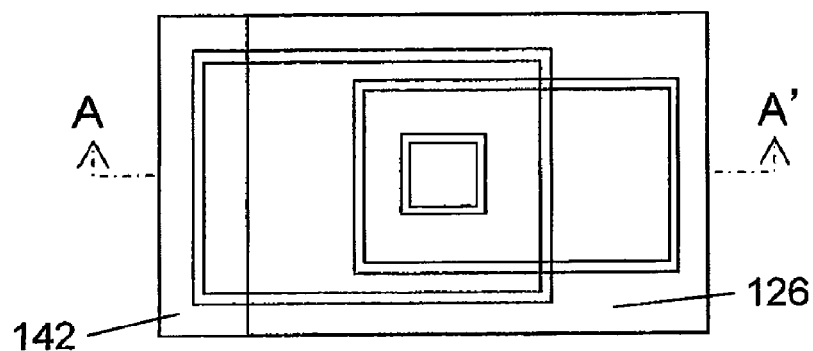
FIG. 30(a) is a top plan view showing one of the steps of the semiconductor production method according to the embodiment.
Figure 30B:
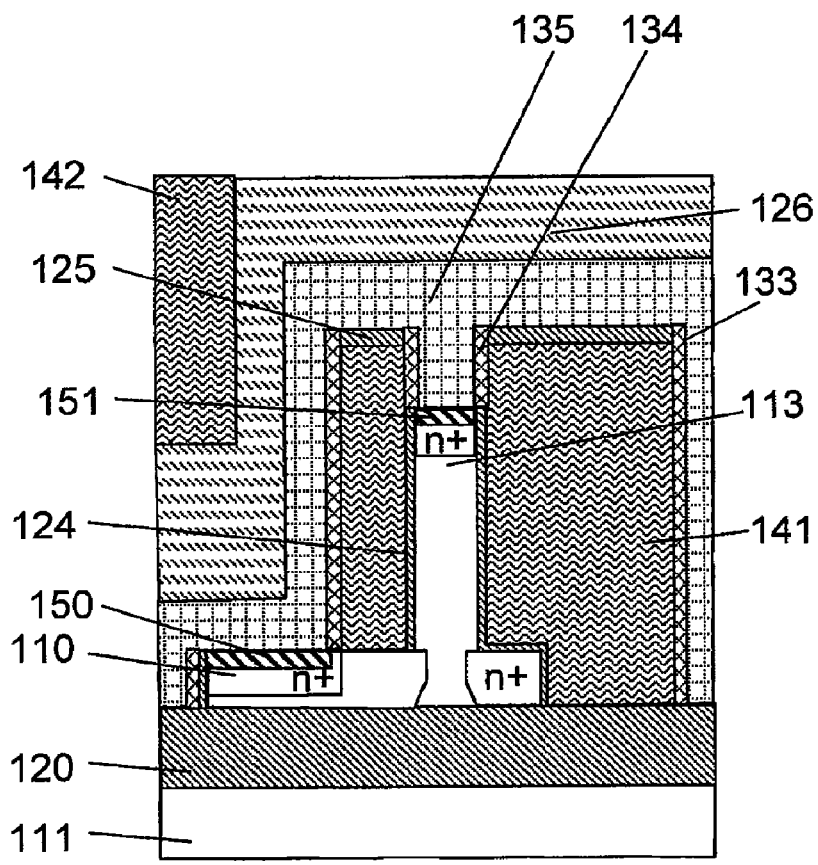
FIG. 30(b) is a sectional view showing the step of the semiconductor production method according to the embodiment, taken along the line A-A' in FIG. 30(a).

Referring to FIGS. 30(a) and 30(b), an upper surface of the amorphous silicon or polysilicon layer is flattened by CMP. In this step, the silicon oxide film 126 can be used as a CMP stopper to control an amount of CMP with high repeatability (Step 87 in FIG. 1).

Figure 31A:
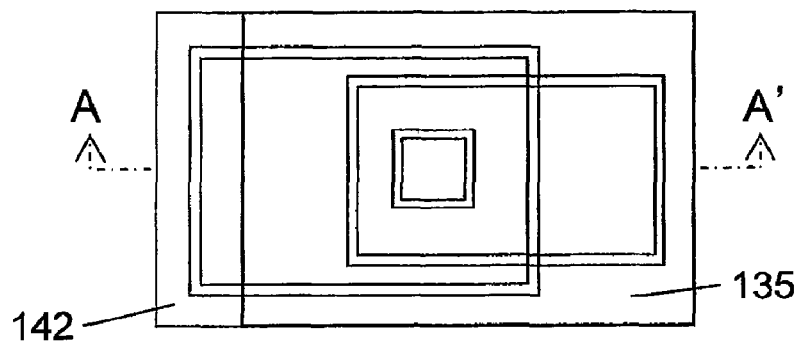
FIG. 31(a) is a top plan view showing one of the steps of the semiconductor production method according to the embodiment.
Figure 31B:
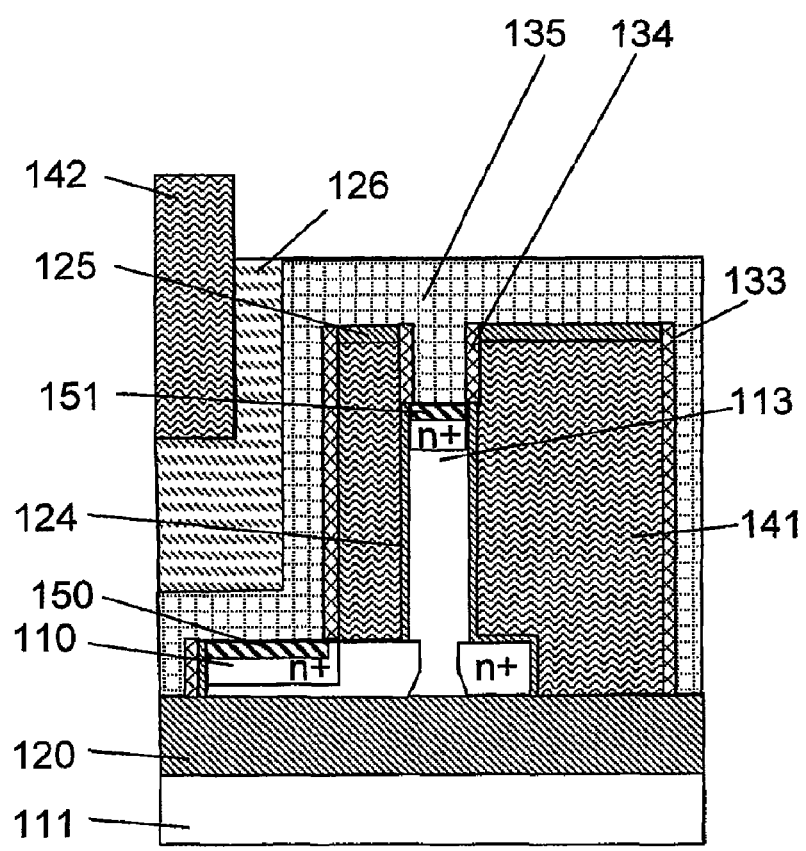
FIG. 31(b) is a sectional view showing the step of the semiconductor production method according to the embodiment, taken along the line A-A' in FIG. 31(a).

Referring to FIGS. 31(a) and 31(b), the silicon oxide film 126 is dry-etched. In this step, an end-point of the dry etching can be detected based on the silicon nitride film 135 to be exposed when a portion of the silicon oxide film 126 on an upper surface of the silicon nitride film 135 is fully etched away, to control an amount of etching of the silicon oxide film with high repeatability (Step 88 in FIG. 1).

Figure 32A:
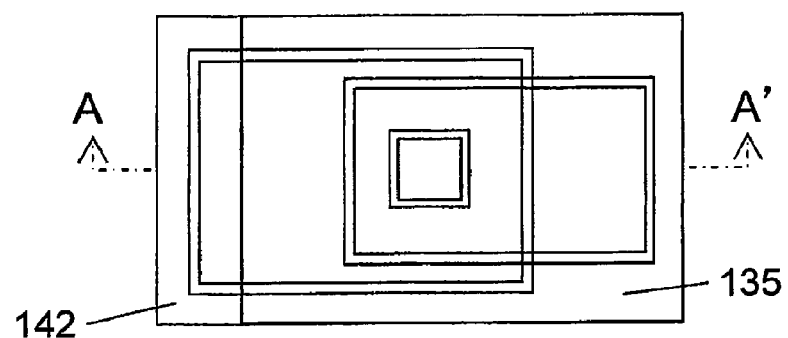
FIG. 32(a) is a top plan view showing one of the steps of the semiconductor production method according to the embodiment.
Figure 32B:
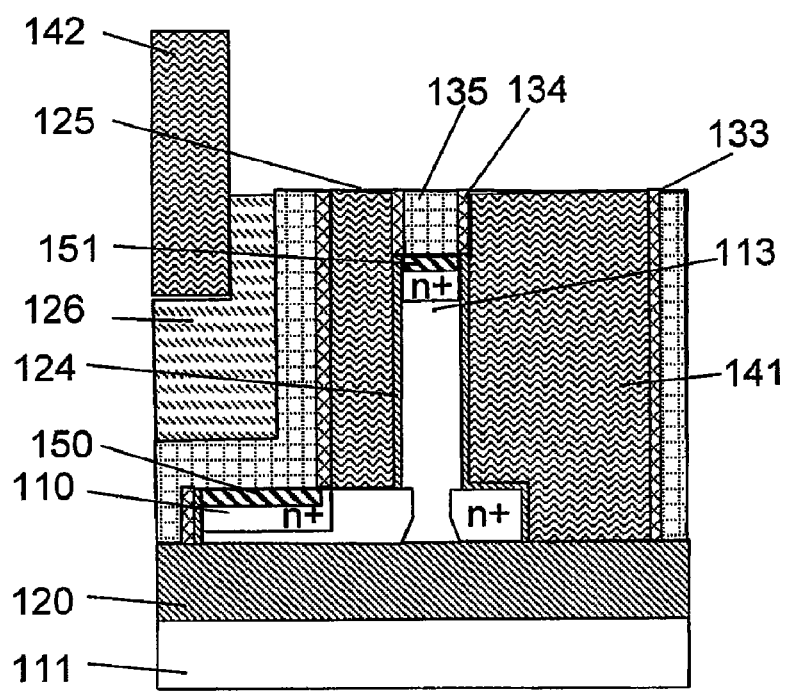
FIG. 32(b) is a sectional view showing the step of the semiconductor production method according to the embodiment, taken along the line A-A' in FIG. 32(a).

Referring to FIGS. 32(a) and 32(b), the silicon nitride film 135 is dry-etched. In this step, an end-point of the dry etching can be detected based on the dummy gate electrode 141 to be exposed when a portion of the silicon nitride film 135 on an upper surface of the dummy gate electrode 141 is fully etched away, to control an amount of etching of the silicon nitride film with high repeatability. After the dry etching, an organic-substance removal operation may be performed (Steps 89, 90 in FIG. 1).

Figure 33A:
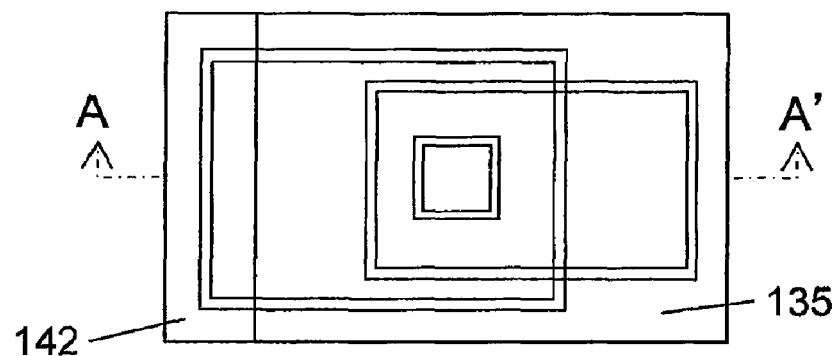
FIG. 33(a) is a top plan view showing one of the steps of the semiconductor production method according to the embodiment.
Figure 33B:
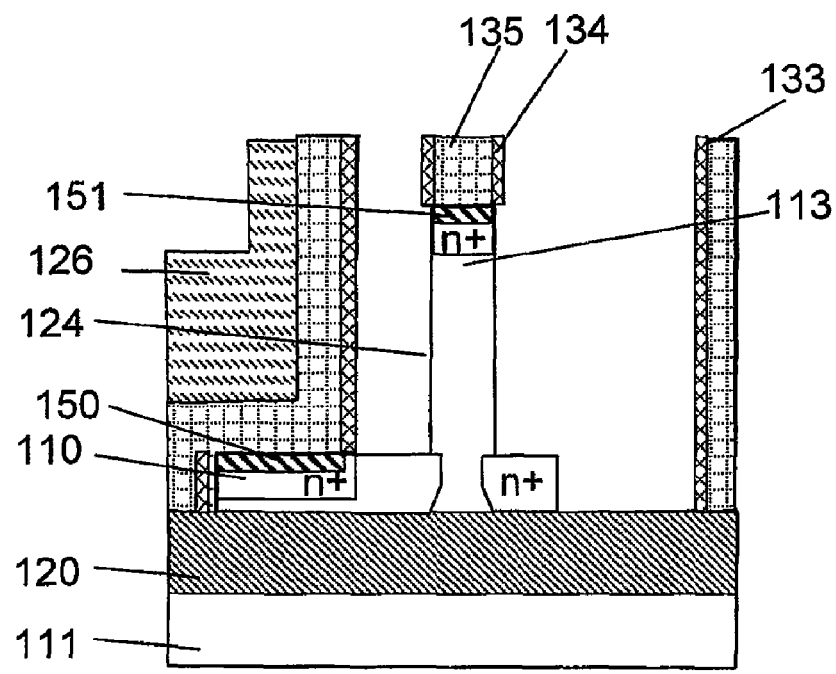
FIG. 33(b) is a sectional view showing the step of the semiconductor production method according to the embodiment, taken along the line A-A' in FIG. 33(a).

Referring to FIGS. 33(a) and 33(b), the dummy gate electrode 141 and the amorphous silicon or polysilicon layer 142 are removed by dry etching. Further, the silicon oxide film (dummy gate dielectric film?) 124 is also removed by dry etching (Steps 91, 92 in FIG. 1).

Figure 34A:
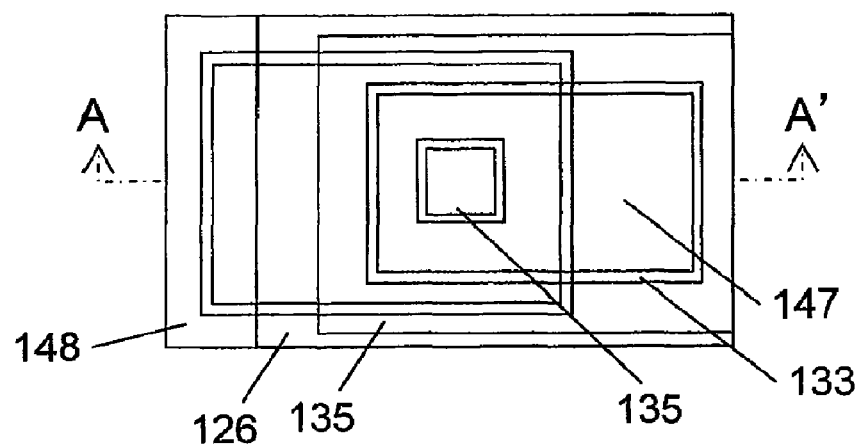
FIG. 34(a) is a top plan view showing one of the steps of the semiconductor production method according to the embodiment.
Figure 34B:
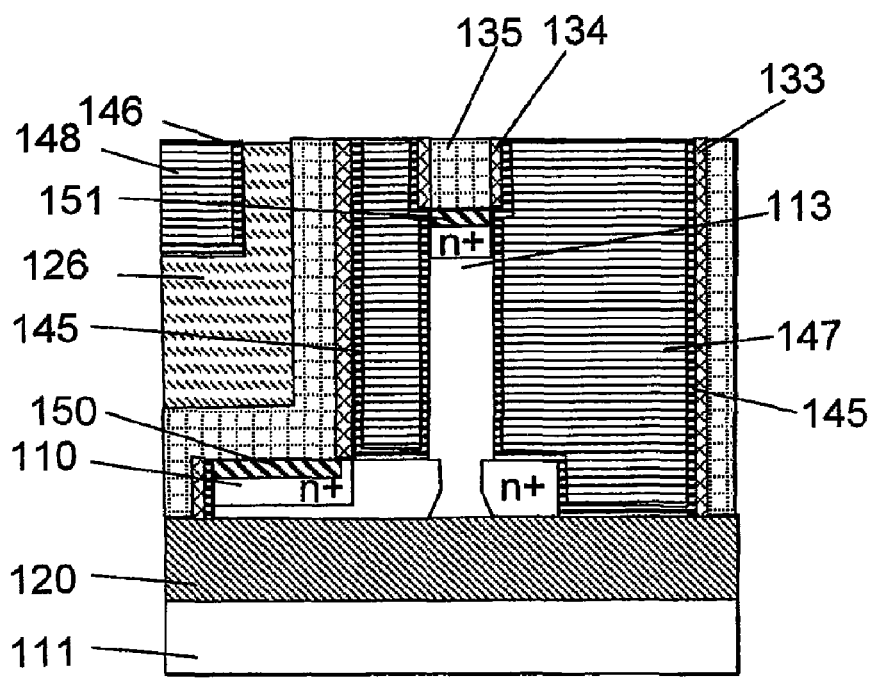
FIG. 34(b) is a sectional view showing the step of the semiconductor production method according to the embodiment, taken along the line A-A' in FIG. 34(a).

Referring to FIGS. 34(a) and 34(b), a high-k gate oxide or dielectric film 145 is formed. Further, a metal gate layer 147 is formed and then flattened by CMP. Before forming the gate dielectric film, a cleaning operation may be performed. Further, after the film formation, a heat treatment operation may be performed. During the flattening by CMP, the silicon nitride film 135 can be used as a CMP stopper to control an amount of CMP with high repeatability (Steps 93, 94, 95, 96, 97 in FIG. 1).

Figure 35A:
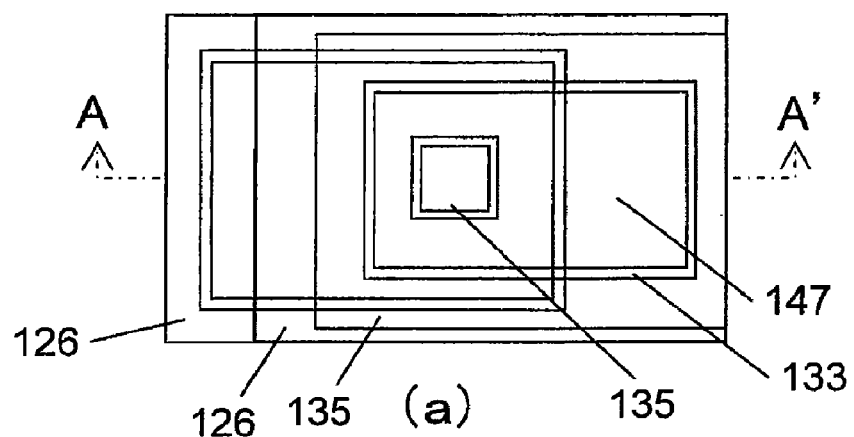
FIG. 35(a) is a top plan view showing one of the steps of the semiconductor production method according to the embodiment.
Figure 35B:
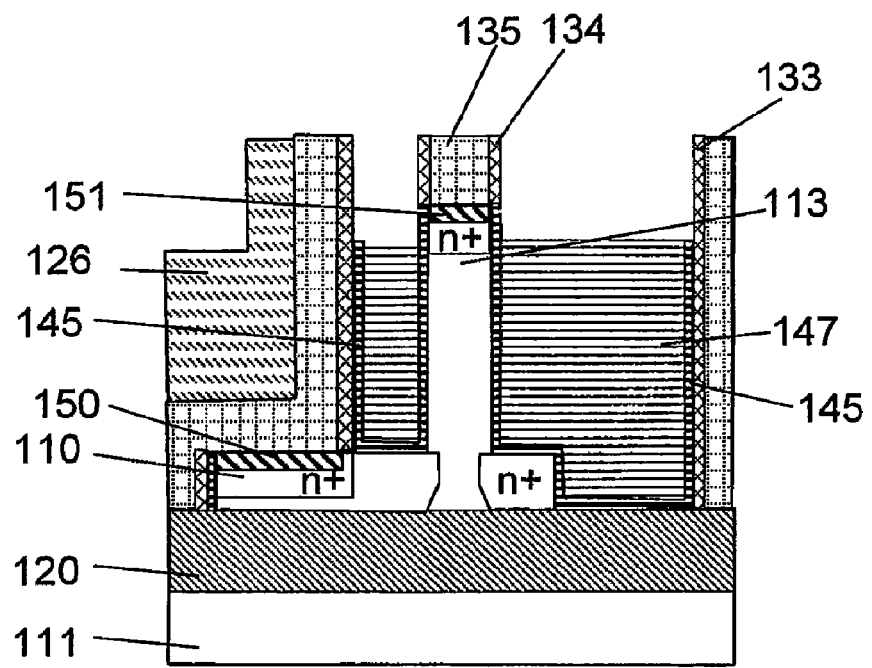
FIG. 35(b) is a sectional view showing the step of the semiconductor production method according to the embodiment, taken along the line A-A' in FIG. 35(a).

Referring to FIGS. 35(a) and 35(b), the metal gate layer 147 is dry-etched. In this step, an end-point of the dry etching can be detected based on the silicon oxide film 126 to be exposed when a portion of the metal gate layer 147 on a reference surface of the silicon oxide film 126 is fully etched away, to control an amount of etching of the metal gate layer with high repeatability. This makes it possible to control a desired gate length of a metal gate electrode to be formed, with high repeatability and with less vitiation (Step 98 in FIG. 1).

Figure 36A:
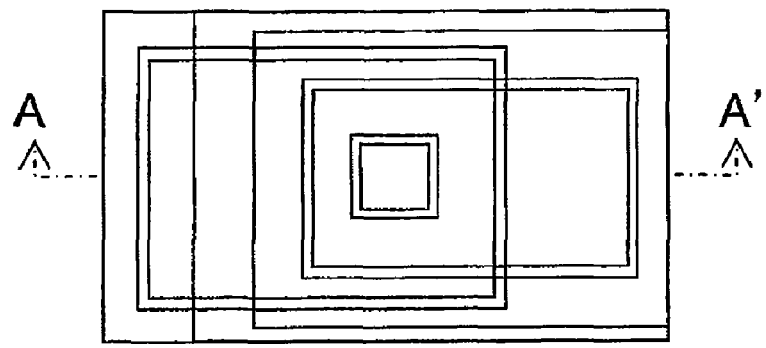
FIG. 36(a) is a top plan view showing one of the steps of the semiconductor production method according to the embodiment.
Figure 36B:
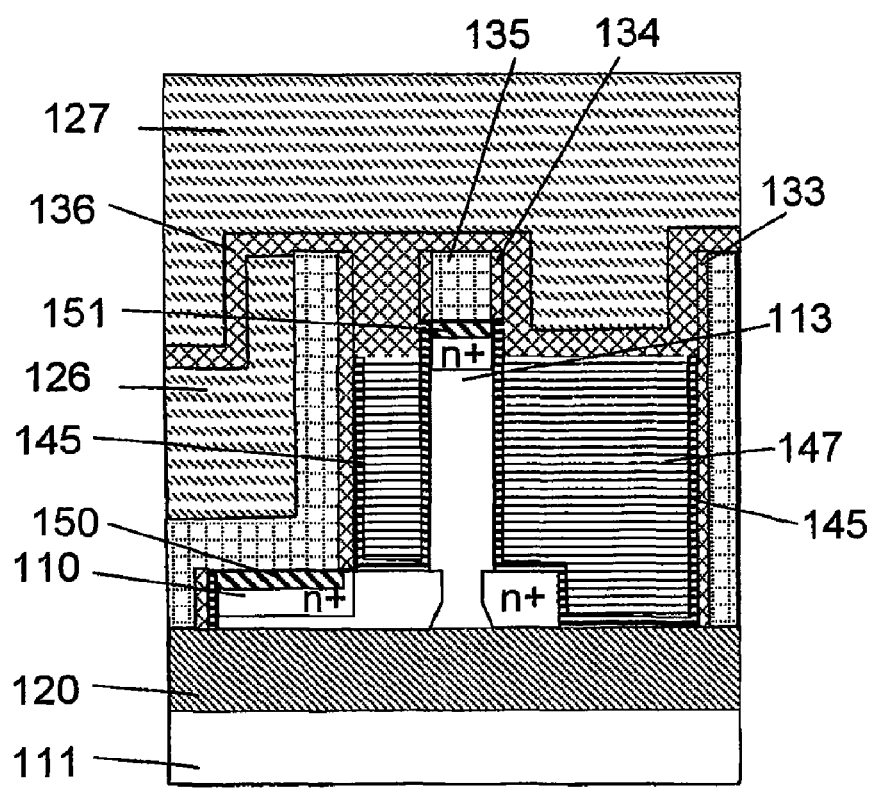
FIG. 36(b) is a sectional view showing the step of the semiconductor production method according to the embodiment, taken along the line A-A' in FIG. 36(a).

Referring to FIGS. 36(a) and 36(b), a silicon nitride film 136 is formed to serve as a contact stopper. Further, a silicon oxide film 127 is formed to serve as an interlayer film and then flattened by CMP. After the CMP, a thickness measurement operation for the silicon nitride film 135 and the silicon oxide film 127 may be performed (Steps 99, 100, 101, 102, 103, 104 in FIG. 1).

Figure 37A:
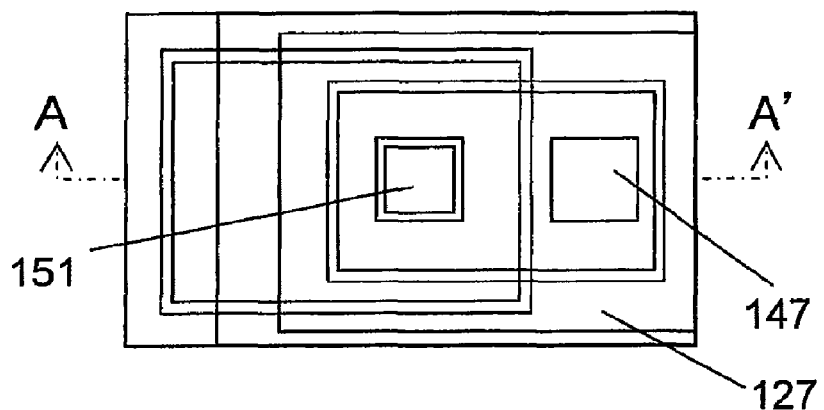
FIG. 37(a) is a top plan view showing one of the steps of the semiconductor production method according to the embodiment.
Figure 37B:
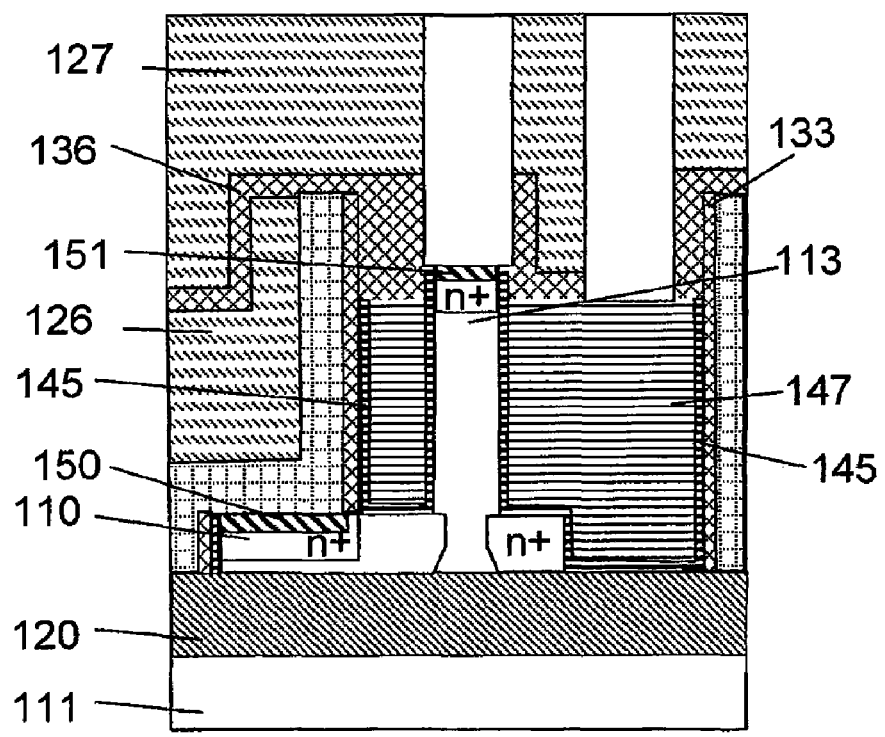
FIG. 37(b) is a sectional view showing the step of the semiconductor production method according to the embodiment, taken along the line A-A' in FIG. 37(a).

Referring to FIGS. 37(a) and 37(b), two contact holes are formed, respectively, on the metal gate layer 147, and the silicide layer 151 on a top of the pillar-shaped silicon layer 113, by etching. Before the etching for the contact holes, a lithographic exposure operation for a contact mask is performed. Then, a dimension measurement operation, an overlay-error measurement operation and a verification operation may be further performed. Further, after forming the contact holes, a plasma-based resist stripping operation is performed. After the plasma peeling, a post-contact-etching cleaning operation, a dimension measurement operation, a thickness measurement operation for the oxide film, a verification operation, and a wafer container replacement operation, may be performed (Steps 105, 106, 107, 108, 109, 110, 111, 112, 113, 114, 115, 116 in FIG. 1).

Figure 38A:
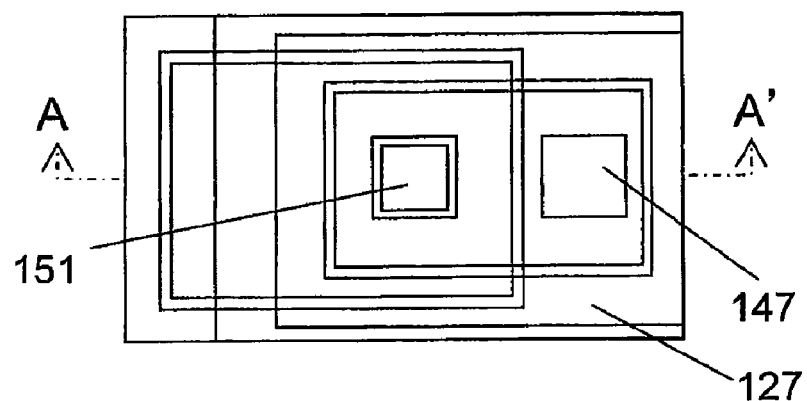
FIG. 38(a) is a top plan view showing one of the steps of the semiconductor production method according to the embodiment.
Figure 38B:
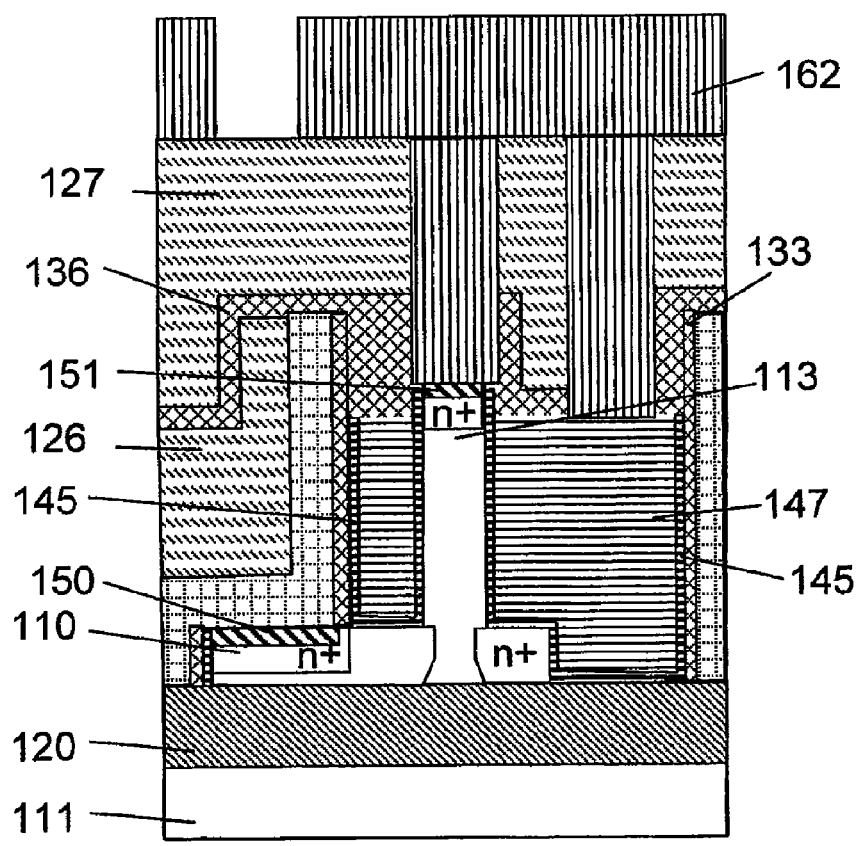
FIG. 38(b) is a sectional view showing the step of the semiconductor production method according to the embodiment, taken along the line A-A' in FIG. 38(a).

Referring to FIGS. 38(a) and 38(b), in order to form a contact hole on the silicide layer 150 on the planar silicon layer 112 by etching, a resist 162 is applied, and a pattern of the source diffusion layer is formed using the resist by lithography. After the lithography, a dimension measurement operation, an overlay-error measurement operation and a verification operation may be performed (Steps 117, 118, 119, 120, 121 in FIG. 1).

Figure 39A:
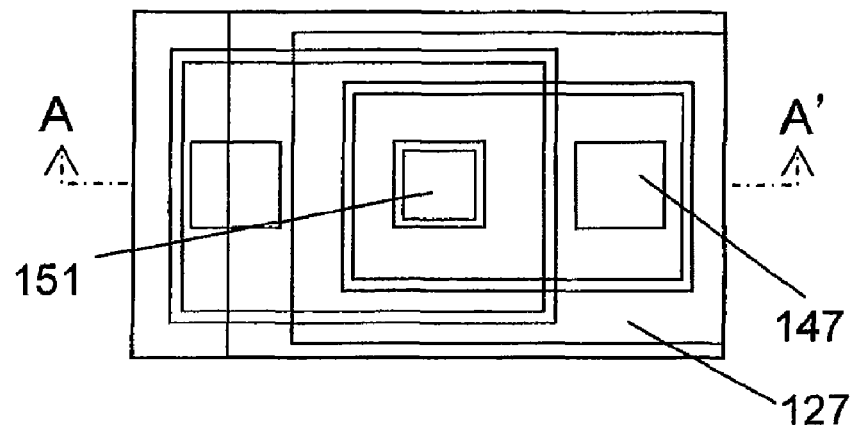
FIG. 39(a) is a top plan view showing one of the steps of the semiconductor production method according to the embodiment.
Figure 39B:
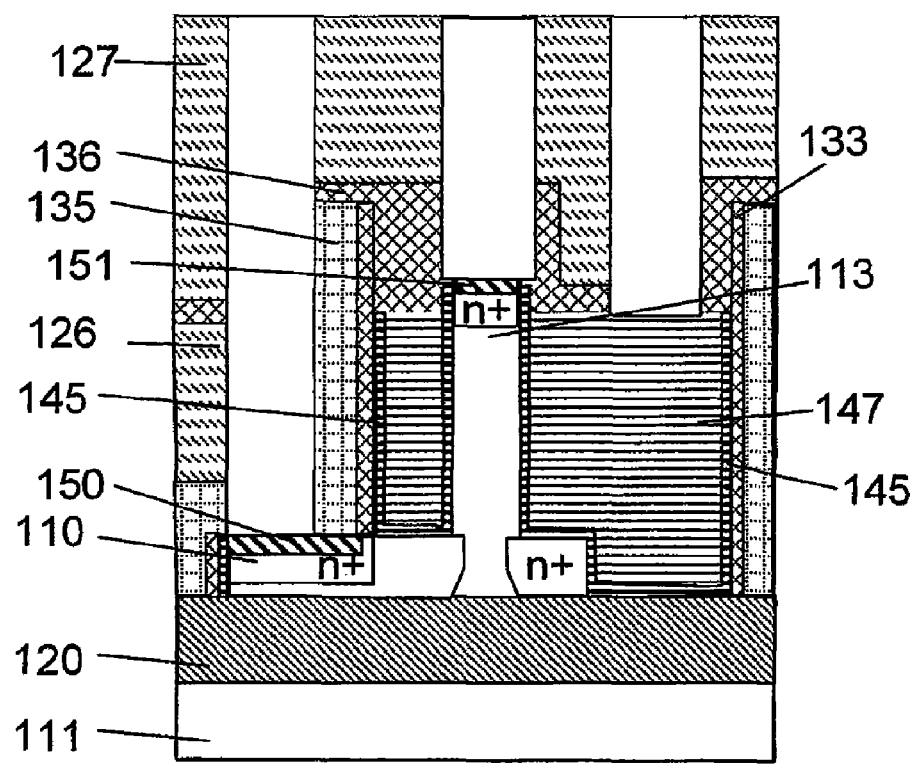
FIG. 39(b) is a sectional view showing the step of the semiconductor production method according to the embodiment, taken along the line A-A' in FIG. 39(a).

Referring to FIGS. 39(a) and 39(b), a contact hole is formed on the silicide layer 150 on the planar silicon layer 112, by etching. After forming the contact hole, a plasma-based resist stripping operation is performed. Then, a post-contact-etching cleaning operation, a dimension measurement operation, a thickness measurement operation for the oxide film, a verification operation, and a wafer container replacement operation, may be performed (Steps 122, 123, 124, 125, 126, 127, 128, 129 in FIG. 1).

Figure 45A:
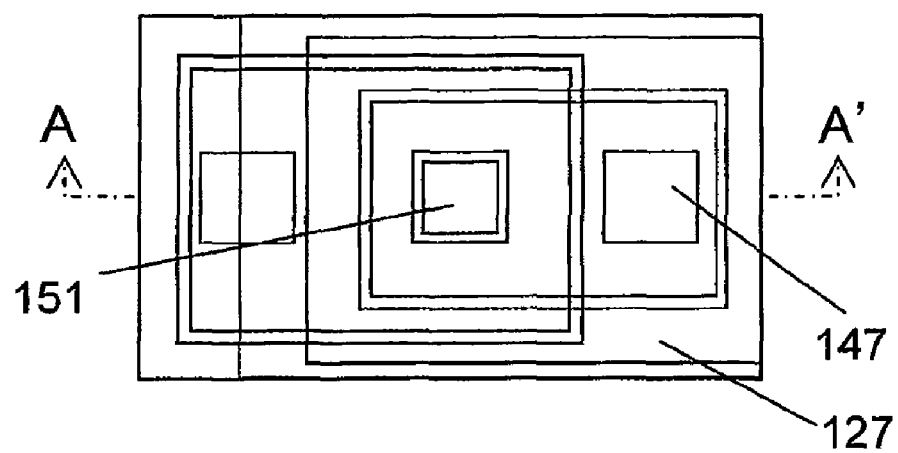
FIG. 45(a) is a top plan view showing a step in one modification of the semiconductor production method according to the embodiment.
Figure 45B:
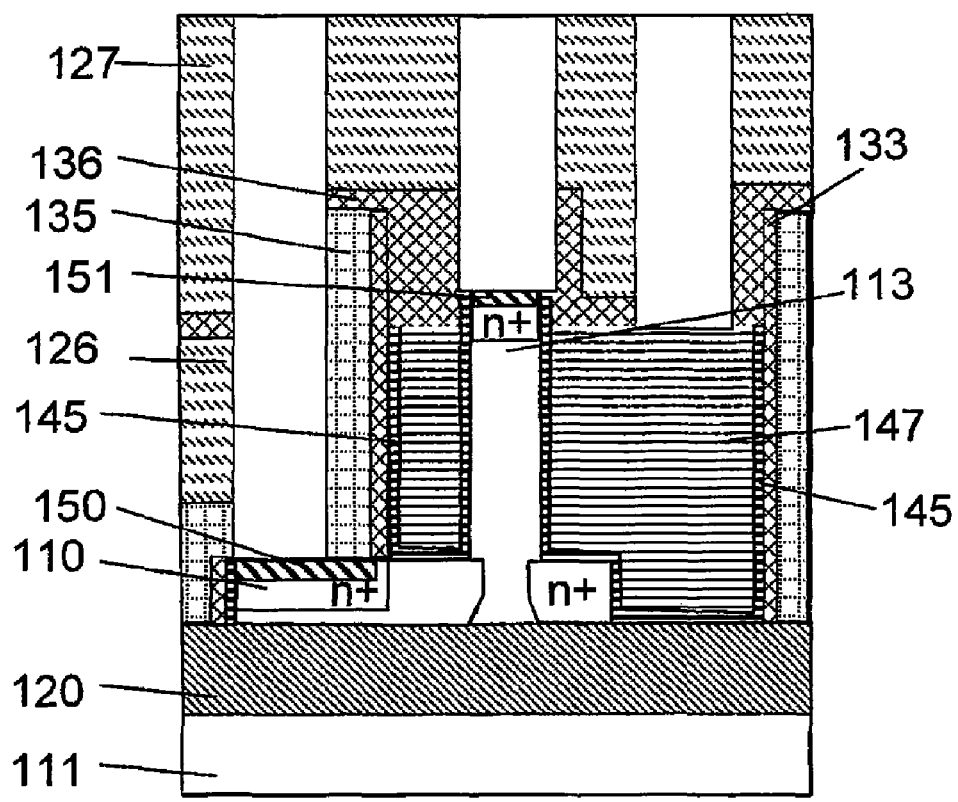
FIG. 45(b) is a sectional view showing the step in the modification of the semiconductor production method according to the embodiment, taken along the line A-A' in FIG. 45(a).

Alternatively, as shown in FIGS. 45(a) and 45(b), respective portions of the interlayer film for the contact hole on the top of the pillar-shaped silicon layer, the contact hole on the metal gate line, and the contact hole on the portion of the planar silicon layer underneath the pillar-shaped silicon layer may be simultaneously etched, and respective portions of the contact stopper corresponding to the three contact holes may also be simultaneously etched.

Figure 46A:
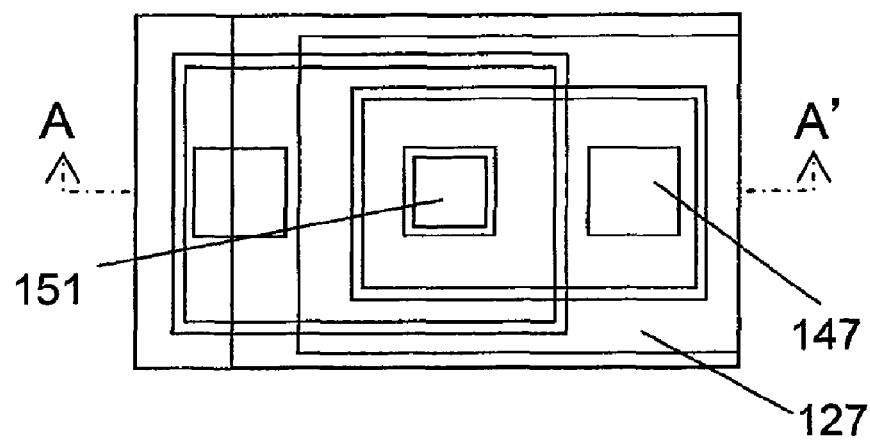
FIG. 46(a) is a top plan view showing a step of one modification of the semiconductor production method according to the embodiment.
Figure 46B:
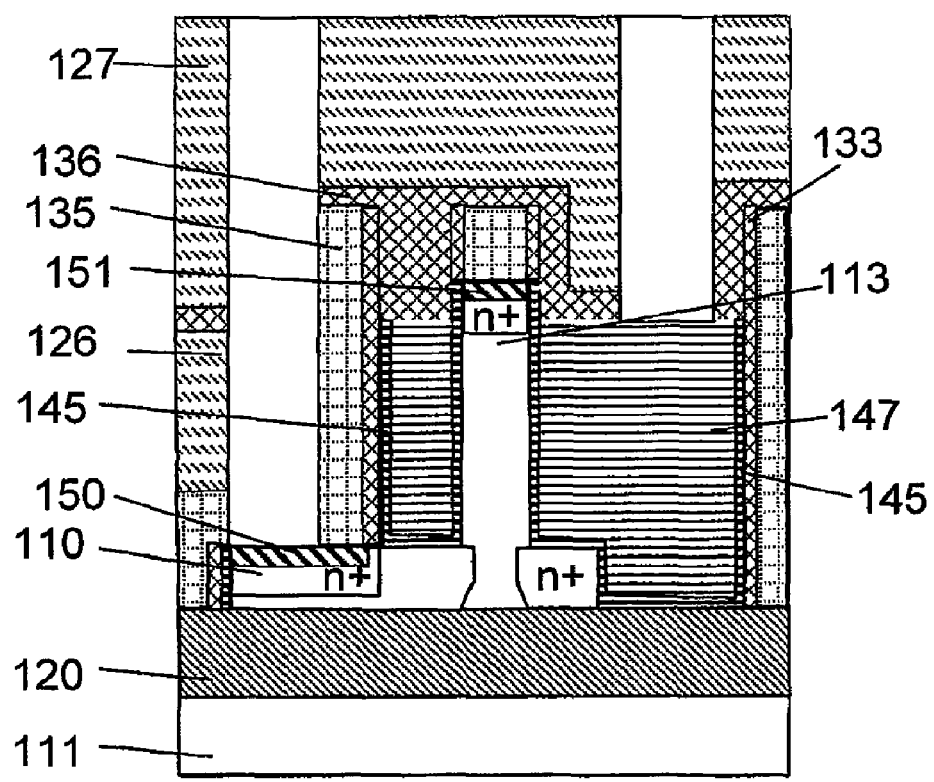
FIG. 46(b) is a sectional view showing the step of the modification of the semiconductor production method according to the embodiment, taken along the line A-A' in FIG. 46(a).
Figure 47A:
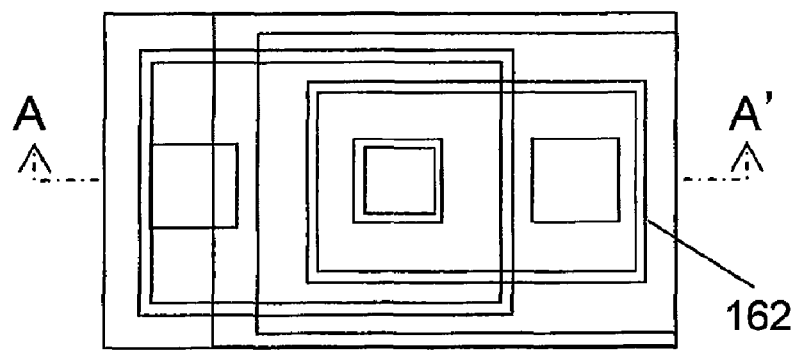
FIG. 47(a) is a top plan view showing a step of the modification of the semiconductor production method according to the embodiment.
Figure 47B:
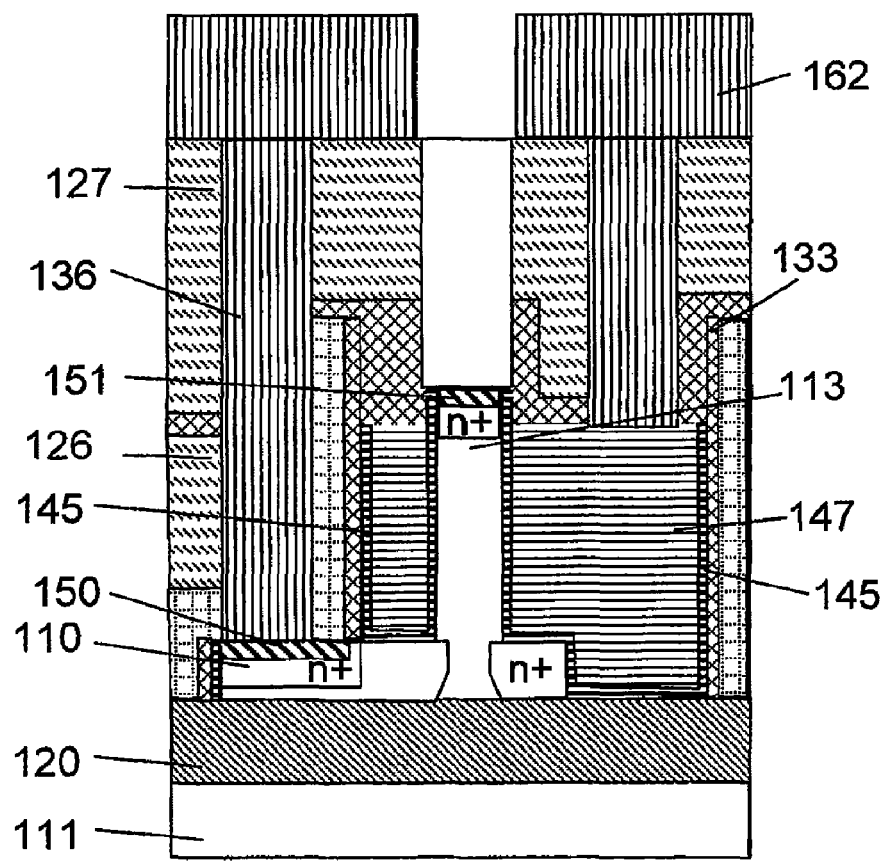
FIG. 47(b) is a sectional view showing the step of the modification of the semiconductor production method according to the embodiment, taken along the line A-A' in FIG. 47(a).

Alternatively, the three contact holes may be formed as follows. Firstly, respective portions of the interlayer film for the contact hole on the metal gate line and the contact hole on the portion of the planar silicon layer underneath the pillar-shaped silicon layer are etched, as shown in FIGS. 46(a) and 46(b). Then, a portion of the interlayer film for the contact hole on the top of the second-conductive-type semiconductor layer in an upper portion of the pillar-shaped first-conductive-type silicon layer is etched using a resist 162 as a mask, and, after the etching of the interlayer film, respective portions of the contact stopper corresponding to the three contact holes are etched, as shown in FIGS. 47(a) and 47(b).

In cases where the etching of the portion of the interlayer film for the contact hole on the top of the pillar-shaped silicon layer is performed separately from the etching of the portions of the interlayer film for the contact hole on the metal gate line and the contact hole on the portion of the planar silicon layer underneath the pillar-shaped silicon layer, etching conditions for the contact hole on the top of the pillar-shaped silicon layer can be optimized while optimizing etching conditions for the contact hole on the metal gate line and the contact hole on the portion of the planar silicon layer underneath the pillar-shaped silicon layer.

Figure 40A:
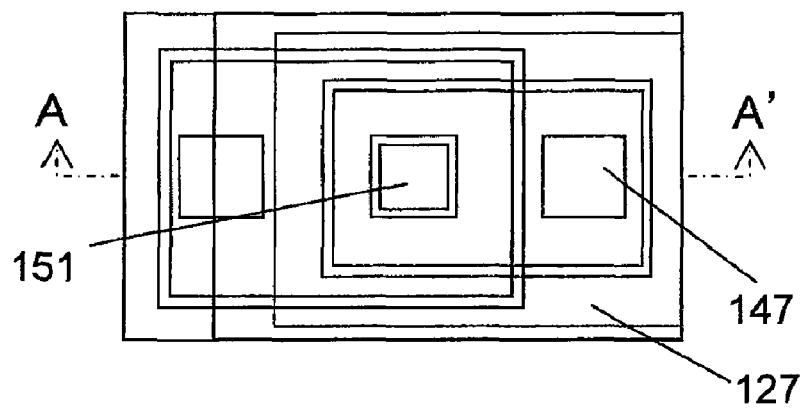
FIG. 40(a) is a top plan view showing a step in the modification of the semiconductor production method according to the embodiment.
Figure 40B:
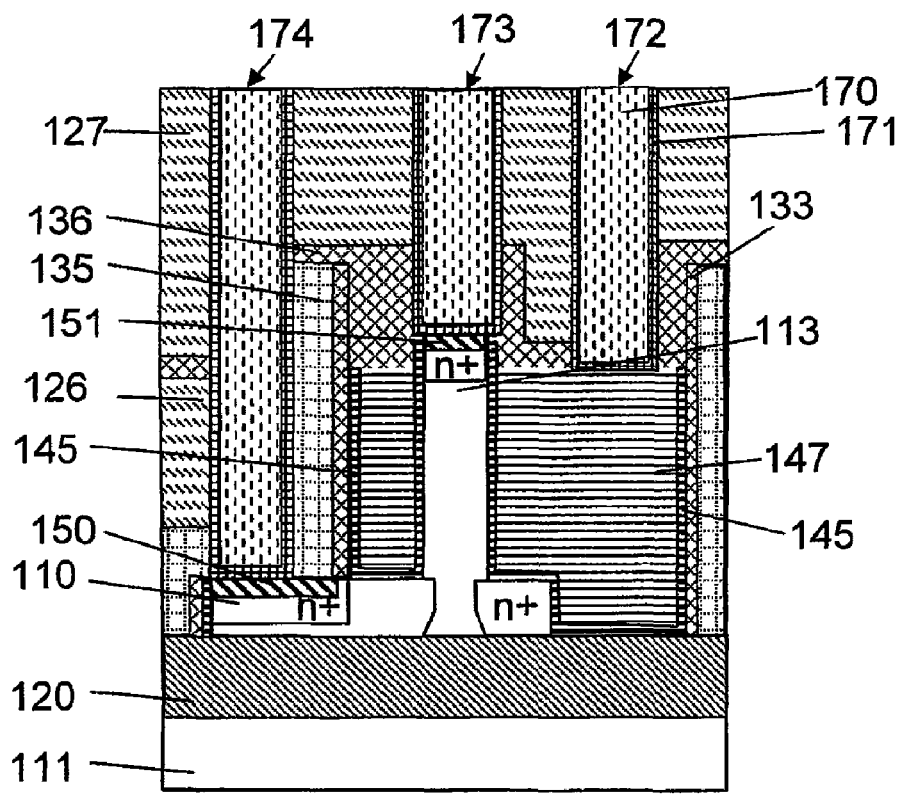
FIG. 40(b) is a sectional view showing a step in the modification of the semiconductor production method according to the embodiment, taken along the line A-A' in FIG. 40(a).

Referring to FIGS. 40(a) and 40(b), a film 171 made of a barrier metal, such as tantalum (Ta) or tantalum nitride (TaN), is formed on each of the contact holes. Then, a copper (Cu) film 170 is formed thereon by sputtering or plating, and subjected to CMP to form three contacts 172, 173, 174. As the barrier metal, titanium (Ti) or titanium nitride (TiN) may be used. Tungsten (W) may also be used. Alternatively, an alloy containing copper may be used. After the film formation, an under-surface surface treatment operation, a verification operation and a heat treatment operation may be performed. Further, after the CMP, a verification operation may be performed (Steps 130, 131, 132, 133, 134, 135, 136 in FIG. 1).

Referring to FIGS. 41(a) and 41(b), a silicon carbide (SiC) film 180 is formed as an etching stopper for first-layer interconnection lines, and then a low-k film 190 is formed as an interlayer film of a first interconnection layer. After the film formation, a thickness measurement operation for the low-k film and a verification operation may be performed (Steps 137, 138, 139, 140 in FIG. 1). Then, a patter for the first-layer interconnection lines is formed to form trenches in the first interconnection layer. After the patterning, a dimension measurement operation, an overlay-error measurement operation and a verification operation may be performed. Further, after forming the trenches, a plasma-based resist stripping operation and a verification operation may be performed (Steps 141, 142, 143, 144, 145, 146, 147 in FIG. 1). Subsequently, a film 175 made of a barrier metal, such as Ta or TaN, is formed on each of the trenches. Then, a Cu film 176 is formed thereon by sputtering or plating, and subjected to CMP to form the first-layer interconnection lines 177, 178, 179. As the barrier metal, titanium (Ti) or titanium nitride (TiN) may be used. Tungsten (W) may also be used. Alternatively, an alloy containing copper may be used. After the film formation, an under-surface surface treatment operation, a verification operation and a heat treatment operation may be performed. Further, after the CMP, a verification operation may be performed (Steps 148, 149, 150, 151, 152, 153, 154 in FIG. 1).

Then, a nitride-film deposition operation, and an interlayer-dielectric-film deposition operation and a thickness measurement operation for the interlayer dielectric film may be performed (Steps 155, 156, 157 in FIG. 1).

Further, a lithographic exposure operation for a pad-via mask, a dimension measurement operation, an overlay-error measurement operation, a verification operation, a pad-via etching operation, a plasma-based resist stripping operation, a post-etching cleaning operation, a dimension measurement operation, a thickness measurement operation for an oxide film, a verification operation, a pre-metalization cleaning operation, a wafer-container replacement operation, an aluminum deposition operation, an under-surface treatment operation, a lithographic exposure operation for pad aluminum, an overlay-error measurement operation, a dimension measurement operation, a verification operation, a pad-aluminum etching operation, a plasma-based resist stripping operation, a post-metal-etching cleaning operation, an optical inspection operation, an SEM inspection operation, a thickness measurement operation for the oxide film, an operation of depositing a dielectric film, a thickness measurement operation for the dielectric film, a lithographical exposure operation for the dielectric film, an optical inspection operation, an operation of etching the dielectric film, a plasma-based resist stripping operation, an operation of cleaning the dielectric film, a verification operation, and a heat treatment operation, may be performed (Steps 158 to 197 in FIG. 1).

Before the operation for the pad-via, multilayer interconnection may be performed.

What is claimed is:

1. A method of producing a semiconductor device, comprising the steps of:
    (a) forming a planar semiconductor layer on a substrate and then forming a pillar-shaped first-conductive-type semiconductor layer on the planar semiconductor layer;
    (b) forming a second-conductive-type semiconductor layer in a portion of the planar semiconductor layer underneath the pillar-shaped first-conductive-type semiconductor layer;
    (c) forming a dummy gate dielectric film and a dummy gate electrode around the pillar-shaped first-conductive-type semiconductor layer;
    (d) forming a second-conductive-type semiconductor layer in an upper portion of the pillar-shaped first-conductive-type semiconductor layer;
    (e) forming a metal-semiconductor compound on the second-conductive-type semiconductor layer in the portion of the planar semiconductor layer underneath the pillar-shaped first-conductive-type semiconductor layer;
    (f) forming a metal-semiconductor compound on the second-conductive-type semiconductor layer in the upper portion of the pillar-shaped first-conductive-type semiconductor layer;
    (g) removing the dummy gate dielectric film and the dummy gate electrode;
    (h) forming a high-k gate dielectric film and a metal gate electrode around the pillar-shaped first-conductive-type semiconductor layer;
    (i) forming a contact on the second-conductive-type semiconductor layer in the portion of the planar semiconductor layer underneath the pillar-shaped first-conductive-type semiconductor layer;
    forming a contact on the second-conductive-type semiconductor layer in the upper portion of the pillar-shaped first-conductive-type semiconductor layer; and
    (k) forming a contact on a metal gate line extending from the metal gate electrode.

2. The method as defined in claim 1, wherein a distance between a central axis of the pillar-shaped first-conductive-type semiconductor layer and a lateral end of the planar semiconductor layer is greater than a sum of: a distance between a central axis and a sidewall of the pillar-shaped first-conductive-type semiconductor layer; a thickness of the high-k gate dielectric film; a thickness of the metal gate electrode; and a thickness of a sidewall-shaped dielectric film formed on a sidewall of the metal gate electrode.

3. The method as defined in claim 1, wherein:
    the planar semiconductor layer comprises a planar silicon layer;
    the first-conductive-type semiconductor layer comprises a first-conductive-type silicon layer; and
    each of the second-conductive-type semiconductor layers comprise a second-conductive-type silicon layer.

4. The method as defined in claim 3, wherein:
    the first-conductive-type semiconductor layer comprises a p-type silicon layer or a non-doped silicon layer; and each of the second-conductive-type semiconductor layers comprise an n-type silicon layer.

5. The method as defined in claim 3, wherein:
the first-conductive-type semiconductor layer comprises an n-type silicon layer or a non-doped silicon layer; and
each of the second-conductive-type semiconductor layers comprise a p-type silicon layer.

6. The method as defined in claim 3, wherein the step (a) includes the sub-steps of:
forming, on the substrate, an initial silicon layer for forming therefrom the pillar-shaped first-conductive-type silicon layer and the planar silicon layer, and then forming a pad oxide film on the initial silicon layer;
implanting an impurity into the initial silicon layer through the pad oxide film to adjust a threshold, and then subjecting the initial silicon layer to annealing to activate and diffuse the impurity so as to promote uniform distribution of the impurity in the initial silicon layer; and
forming a silicon nitride film for use as a mask during formation of the pillar-shaped first-conductive-type silicon layer.

7. The method as defined in claim 3, wherein the step (a) includes the sub-steps of:
forming, on the substrate, an initial silicon layer for forming therefrom the pillar-shaped first-conductive-type silicon layer and the planar silicon layer, and then forming a pad oxide film on the initial silicon layer;
forming a silicon nitride film for use as a first hard mask during formation of the pillar-shaped first-conductive-type silicon layer;
forming a silicon oxide film on the silicon nitride film;
applying a resist onto the silicon oxide film, and then forming a pattern having an inverted shape with respect to a top view of the pillar-shaped first-conductive-type silicon layer, using the patterned resist to form a hole in the silicon oxide film to penetrate through the silicon oxide film at a position for forming the pillar-shaped first-conductive-type silicon layer;
forming an amorphous silicon or polysilicon film to fill the hole in the silicon oxide film;
polishing and removing a portion of the amorphous silicon or polysilicon film on the silicon oxide film by chemical mechanical polishing;
removing the silicon oxide film by etching, to form an amorphous silicon or polysilicon film-based mask serving as a second hard mask;
sacrificially oxidizing the amorphous silicon or polysilicon film-based mask to reduce a size of the amorphous silicon or polysilicon film-based mask; and
etching the amorphous silicon or polysilicon film-based mask to remove the sacrificial silicon oxide film on a surface thereof.

8. The method as defined in claim 3, wherein the step (a) includes the sub-steps of:
forming, on the substrate, an initial silicon layer for forming therefrom the pillar-shaped first-conductive-type silicon layer and the planar silicon layer, and then forming a pad oxide film on the initial silicon layer;
forming a silicon nitride film for use as a first hard mask during formation of the pillar-shaped first-conductive-type silicon layer;
forming a silicon oxide film on the silicon nitride film;
applying a resist onto the silicon oxide film, and then forming a pattern having an inverted shape with respect to a top view of the pillar-shaped first-conductive-type silicon layer, using the patterned resist to form a hole in the silicon oxide film to penetrate through the silicon oxide film at a position for forming the pillar-shaped first-conductive-type silicon layer;
depositing an oxide film and etching back the oxide film to reduce a diameter of the hole penetrating through the silicon oxide film.

9. The method as defined in claim 3, wherein the step (a) includes the sub-steps of:
dry-etching the silicon nitride film and the pad oxide film, using the amorphous silicon or polysilicon film-based mask serving as the second hard mask, to form a silicon nitride film-based mask serving as the first hard mask; and
forming the pillar-shaped first-conductive-type silicon layer by dry etching using the first hard mask and the second hard mask, wherein, when the amorphous silicon or polysilicon film-based mask serving as the second hard mask is fully etched away to cause a change in plasma emission intensity detectable by a dry etching apparatus, the change in the plasma emission intensity is detected to perform a dry-etching end-point detection process to control a height dimension of the pillar-shaped first-conductive-type silicon layer.

10. The method as defined in claim 9, wherein a thickness of the amorphous silicon or polysilicon film-based mask serving as the second hard mask is less than a height dimension of the pillar-shaped first-conductive-type silicon layer.

11. The method as defined claim 3, wherein the step (b) includes the sub-steps of:
after the step (a), sacrificially oxidizing the pillar-shaped first-conductive-type silicon layer to form a sacrificial oxide film as a means for reducing irregularities in a region of a sidewall of the pillar-shaped first-conductive-type silicon layer serving as a channel region, removing a silicon surface implanted with a foreign substance typically consisting of carbon during the dry etching, and protecting the pillar-shaped first-conductive-type silicon layer from contaminations typically caused by by-products to be produced during dry etching in a subsequent step;
applying a resist onto the planar silicon layer, and forming a pattern for the second-conductive-type silicon layer to be formed in the portion of the planar silicon layer underneath the pillar-shaped first-conductive-type silicon layer, using the patterned resist; and
dry-etching the planar silicon layer to form the portion of the planar silicon layer underneath the pillar-shaped first-conductive-type silicon layer, and then removing the resist.

12. The method as defined in claim 3, wherein the step (b) includes introducing a second-conductive-type impurity into a surface of the portion of the planar silicon layer underneath the pillar-shaped first-conductive-type silicon layer by an impurity doping process typified by impurity implantation, using the sacrificial oxide film formed during the sacrificial oxidation of the pillar-shaped first-conductive-type silicon layer, as a screen oxide film, to form the second-conductive-type silicon layer in the portion of the planar silicon layer underneath the pillar-shaped first-conductive-type silicon layer.

13. The method as defined in claim 11, wherein a diameter of the pillar-shaped first-conductive-type silicon layer is less than that of the silicon nitride film-based mask serving as the first hard mask.

14. The method as defined in claim 3, wherein an implantation angle during the impurity implantation for use in forming the second-conductive-type silicon layer in the portion of the planar silicon layer underneath the pillar-shaped first-conductive-type silicon layer is in the range of 0 to 6 degrees.

15. The method as defined in claim 3, wherein the second-conductive-type silicon layer is formed in the portion of the planar silicon layer underneath the pillar-shaped first-conductive-type silicon layer, without implanting the impurity into the upper portion of the pillar-shaped first-conductive-type silicon layer.

16. The method as defined in claim 3, wherein the step (c) includes the sub-steps of:
   removing the sacrificial oxide film by etching, forming the dummy gate dielectric film typically consisting of a silicon oxide film or a silicon nitride film, and forming an amorphous silicon or polysilicon film serving as a dummy gate material to allow the pillar-shaped first-conductive-type silicon layer to be buried therein; and
   polishing the amorphous silicon or polysilicon film by chemical mechanical polishing to flatten an upper surface of the dummy gate material, wherein the silicon nitride film-based mask serving as the first hard mask is used as a stopper for the chemical mechanical polishing to control an amount of chemical mechanical polishing with high repeatability.

17. The method as defined in claim 16, wherein the step (c) includes the sub-step of:
   oxidizing the flattened surface of the amorphous silicon or polysilicon film serving as the dummy gate material to form a silicon oxide film on an upper surface of the amorphous silicon or polysilicon film, wherein the silicon oxide film serves as a means to prevent the dummy gate electrode from being silicided during silicidation to be performed in a subsequent step so as to facilitate removal of the dummy gate electrode in a subsequent step.

18. The method as defined in claim 17, wherein the step (c) includes the sub-steps of:
   applying a bottom antireflective coating (BARC) layer and a resist on the silicon oxide film, and forming a pattern for a dummy gate line, using the resist by lithography; and
   etching the silicon oxide film, the BARC layer and the amorphous silicon or polysilicon film serving as the dummy gate material, using the resist as a mask to form the dummy gate electrode and the dummy gate line;
   the step (d) includes the sub-steps of:
   removing the silicon nitride film-based mask on a top of the pillar-shaped first-conductive-type silicon layer by dry etching or wet etching;
   forming a silicon nitride film, and then etching back the silicon nitride film to expose an upper surface of the second-conductive-type silicon layer in the portion of the planar silicon layer underneath the pillar-shaped first-conductive-type silicon layer, and a top surface of the pillar-shaped first-conductive-type silicon layer, while forming a silicon nitride film-based sidewall on a sidewall of the dummy gate electrode; and
   introducing a second-conductive-type impurity into an upper portion of the pillar-shaped first-conductive-type silicon layer through an impurity doping process typified by impurity implantation, to form the second-conductive-type silicon layer in the upper portion of the pillar-shaped first-conductive-type silicon layer; and
   the steps (e) and (f) include subjecting each of the upper surface of the second-conductive-type silicon layer in the portion of the planar silicon layer underneath the pillar-shaped first-conductive-type silicon layer, and an upper surface of the second-conductive-type silicon layer in the upper portion of the pillar-shaped first-conductive-type silicon layer, to sputtering of a metal typically consisting of nickel (Ni) or cobalt (Co), and a heat treatment, and removing an unreacted metal film, to form the metal-semiconductor compound on each of the second-conductive-type silicon layer in the portion of the planar silicon layer underneath the pillar-shaped first-conductive-type silicon layer and the second-conductive-type silicon layer in the upper portion of the pillar-shaped first-conductive-type silicon layer, and wherein:
   the silicon nitride film-based sidewall, and the silicon oxide film on the dummy gate electrode, serve as a means to prevent a metal-semiconductor compound from being formed on the dummy gate electrode, and the dummy gate electrode and the silicon nitride film-based sidewall serve as a means to allow a metal-semiconductor compound to be formed only on each of the second-conductive-type silicon layer in the portion of the planar silicon layer underneath the pillar-shaped first-conductive-type silicon layer and the second-conductive-type silicon layer in the upper portion of the pillar-shaped first-conductive-type silicon layer, whereby it becomes possible to prevent short-circuiting between the metal gate electrode and each of the second-conductive-type silicon layer in the portion of the planar silicon layer underneath the pillar-shaped first-conductive-type silicon layer and the second-conductive-type silicon layer in the upper portion of the pillar-shaped first-conductive-type silicon layer, due to the metal-semiconductor compounds; and
   respective portions of the dummy gate dielectric film and the dummy gate electrode covering an upper region of the sidewall of the pillar-shaped first-conductive-type silicon layer serve as a means to control formation of a metal-semiconductor compound from the side of the sidewall of the pillar-shaped first-conductive-type silicon layer.

19. The method as defined in claim 18, wherein the steps (g) and (h) include the sub-steps of:
   forming a film typically consisting of a silicon nitride film;
   forming a silicon oxide film and an amorphous silicon or polysilicon layer;
   flattening an upper surface of the amorphous silicon or polysilicon layer by chemical mechanical polishing, while controlling respective upper surfaces of the amorphous silicon or polysilicon layer and the silicon oxide film to be located at a same height position;
   dry-etching the silicon oxide film, wherein an end-point of the dry etching is detected based on the silicon nitride film to be exposed when a portion of the silicon oxide film on an upper surface of the silicon nitride film is fully etched away, so that respective upper surfaces of the silicon oxide film and the silicon nitride film are controlled to be located at a same height position;
   dry-etching the silicon nitride film, wherein an end-point of the dry etching is detected based on the dummy gate electrode to be exposed when a portion of the silicon nitride film on an upper surface of the dummy gate electrode is fully etched away, so that respective upper surfaces of the dummy gate electrode, the silicon nitride film and the silicon oxide film are controlled to be located at a same height position;
   dry-etching the dummy gate electrode and the amorphous silicon or polysilicon layer;
   removing the silicon oxide film and dummy gate dielectric film by wet etching;

forming the high-k gate dielectric film;
forming a metal gate layer; and
dry-etching the metal gate layer to form the metal gate electrode and the metal gate line, wherein an end-point of the dry etching is detected based on the silicon oxide film to be exposed when a portion of the metal gate layer on a reference surface of the silicon oxide film is fully etched away, so that an upper surface of the gate metal layer is controlled to be located at a same height position as that of the reference surface of the silicon oxide film,
whereby a sum of respective thicknesses of the silicon oxide film and the silicon nitride film can be controlled to become equal to a desired gate length of the metal gate electrode with less variation in the gate length.

20. The method as defined in claim 1, wherein the steps (i) to (k) include the sub-steps of:
forming a film typically consisting of a silicon nitride film to serve as a contact stopper;
forming a silicon oxide film to serve as an interlayer film and then flattening the silicon oxide film by chemical mechanical polishing;
applying a resist, and then forming a pattern and using the patterned resist to etch two contact holes on respective ones of the metal gate line, and the second-conductive-type silicon layer in the upper portion of the pillar-shaped first-conductive-type silicon layer;
applying a resist, and then forming a pattern and using the patterned resist to etch a contact hole on the second-conductive-type silicon layer in the portion of the planar silicon layer underneath the pillar-shaped first-conductive-type silicon layer.

21. The method as defined in claim 1, wherein the steps (i) to (k) include the sub-steps of:
forming a film typically consisting of a silicon nitride film to serve as a contact stopper;
forming a silicon oxide film to serve as an interlayer film and then flattening the silicon oxide film by chemical mechanical polishing;
etching respective portions of the interlayer film for a contact hole on a top of the second-conductive-type semiconductor layer in an upper portion of the pillar-shaped first-conductive-type silicon layer, a contact hole on the metal gate line, and a contact hole on the second-conductive-type silicon layer in the portion of the planar silicon layer underneath the pillar-shaped first-conductive-type silicon layer; and etching respective portions of the contact stopper corresponding to the three contact holes.

22. The method as defined in claim 1, wherein the steps (i) to (k) include the sub-steps of:
forming a film typically consisting of a silicon nitride film to serve as a contact stopper;
forming a silicon oxide film to serve as an interlayer film and then flattening the silicon oxide film by chemical mechanical polishing;
etching respective portions of the interlayer film for a contact hole on the metal gate line and a contact hole on the portion of the planar silicon layer underneath the pillar-shaped first-conductive-type silicon layer;
etching a portion of the interlayer film for a contact hole on a top of the second-conductive-type semiconductor layer in an upper portion of the pillar-shaped first-conductive-type silicon layer, using a resist as a mask; and
after the etching of the interlayer film, etching respective portions of the contact stopper corresponding to the three contact holes.

* * * * *